United States Patent

Dutz et al.

(10) Patent No.: US 10,291,436 B2
(45) Date of Patent: May 14, 2019

(54) PROCESSING MODULE AND ASSOCIATED METHOD

(71) Applicant: NXP B.V., Eindhoven (NL)

(72) Inventors: Jan Dutz, Graz (AT); Wolfgang Küchler, Graz (AT); Frank Leong, Veldhoven (NL); Thomas Baier, Graz (AT); Arie Geert Cornelis Koppelaar, Giessen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/897,763

(22) Filed: Feb. 15, 2018

(65) Prior Publication Data

US 2018/0254925 A1 Sep. 6, 2018

(30) Foreign Application Priority Data

Mar. 2, 2017 (EP) .................................. 17158995

(51) Int. Cl.
*H04L 25/30* (2006.01)
*H04L 25/02* (2006.01)
(Continued)

(52) U.S. Cl.
CPC ........ *H04L 25/0212* (2013.01); *G01S 13/762* (2013.01); *G01S 13/765* (2013.01);
(Continued)

(58) Field of Classification Search
CPC ... H04L 25/0212; H04L 7/042; H04B 17/391; H04B 1/7174; H04B 1/7183; G01S 13/762
See application file for complete search history.

(56) References Cited

U.S. PATENT DOCUMENTS 7,145,960 B2 * 12/2006 Shigemasa ........... G06K 7/0008
375/295
7,149,239 B2   12/2006 Hudson
(Continued)

FOREIGN PATENT DOCUMENTS

JP        7-284158 A      10/1995
WO    2007/021292 A2     2/2007
(Continued)

OTHER PUBLICATIONS

IEEE Computer Society, "IEEE Standard for Low-Rate Wireless Personal Area Networks (WPANs)", IEEE Std 802.15.4™-2015 (Revision of IEEE Std 802.15.4-2011), LAN/MAN Standards Committee, pp. 1-709 (2015).
(Continued)

*Primary Examiner* — Freshteh N Aghdam
(74) *Attorney, Agent, or Firm* — Rajeev Madnawat

(57) ABSTRACT

A processing module for a transmitter device configured to provide for generation of a signal comprising at least one frame for transmission by the transmitter device to a receiver device, the processing module configured to provide for processing of an input pulse stream comprising a stream of pulses representative of data, to provide an output pulse stream, each pulse of the pulse streams having one of two states defining the phase with which a carrier wave is modulated; the processing module configured to;
divide the input pulse stream into consecutive groups of pulses; and
for each group of pulses, based on determination that the first two or more consecutive pulses of the group have the same polarity, provide for addition of at least one dummy pulse to the group directly after the first two or more consecutive pulses, with an opposite polarity.

15 Claims, 16 Drawing Sheets

(51) Int. Cl.
  *H04B 17/391* (2015.01)
  *H04B 1/717* (2011.01)
  *H04B 1/7183* (2011.01)
  *H04L 7/04* (2006.01)
  *G01S 13/76* (2006.01)

(52) U.S. Cl.
  CPC ......... *H04B 1/7174* (2013.01); *H04B 1/7183* (2013.01); *H04B 17/391* (2015.01); *H04L 7/042* (2013.01)

(56) References Cited

U.S. PATENT DOCUMENTS

| | | | |
|---|---|---|---|
| 7,764,756 B2* | 7/2010 | Yu | H04B 1/7183 375/147 |
| 9,485,609 B2 | 11/2016 | Hekstra et al. | |
| 2007/0147476 A1* | 6/2007 | Merz | H04B 1/71632 375/130 |
| 2007/0153875 A1* | 7/2007 | Lakkis | H04B 1/7174 375/130 |
| 2009/0232197 A1* | 9/2009 | Mimura | H04B 1/7174 375/239 |
| 2010/0135178 A1 | 6/2010 | Aggarwal et al. | |
| 2010/0182993 A1* | 7/2010 | Jurgensen | H04B 1/7183 370/350 |
| 2010/0265991 A1* | 10/2010 | Oh | H04B 1/71637 375/130 |
| 2011/0122925 A1* | 5/2011 | Pflug | H04B 1/7174 375/146 |
| 2012/0007438 A1 | 1/2012 | Kuroda | |
| 2012/0230369 A1* | 9/2012 | Zhang | H04B 1/71632 375/130 |
| 2013/0163638 A1 | 6/2013 | McLaughlin et al. | |
| 2014/0204928 A1 | 7/2014 | Sorin | |
| 2015/0077225 A1 | 3/2015 | Proefke et al. | |
| 2015/0200706 A1* | 7/2015 | Bottazzi | G01S 7/40 375/140 |
| 2015/0248966 A1 | 9/2015 | Morokuma et al. | |
| 2016/0302074 A1 | 10/2016 | Hekstra et al. | |
| 2016/0352605 A1 | 12/2016 | O'Donoghue et al. | |
| 2017/0064505 A1 | 3/2017 | Eyal et al. | |
| 2017/0359134 A1 | 12/2017 | Baier et al. | |

FOREIGN PATENT DOCUMENTS

| | | |
|---|---|---|
| WO | 2011/161095 A1 | 12/2011 |
| WO | 2013/188113 | 12/2013 |
| WO | 2015/130618 A2 | 9/2015 |
| WO | 2015/135630 | 9/2015 |
| WO | 2016/166404 | 10/2016 |

OTHER PUBLICATIONS

UPosition, "UM100 Datasheet, Brief Specification of IR-UWB Module UM100", pp. 1-26.

Poturalski, M. et al. "The Cicada Attack: Degradation and Denial of Service in IR Ranging", IEEE International Conference on Ultra-Wideband, pp. 1-4 (2010).

Poturalski, M. "Distance Bounding with IEEE 802.15.4a: Attacks and Countermeasures", IEEE Transactions on Wireless Communications, vol. 10, Issue. 4, pp. 1334-1344 (Apr. 2011).

Flury, M. et al. "Effectiveness of Distance-Decreasing Attacks Against Impulse Radio Ranging", 3rd ACM Conference on Wireless Network Security, pp. 117-128 (2010).

Pflug, H. et al. "Method to Estimate Impulse-Radio Ultra-Wideband Peak Power", IEEE Trans. on MTT, vol. 59, No. 4. pp. 1174-1186 (Apr. 2011).

Ahmadian, Z. et al. "Performance Analysis of the IEEE 802. 15. 4a UWB System", IEEE Trans. on Communications, vol. 57, No. 5, pp. 1474-1485 (May 2009).

Compagno, A. et al. "Modeling Enlargement Attacks Against UWB Distance Bounding Protocols", IEEE Transactions on Information Forensics and Security, vol. 11, No. 7, pp. 1565-1577, (Jul. 2016).

Ahmadian, Z. et al. "Performance Analysis of IEEE 802.15.4a BPSK/BPPM UWB Transmission", IEEE International Conference on Ultra-Wideband, Singapore, pp. 755-760 (2007).

\* cited by examiner

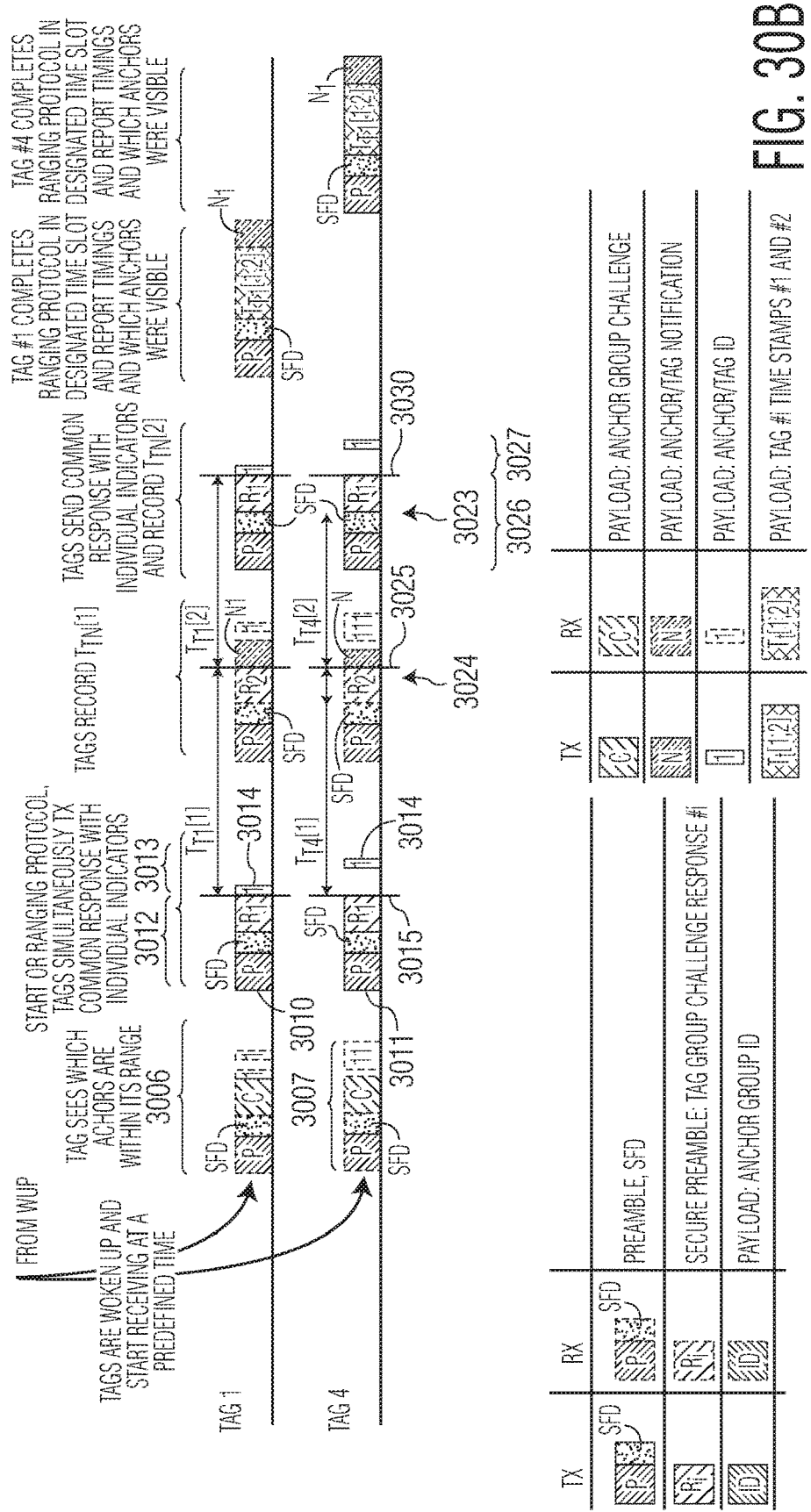

PROCESSING MODULE AND ASSOCIATED METHOD

CROSS-REFERENCE TO RELATED APPLICATIONS

This application claims the priority under 35 U.S.C. § 119 of European Patent application no. 17158995.5, filed on Mar. 2, 2017, the contents of which are incorporated by reference herein.

FIELD

This disclosure relates to a processing module for a communication device and a method of estimation of a propagation channel model.

BACKGROUND

Wideband Radio Frequency (RF) applications have been developed that are capable of accurate distance measurement between two or more wireless devices. These measurements are based on Time-of-Flight (ToF) calculations which are derived by accurate determination of departure and arrival times of RF packets between two devices. RF packets travel at the speed of light and thus a calculated ToF allows determination of the distance between devices. Such a procedure is commonly called 'Ranging'. One practical application of Ranging is 'Distance Bounding' whereby ToF calculations are used to verify whether the distance between two devices is less than a predefined threshold, such as used for automotive Passive Keyless Entry (PKE) systems and other access control systems, as well as for contactless electronic payment systems.

A receiving device is able to derive a channel estimate in relation to a transmitting device using known patterns within a received packet from the transmitting device. For example, in IR-UWB (Impulse Radio-Ultra-WideBand) systems, such as defined in IEEE 802.15.4, a preamble comprising repeating synchronization symbols and a Start-of-Frame Delimiter (SFD) is placed in front of a payload segment. In IR-UWB receivers, the repeating synchronization symbols within the preamble of a received packet are typically used to realise time and frequency synchronization and to derive a channel estimate for the received packet. A channel estimate consists of an estimate of arrival times of multipath components, the first arrived multipath component represents the shortest radio path and is therefore important for the ToF calculations.

Significantly, since the synchronisation symbols are in many cases used for deriving the channel estimate within a receiving device, an attacking device only requires knowledge of the synchronisation symbol pattern and symbol period to employ an attack that influences the channel estimation process and therefore the ToF calculations.

SUMMARY

The disclosure provides a processing module for a receiver device, a corresponding receiver device, a processing module for a transmitter device, a corresponding transmitter device and associated methods and computer program products, as described in the accompanying claims.

According to a first aspect of the disclosure, we provide a processing module for a transmitter device configured to provide for generation of a signal comprising at least one frame for transmission by the transmitter device to a receiver device, the processing module configured to provide for processing of an input pulse stream, the input pulse stream comprising a stream of pulses representative of data of at least part of the at least one frame, to provide for generation of an output pulse stream for transmitting to the receiver device as part of the signal, each pulse of the pulse streams having one of two states comprising a positive polarity and a negative polarity, the polarity of the pulse defining the phase with which a carrier wave is modulated during the pulse for transmission by the transmitter device; the processing module configured to;

divide the input pulse stream into consecutive groups of pulses, each group of pulses containing the same number of pulses, where the number of pulses comprises at least three; and for each group of pulses, based on determination that the first two or more consecutive pulses of the group have the same polarity, provide for addition of at least one dummy pulse to the group directly after the first two or more consecutive pulses, the at least one dummy pulse having an opposite polarity to the first two or more consecutive pulses, the output pulse stream comprising the groups of pulses including the added dummy pulses.

In one or more embodiments, the processing module is configured to;

for each group of pulses, based on determination that the first two or more consecutive pulses of the group have different polarities, provide for addition of at least one dummy pulse to the group directly after the first two or more consecutive pulses, the at least one dummy pulse having a polarity opposite to a final pulse in the first two or more consecutive pulses.

In one or more embodiments, the processing module is configured to;

for each group of pulses, based on determination that the first two or more consecutive pulses of the group have different polarities, provide for addition of at least one dummy pulse to the group directly after the first two or more consecutive pulses, the at least one dummy pulse having a polarity opposite to an aggregate polarity of all the pulses in the group of pulses, wherein the number of pulses in the group is odd.

In one or more embodiments, the number of pulses in a group comprises three and the determination that the first two or more consecutive pulses of the group have the same polarity comprises the determination that the first two consecutive pulses of the group have the same polarity and likewise the determination that the first two or more consecutive pulses of the group have different polarities comprises the determination that the first two consecutive pulses of the group have different polarities.

In one or more embodiments, the processing module is configured to provide for addition of a single dummy pulse per group of pulses of the input pulse stream. Accordingly, in one or more examples, all of the groups have a dummy pulse inserted therein.

In one or more embodiments, the input bit stream comprises a first input bit stream and a second input bit stream, the first input bit stream representing in-phase components for Quadrature Phase Shift Keying modulation and the second input bit stream representing quadrature-phase components for Quadrature Phase Shift Keying modulation.

According to a second aspect of the disclosure, we provide a method of generation, from an input pulse stream, of an output pulse stream comprising a plurality of pulses for controlling the phase with which a carrier wave is modulated during each pulse for transmission by a transmitter device, the input pulse stream comprising a stream of pulses representative of data of at least part of at least one frame for transmitting as part of a signal by the transmitter device, each pulse of the pulse streams having one of two states comprising a positive polarity and a negative polarity, the polarity of the pulse defining the phase with which the carrier wave is modulated; the method comprising:

dividing the input pulse stream into consecutive groups of pulses, each group of pulses containing the same number of pulses, where the number of pulses comprises at least three; and for each group of pulses, based on determination that the first two or more consecutive pulses of the group have the same polarity, providing for addition of at least one dummy pulse to the group directly after the first two or more consecutive pulses, the at least one dummy pulse having an opposite polarity to the first two or more consecutive pulses, the groups of pulses, including the added dummy pulses, comprising the output pulse stream.

According to a third aspect of the disclosure, we provide a computer program product comprising computer program code which, when executed by a processor, performs the method of the second aspect.

According to a fourth aspect of the disclosure, we provide a processing module for a receiver device configured to provide for processing of a signal comprising at least one frame received by the receiver device from a transmitter device, the processing module configured to provide for processing of an input pulse stream, the input pulse stream comprising a stream of pulses representative of at least a phase modulated part of the at least one frame having been demodulated, to provide for generation of an output pulse stream for subsequent processing by the receiver device, each pulse of the pulse streams having one of two states comprising a positive polarity and a negative polarity, the processing module configured to;

divide the input pulse stream into consecutive groups of pulses, each group of pulses containing the same number of pulses, where the number of pulses comprises at least three and the position of the groups in the input bit stream determined based on predetermined data; and for each group of pulses, based on determination that the first two or more consecutive pulses of the group have the same polarity, provide for discarding of one or more dummy pulses in the group directly after the first two or more consecutive pulses, the at least one dummy pulse having an opposite polarity to the first two or more consecutive pulses, the groups of pulses without the discarded dummy pulse or pulses comprising the output pulse stream.

In one or more embodiments, the predetermined data is one or more of:

i) agreed in advance of the signal being received by the receiver device; and ii) determined from information in a header field of the at least one frame.

According to a fifth aspect of the disclosure, we provide a method of processing at least part of a signal comprising at least one frame received by the receiver device from a transmitter device, the method providing for processing of an input pulse stream, the input pulse stream comprising a stream of pulses representative of at least a phase modulated part of the at least one frame having been demodulated, to provide for generation of an output pulse stream for subsequent processing by the receiver device, each pulse of the pulse streams having one of two states comprising a positive polarity and a negative polarity, the method comprising;

dividing the input pulse stream into consecutive groups of pulses, each group of pulses containing the same number of pulses, where the number of pulses comprises at least three and the position of the groups in the input bit stream determined based on predetermined data; and for each group of pulses, based on determination that the first two or more consecutive pulses of the group have the same polarity, providing for discarding of one or more dummy pulses in the group directly after the first two or more consecutive pulses, the at least one dummy pulse having an opposite polarity to the first two or more consecutive pulses, the groups of pulses without the discarded dummy pulse or pulses comprising the output pulse stream.

According to a sixth aspect of the disclosure, we provide a computer program product comprising computer program code which, when executed by a processor, performs the method of the fifth aspect.

In one or more embodiments, the at least one frame comprises an ultra-wide band frame.

According to a seventh aspect of the disclosure, we provide a system comprising at least one transmitter device controlled by the processing module according to the first aspect and at least one receiver device controlled by the processing module of the fourth aspect.

In one or more embodiments, the system comprises at least one of:

an access control system for a building;

a passive keyless entry and/or start system for an automobile;

a contactless payment terminal; and an automatic teller machine.

The communication receiver device comprises at least one of: an Impulse Radio Ultra-WideBand (UWB) receiver device; and a light/laser ranging receiver device.

Further details, aspects and examples of the disclosure will be described, by way of example only, with reference to the drawings. In the drawings, like reference numbers are used to identify like or functionally similar elements. Elements in the figures are illustrated for simplicity and clarity and have not necessarily been drawn to scale.

FIGS. 30A and 30B show an example illustration of ranging between multiple anchors and multiple tags;

Examples herein are described with reference to a radio frequency (RF) communication device e.g. transmitter device and a receiver device and the processing modules thereof. However, it is contemplated that examples are not limited to being implemented solely within RF communication devices and examples may be applicable to any system in which ToF measurements are required to be determined, and is particular applicable to any system in which a Time-of-Flight (ToF) distance measurement is a specified function, such as IR-UWB (Impulse Radio-Ultra WideBand) radio frequency (RF) transceivers, pulse radars at 60 GHz and higher frequencies, and pulse-based light/laser ranging transceivers. Thus it is contemplated that examples may be implemented within a range of different communication systems including, but not limited to, RF communication systems, and optical (e.g. light/laser) communication systems, etc. The applications may range from automotive Passive Keyless Entry (PKE) systems and other access control systems to (contactless) electronic payment systems, and in particular to any application where ranging and distance bounding is performed.

In IR-UWB RF systems, it may be desirable to maximize security and link budget while minimizing current consumption, latency, and system cost.

The IR-UWB physical layer is defined in IEEE Standards Association, IEEE Standard for Low-Rate Wireless Personal Area Networks (WPANs), IEEE Std 802.15.4™-2015 (hereinafter "IEEE standard"). The specification of the physical layers in the standard may have drawbacks for particular use cases. However, we describe herein a plurality of aspects of the physical layer specification that may provide one or more technical effects for one or more particular use cases. One or more of the aspects herein may provide a technical effect over what is disclosed in the standard, for particular use cases.

Accordingly, one or more of the aspects described herein are described as changes to or improvements on the IR-UWB physical layer IEEE standard and accordingly terms and concepts used herein may be equivalent to terms used and concepts defined in the IEEE standard. Additionally, processes or definitions of the IEEE standard may be combined with the features defined herein.

In the sections that follow we describe different aspects of a frame format definition (PHY). One or more of the aspects may be implemented in a processing module for a receiver device arranged to receive a signal transmitted by a transmitter device. One or more of the aspects may be implemented in a processing module for a transmitter device arranged to transmit a signal for receipt by a receiver device. The disclosure is split into the section as follows for ease of understanding and it will be appreciated that features disclosed in one section may be combined with features of other sections, in particular as they relate to the same, proposed, physical layer definition.

Figure 1:
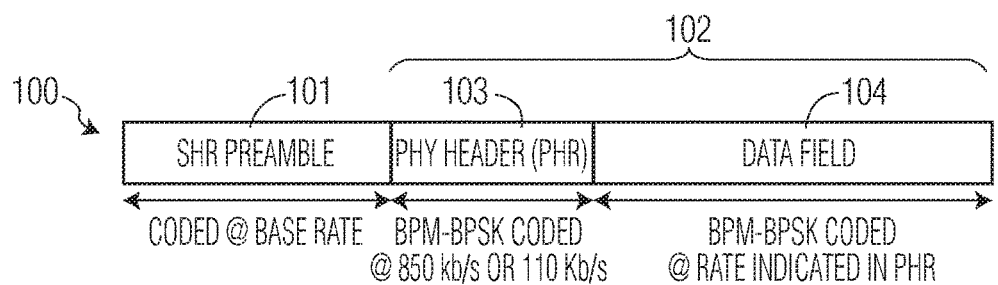
FIG. 1 shows a current standard frame format for Ultra-Wideband (UWB) based ranging, as defined in IEEE 802.15.4-2015.

The current standard frame format 100 for Ultra-Wideband (UWB) based data communication and ranging, as defined in IEEE 802.15.4-2015, is shown in FIG. 1.

The frame consists of a preamble 101, which may include at least a portion for synchronization, and a payload 102 for the transmitted data. The preamble 101 is further divided into a portion comprising a plurality of synchronization symbols, termed "SYNC", and a Start-of-Frame Delimiter, termed "SFD". The plurality of synchronization symbols may include a repeating pattern of one or more synchronization symbols. The plurality of synchronization symbols at the start of the preamble may enable a receiver device to synchronize, such as in terms of time and/or frequency, with an incoming frame. The SFD signals the end of the plurality of synchronization symbols. The synchronization symbols have special properties to provide for easy synchronization by a receiver device. The synchronization symbols may be used by a receiver device for making an estimation of the Channel Impulse Response (CIR). The synchronization and/or the estimation of the CIR may be achieved by a plurality of repetitions of the synchronization symbols.

The payload 102 comprises a plurality of parts comprising a physical layer (PHY) header 103, termed "PHR" and a physical layer (PHY) service data unit 104, termed a "PSDU". The physical layer header 103 may comprise information defining frame properties, such as the data-rate of one or more parts of the frame or the length of the PSDU 104. The PSDU may contain arbitrary information to be exchanged between transmitter and receiver devices.

For ranging purposes, the IEEE standard suggests to use the transition from the preamble 101 to the PHY header 103 as a time marker, i.e. the marker to base a time of arrival estimate on.

Although this frame format may enable an efficient hardware implementation of the receiver device for ranging applications, it may also be open to several vulnerabilities from adversaries who want to shorten the measured distance. This may be a problem if the UWB frame format is used for secure distance bounding where only a distance below a certain threshold enables certain privileges like opening a door for example.

In one or more situations, the IEEE standard defined frame format described above may not be well suited for short frames and/or for tracking of the CIR in a secure way.

In one or more situations or use cases the frame format definition of the above-mentioned IEEE standard may have one or more of the following drawbacks.

Preamble injection vulnerability: in the IEEE standard a channel estimate is generated based on the preamble 101 and the IEEE standard specifies no method for verification of the channel estimate. The security of the system may be compromised as attackers may perform preamble injection attacks which could reduce the measured distance, as described in Marcin Poturalski, Manuel Flury, Panos Papadimitratos, Jean-Pierre Hubaux, and Jean-Yves Le Boudec. Distance Bounding with IEEE 802.15.4a: Attacks and Countermeasures. In IEEE Transactions on Wireless Communications, Year: 2011, Volume: 10, Issue: 4.

Early Detect, Late Commit (EDLC) vulnerability: The IEEE standard specifies the use of burst position modulation (BPM) and known scrambling sequences. However, burst position modulation, and, to a certain degree, use of known scrambling sequences within a burst may allow an attacker with high available signal to noise ratio (SNR) to detect a symbol's polarity early and therefore perform EDLC attacks.

The IEEE standard provides support for non-coherent receivers: The IEEE standard specifies ternary coding of the preamble and SFD, as well as a header/payload coding scheme that allows reception using only the BPM information. For an implementation in which the receivers are of coherent type, this support in the frame design for non-coherent receivers may result in loss of link budget and/or frame efficiency (length of frame, time used for the medium to exchange messages).

The IEEE standard provides support for long channels: For 1 μs and 4 μs preamble lengths, the standard supports radio channel lengths of 300 m and 1200 m, respectively. For implementations that do not require such a long channel, the frame may be designed more efficiently with a tighter bound on the radio channel length. In addition, tighter bounds may prevent certain types of distance reduction attacks. Accordingly, for some use cases, there may be drawbacks in terms of security and link budget.

The IEEE standard only provides for coarse granularity in adjusting link budget per frame phase: The number of synchronization preambles (a pattern of synchronisation symbols) in the preamble, as well as the payload data rate, cannot be adjusted in fine steps.

The IEEE standard may be sub-optimal for short frames in terms of Forward Error Correction (FEC): While the length of the payload data can be scaled from 0 to 127 octets, always 48 parity bits are added. This may not be efficient, especially for short payloads, and may be improved by using a different coding scheme.

Symbol design: When using pulses that comply with FCC/ETSI/ARIB spectral masks (as specified in ETSI EN 302 065-1 (V2.1.1) (11-2016): "Short Range Devices (SRD) using Ultra Wide Band technology (UWB); Harmonised Standard covering the essential requirements of article 3.2 of the Directive 2014/53/EU; Part 1: Requirements for Generic UWB applications"), a peak pulse repetition frequency (PRF) of 499.2 MHz may lead to a ~2 dB increase of peak power used by a RF power amplifier of an IR-UWB transmitter which may result from constructive inter-pulse interference. This would lead to extra current consumption. In addition, the burst scrambling sequences, as defined in the IEEE standard, may lead to unnecessarily high peak power as measured by FCC/ETSI. Furthermore, the use of Binary Pulse Position Modulation (BPPM) of bursts leads to opportunities for attackers to mount EDLC attacks, especially considering the FEC scheme that is defined. Finally, the use of long bursts at low data rates could lead to a need for a large energy storage capacitance for the RF power amplifier of an IR-UWB transmitter, thereby increasing the system cost.

Long non-optional header: Since the header is of a fixed length and always transmitted using 110 or 850 kbit/s, it will occupy at least 20 μs of air time, which may be undesirable for short frames, resulting in excessive battery drain and reduction of short frame gain (due to regulations, e.g., the ETSI specification mentioned above, the total amount of energy in a short frame must be below a certain value).

The IEEE standard requires a tight crystal tolerance: The reference frequency tolerance is specified to be ±20 ppm, which may mean, in practice, that a sufficiently accurate, and therefore possibly expensive, crystal must be used.

The IEEE standard does not provide for use of multiple antennas: There are no provisions in the existing PHY definition that standardize the use (function definition) of multiple antennas at the transmitter device.

As mentioned above, the different aspects of the frame format definition described below may be suited to secure ranging applications and, in particular although not exclusively, suited to automotive Passive Keyless Entry (PKE) applications. In these applications, one or more fobs (transmitter/receiver devices) which might be in proximity to the automobile should be identified and eventually localized. The low frequency (LF) spectrum may be utilized to achieve these tasks in systems termed LF-PKE. In such systems, the localization of the fobs may be based on subsequent measurements of the received signal strength indicator (RSSI) with different antenna orientations.

In addition to the proposed frame format, one or more of the sections below propose a UWB secure ranging protocol suitable for secure ranging such as automotive PKE applications. The proposed protocol may overcome none, one or more of the following disadvantages associated with LF-PKE systems:

Localization in LF-PKE may be based on RSSI measurements which is prone to so-called relay attacks.

On the automobile side for example, large and expensive copper coils may be used as antennas. Substantial currents of approximately 1 A may be required to flow for tens of milliseconds to build up required LF fields.

Current Passive Keyless Entry (PKE) protocols require around 70 ms to identify which fobs are within reach, and to perform localization.

Figure 2:
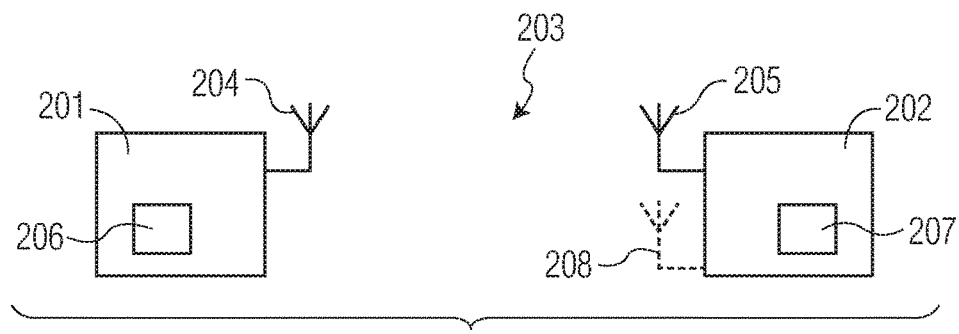
FIG. 2 shows an example of a first device and a second device which may comprise transmitter devices and receiver devices for communication therebetween.

FIG. 2 shows a first device 201 and a second device 202. Each device 201, 202 may be configured to transmit signaling to the other device (and thus may be considered a transmitter device) or receive signaling from the other device (and thus may be considered a receiver device) through a channel 203. Each device 201, 202 includes one or more antennas 204, 205. Each device 201, 202 includes a processing module 206, 207 configured to provide for generation of at least part of the signaling transmitted by the device 201, 202 and/or configured to provide for processing of at least part of the signaling received by the device 201, 202. It will be appreciated that in some examples separate processing modules 206, 207 may be provided for generating the signaling and processing the signaling.

Definition of a Full Frame Format

Figure 3:
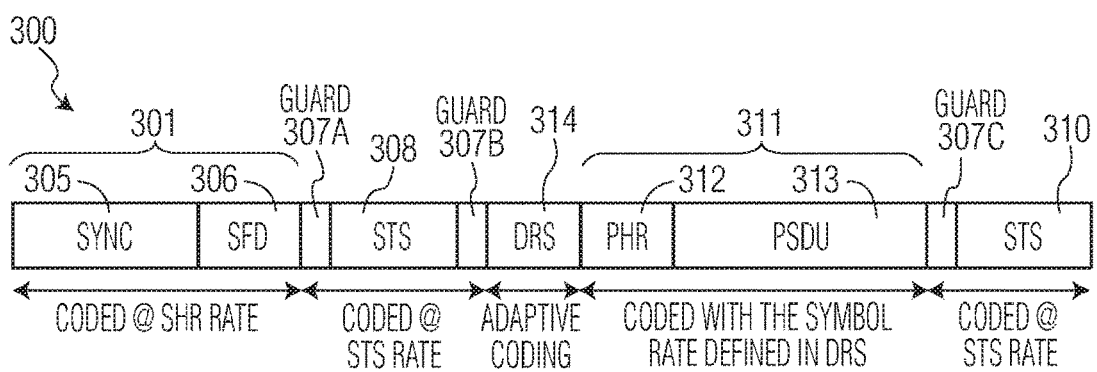
FIG. 3 shows an example embodiment of a frame format, such as an UWB frame format.

FIG. 3 shows an example embodiment of a frame format 300. The frame format includes a preamble 301, which comprises a plurality of synchronization symbols 305, termed "SYNC", and one or more symbols that define a Start-of-Frame Delimiter 306, termed "SFD". The plurality of synchronization symbols may include a repeating pattern of one or more synchronization symbols that are known to the receiver device 201, 202 and the transmitter device 201, 202. The plurality of synchronization symbols at the start of the preamble may enable the receiver device to synchronize with an incoming frame 300. The Start-of-Frame Delimiter 306 may comprise a known pattern of symbols that designate the end of the synchronization symbols 305.

The frame format 300 may include one or more guard intervals 307A, 307B, 307C, which may be absent of transmitted symbols, to provide resistance against interference due to multi-path propagation.

The frame format may include a Secure Training Sequence (STS) 308. The STS 308 is a non-repeatable sequence, such as generated by a Cryptographically Secure Pseudo-Random Number Generator (CSPRNG). The STS 308 may be known by or derivable by both the transmitter device and receiver device but not by an attacker. In one or more examples, a STS reference or "seed" is required to be known by both the transmitting device and the receiving device. The seed can then be applied to respective CSPRNGs such that the same STS can be generated independently by the transmitter device for generating the frame 300 and by the receiver device for processing the frame 300. The STS may be sufficiently long to avoid guessing attacks and to provide good auto-correlation properties. In one or more examples, to avoid guessing attacks, it may be important to have a very large set of sequences from which the STS is formed.

Accordingly, in one or more examples, we provide a processing module for a transmitter device configured to provide for generation of a frame for transmission by the transmitter device to a receiver device, the frame having a first Secure Training Sequence comprising a non-repeating sequence of symbols based on one or more of an agreed symbol sequence and an agreed reference for generation of such a symbol sequence agreed between the transmitter device and receiver device, the Secure Training Sequence provided for channel impulse response estimation and/or verifying channel impulse response estimate determined by the receiver device using a repeating pattern of predetermined synchronisation symbols.

A channel estimate based on the synchronisation symbols, which may be defined on a standard, may be considered to be insecure. However, determination or verification of a channel estimate using the secure training sequence which is securely known between the transmitter and receiver devices, may provide for a secure channel impulse response determination.

In one or more examples, we provide a processing module for a receiver device configured to provide for processing of a signal comprising at least one frame received by the receiver device from a transmitter device, the processing module configured to:

derive a secure training sequence for the frame based on predetermined secure information, the secure training sequence comprising a non-repeating pattern of symbols;

identify at least a section of the frame containing a secure training sequence provided by the transmitter device; and perform cross-correlation between at least a part of the secure training sequence in the frame with the derived secure training sequence for the frame to determine channel estimate information and/or verify channel estimate information determined based on the performance of cross-correlation between at least a part of a synchronization section of the frame comprising a repeating pattern of known synchronization symbols and one or more of the known synchronization symbols.

In one or more examples, the processing module may obtain channel estimate information using this method to identify a line-of-sight multipath component of the signal and, based on the line-of-sight component, determine a marker at which to measure the phase of the signal for determining the angle of arrival of the signal, as will be described in more detail below.

Thus, the determination of a predetermined correlation between at least a part of the first secure training sequence for the frame and secure training sequence provided by the transmitter, may indicate the determination of a secure channel estimate information comprising the time of arrival of the frame from multiple paths of a channel through which the signal propagates between the transmitter device and the receiver device. The processing module may be configured to use the secure channel estimate information for ranging. The process for use of a channel estimate, in general, for ranging will be familiar to those skilled in the art.

In one or more examples, the secure training sequence comprises a non-repeatable sequence of symbols, which may be generated by a Cryptographically Secure Pseudo-Random Number Generator (CSPRNG) based on the predetermined secure information comprising a seed value.

In one or more examples, the determination of the channel estimate may include identification of the first tap of the cross correlation having a corresponding tap value having a magnitude above a predetermined CIR threshold. For example, the first tap within the channel estimate may be indicative of a Line of Sight path, which may be used for distance bounding.

In one or more examples, the frame comprises a second STS 310, temporally, spaced from the STS 308. The second STS 310 may provide for verification of the channel estimate information based on the first STS 308.

The provision of the optional second STS, after a payload section 311, may be signalled in a physical layer (PHY) header 312, termed "PHR", of the payload section 311. The payload section 311 may further include a physical layer (PHY) service data unit 313, termed a "PSDU", to contain arbitrary data transferred between the transmitter device and receiver device 201, 202. The physical layer header 312, similar to the equivalent part in the IEEE standard may comprise information defining frame properties, such as the data-rate of one or more parts of the frame or the length of the PSDU 313.

In one or more examples, the processing module of the transmitter device is configured to provide for generation of the frame comprising a reference pattern of synchronization symbols known to both the transmitter device and receiver device for synchronization of one or more of the frequency of a carrier wave for modulation by the symbols of the frame and a symbol frequency comprising the frequency at which symbols of the frame are provided. In one or more examples, the processing module of the receiver device is configured to provide for processing of the frame by cross correlation between the reference pattern of the frame and a predetermined reference pattern.

In one or more examples, we provide a processing module of the transmitter device configured to provide for generation of a frame with a Data-Rate Selection (DRS) field 314. The properties of the DRS field will be described in a subsequent section.

In one or more examples, the DRS field 314 is adaptively coded using an adaptive coding scheme. The use of an adaptive coding scheme may minimize overhead while providing more flexibility than the IEEE scheme.

The DRS 314 and PHR 312 may be omitted if the parameters of the frame defined in those sections are already known by the processing modules 206, 207 of the transmitter device and receiver device 201, 202. In one or more examples, the PSDU section 313 may be omitted if no arbitrary data needs to be transmitted.

In one or more examples, the processing module provides for modulation of an arbitrary data stream of the transmitter device with one or more symbols of the secure training sequence. In one or more examples, the processing module provides for processing of a section of a received frame from a transmitter device containing arbitrary data modulated with one or more symbols of the secure training sequence, the receiver configured to derive a secure training sequence for the frame based on predetermined secure information, the secure training sequence comprising a non-repeating pattern of symbols and demodulate the arbitrary data using the derived secure training sequence.

The IEEE standard provides for spreading of one or more of the PHR 312 and PSDU 313 based on a linear feedback shift register technique (LFSR). In one or more examples, the processing module of the transmitter device 201, 202 may provide for spreading of one or more of the physical layer header 312 and the arbitrary data of the PSDU based on a third Secure Training Sequence comprising a non-repeating sequence of symbols based on one or more of an agreed symbol sequence and an agreed reference for generation of such a symbol sequence agreed between the transmitter device and receiver device 201, 202. The third STS may be based on the output from the same Cryptographically Secure Pseudo-Random Number Generator (CSPRNG) as the first STS.

Definition of a Reduced Frame Format

Figure 4:
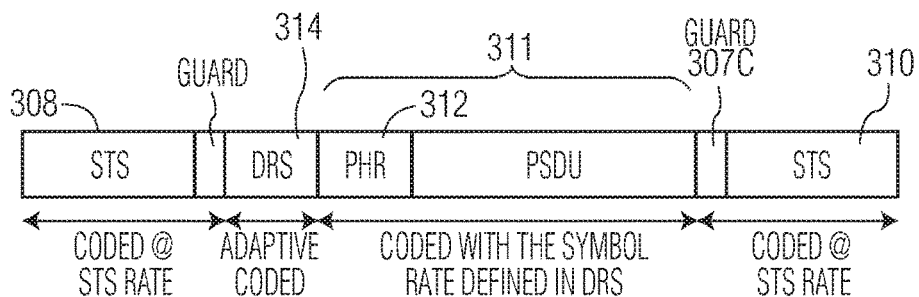
FIG. 4 shows an example reduced frame format, reduced in temporal length in comparison to the frame format of FIG. 2.

A reduced frame format is shown in FIG. 4. Corresponding reference numerals have been used for like parts. The reduced frame format may be absent one or more of the SYNC portion 305, the SFD 306 and the DRS 314. Thus, if synchronization is not required (e.g. if already provided by a previous frame), the SYNC and SFD fields 305, 306 in the preamble can be omitted.

In one or more examples we provide a transmitter device having a processing module configured to provide for generation of a frame for transmission to a receiver device, wherein based on synchronization between the transmitter device and receiver device being provided by a previously sent frame, the processing module is configured to provide for generation of a subsequent frame without the reference pattern of synchronisation symbols but with the secure training sequence comprising a different non-repeatable sequence of symbols.

The STS 308 of the reduced format may present to provide for acquisition comprising one or more of detection of frame, timing synchronization, frequency offset estimation, Channel Impulse Response estimation (e.g. the channel might be changed compared to previous frame exchange). For ranging a secure time of flight (ToF) calculation may have to be done again.

The generation of a reduced frame format frame by a processing module of a transmitter and the processing of such a frame by a processing module of a receiver may require a tight frequency and a timing alignment between the devices within $\pm 0.5$ $T_{sym}$, where $T_{sym}$ defines a preamble symbol period comprising the period of a symbol of the preamble 301 of the previously sent frame.

Pilot-Symbol Insertion

Figure 5:
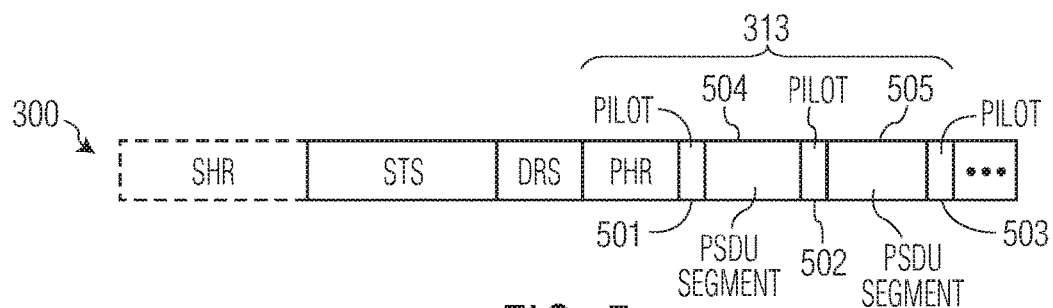
FIG. 5 shows a part of the frame format with two or more pilot symbols interleaved therein.

To allow a tracking of the channel impulse response (e.g. for mobile channels), the PSDU 313 may be interleaved with two or more pilot symbols 501, 502, 503, as shown in FIG. 5.

The pilot symbols 501, 502, 503 may be considered to separate the PSDU 313 into a plurality of PSDU segments 504, 505. The presence of the pilot symbols in the PSDU 313 may be indicated in the PHR field 312. In one or more examples, the processing modules of the transmitter and receiver devices have predetermined information to determine the location of the pilot symbols. However, in one or more examples, their location may be indicated in the PHR field 312. In one or more examples, the pilot symbols are modulated based on the same modulation scheme as the rest of the PSDU 313 but always use a symbol having a predefined modulation. The predefined modulation may be specific to whatever modulation scheme is employed such as BPSK, BPPM-BPSK and QPSK. Accordingly, the pilot symbols may not need to be demodulated. In one or more examples, the pilot symbols are spread (in terms of time and/or frequency) amongst the symbols of the PSDU 313 based on a non-repeating pattern, such as derived from a CSPRNG. Each pilot symbol by itself may not provide optimum auto-correlation properties, and in one or more examples, the second channel estimate information may be based on an average of several of these pilot symbols.

Accordingly, following determination of channel impulse response information based on the synchronisation symbols and/or the secure training sequence described above, the processing module of the receiver device may be configured to provide for cross-correlation between parts of a received frame containing pilot symbols, a predetermined pilot symbol pattern defining the location in terms of time in the frame of a plurality of pilot symbols, and one or more known pilot symbols; and based on said cross-correlation determine second channel impulse response information. In one or more examples, the processing module may update its record of the channel impulse response with the second channel impulse response information or combine the channel impulse response information and the second channel impulse response information. The pilot symbols may be of a predetermined pattern known to both the processing module of the transmitter device and the processing module of the receiver device or may be based on a secure training sequence comprising a non-repeating sequence of symbols based on one or more of an agreed symbol sequence and an agreed reference for generation of such a symbol sequence agreed between the transmitter device and receiver device.

In one or more examples, we provide a processing module for a receiver device configured to provide for processing of a signal comprising at least one frame received by the receiver device from a transmitter device, the processing module configured to:
 based on the predetermined pilot symbol pattern defining the location in terms of time in the frame of a plurality of pilot symbols, identify the plurality of pilot symbols present in the frame within the received signal;
 based on an average of two or more of the identified plurality of pilot symbols, provide for determination of channel estimate information.

Thus, in one or more examples, the use of pilot symbols may provide for tracking of the channel estimate at least for frames absent a block comprising a plurality of consecutive symbols of a known pattern for deriving channel estimate information.

Accordingly, the apparatus may provide for determination of a first channel estimate information based on a block of synchronization symbols 305 and/or the secure training sequence 308, 310 and then, subsequently, provide for determination of channel estimate information based on the first channel estimate information and the channel estimate information that is based on the average of two or more of the identified plurality of pilot symbols.

In one or more examples, the predetermined pilot symbol pattern is based on a non-repeatable sequence of symbols, such as generated by a Cryptographically Secure Pseudo-Random Number Generator (CSPRNG) based on a seed value, the seed value or sequence previously agreed between the transmitter device and receiver device.

Synchronization Symbols (SYNC)

The IEEE standard block of synchronisation symbols SYNC 305 comprises a certain number of synchronisation symbols, which are transmitted consecutively. A single synchronisation symbol is constructed using a certain ternary spreading sequence, taken from a set of available sequences, which are defined in the IEEE standard. During the transmission of the SYNC 305 by a transmitter device, the synchronisation symbol does not change. Accordingly, the receiver device is configured to cross-correlate an unchanging, repeating pattern of synchronisation symbols. This allows the receiver to retrieve timing information, to estimate carrier and symbol frequency offset and, optionally, obtain a channel estimate. The SYNC field 305 including the repeated synchronisation symbols labelled with parameters thereof are shown in FIG. 6.

Figure 6:
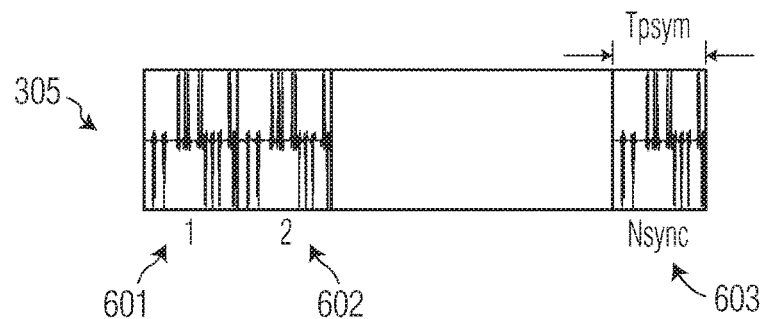
FIG. 6 shows the synchronisation field of the frame including repeated synchronisation symbols and is labelled with parameters thereof.

FIG. 6 shows the SYNC field 305 in more detail comprising a first synchronisation symbol 601, a second synchronisation symbol 602 comprising a repeated symbol of the first synchronisation symbol 601, the symbols continuing to repeat until the total number of synchronisation symbols, $N_{sync}$ 603, at the end of the SYNC field 305. The symbol duration $T_{PSYM}$ is also shown in FIG. 6. $N_{sync}$ and $T_{PSYM}$ may be important parameters for the design of a UWB frame. In particular, the symbol duration may limit the length of the estimated channel because the length of the individual synchronisation symbols determines the length of the correlator. When the channel length is larger than Tpsym, parts of the CIR will be folded back in the correlator results, i.e. different multipath components will end up at the same correlator bin and may therefore be indistinguishable. The symbol duration may influence allowed crystal tolerance. The number of preamble symbols $N_{sync}$ 603 may determine the SNR of the channel estimate and hence the ranging precision. In addition, the acquisition performance depends on the overall duration of the synchronisation field 305 i.e. $N \times T_{PSYM}$.

In the IEEE standard, for one or more applications, the range for the number of preamble symbols is too coarsely grained for the construction of optimal frames, especially for short frame lengths. Therefore, we disclose the following range for the number of preamble symbols:

$$N_{SYNC}=1.5^{k}*16*2^{l} \text{ with } k \in \{0,1\} \text{ and } l \in \{0,1,2,3,4,5,6,7\} \quad \text{(Eq 1)}$$

Further, we provide a special treatment of the case k=1 and l=7, where $N_{SYNC}$ is set to 4096 instead of 3072, which the equation Eq 1 suggests.

It some situations it may be considered that there is little flexibility in the IEEE standard to match the preamble symbol duration to the channel length. Only two values of $N \times T_{PSYM}$ are provided comprising 1 µs and 4 µs. Thus, this results in a channel lengths of 300 m and 1200 m, respectively. For one or more applications, the expected channel lengths of interest may be significantly shorter. A frame can be designed more efficiently with a tighter bound on the radio channel length. In addition, tighter bounds may prevent certain types of distance reduction attacks. Another advantage of shorter preamble symbols (i.e. shorter $T_{PSYM}$) is the improved tolerance to frequency variations of the reference clock. Therefore, we disclose the following approximate preamble symbol durations:

$$T_{PSYM}=\{0.25 \text{ µs}, 0.5 \text{ µs}, 1 \text{ µs}\}$$

The symbol duration both depends on the length of the spreading sequence and the peak pulse repetition frequency, which may be set to 124.8 MHz in the present example. To arrive at the specified values for $T_{PSYM}$, we propose an additional set of length-31, length-63, and length-127 sequences.

Alternatively, the ternary sequences specified in the standard can be used, although there are no sequences with a length of 63 specified. Hence, a symbol duration of 0.5 µs is not possible when using the IEEE standard (ternary) sequences.

In one or more examples, we propose synchronisation symbols that comprise sequences that use binary symbols instead of ternary symbols. The use of binary symbols is to overcome the loss in transmitted energy caused by the zero symbols in ternary sequences. This may result in a higher mean-PRF (pulse repetition frequency) for a given symbol rate, and therefore in a channel estimate with higher SNR compared to the case when ternary sequences are used.

The new set of synchronisation sequences was selected for good cross-correlation and autocorrelation properties. The IEEE standard-compliant sequences are listed in Table 1, Table 2 and are referenced with preamble-IDs 1-24. A new set of binary sequences are listed in Table 3, Table 4, Table 5 and are referenced with preamble-IDs 25-54. Thus, in one or more examples, a processing module for a transmitter may be configured to select one of the synchronisation symbols from tables 3, 4 and 5 and provide for generation of a frame containing said selected synchronisation symbol repeated $N_{sync}$ times to form a synchronisation field of the frame.

TABLE 1

Length-31 ternary preamble codes (optional)
Length-31

| ID | Code |
|---|---|
| 1 | -0000+0-0+++0+-000+-+++00-+0-00 |
| 2 | 0+0+-0+0+000-++0-+----00+00++000 |
| 3 | -+0++000-+-++00++0+00-0000-0+0- |
| 4 | 0000+-00-00-++++0+-+000+0-0++0- |
| 5 | -0+-00+++-+000-+0+++0-0+0000-00 |
| 6 | ++00+00---+-0++-000+0+0-+0+0000 |
| 7 | +0000+-0+0+00+000+0++----0-+00-+ |
| 8 | 0+00-0-0++0000--+00-+0++-++0+00 |

TABLE 2

Length-127 ternary preamble codes
Length-127

| ID | Code |
|---|---|
| 9 | +00+000-0--00--+0+0+00-+-++0+0000++-000+00-00--0-+0+0--0-+++0++000+-0+00-0++-0+++00-+00+0+0-0++-+--+000000+00000-+0000-0-000--+ |
| 10 | ++00+0-+00+00+000000-000-00--000-0+-+0-0+-0-+00000+-00++0-0+00--+00++-+0+-0+0000-0-0-++-+0+00+0+000-+0+++000----+++0000+++0-- |
| 11 | -+-0000+00--00000-0+0+0+-0+00+00+0-00-+++00+000-+0+0-0000+++++-+0+--0+-0++--0-000+0-+00+0+----000-000000-+00+-0++000++--00++-0-0 |
| 12 | -+0++000000-0+0-+0---+-++00-+0++0+0+0+000-00-00-+00+-++000-+-0-++0-0++++0-00-0+-00+0+00++--00+000+-000-0--+0000-0000--0+00000+-- |
| 13 | +000--0000--++0-++++0-0++0+0-00-+0++00++-0++0+-+0-00+00-0---000-+-00+0000-0++-00000+-0-000000-00-+-++-+000-0+0+0+++-00--00+0+000 |
| 14 | +000++0-0+0-00+-0-+0-00+0+0000+0+-0000++00+0+++++-+0-0+-0--+0++--000---0+000+0+0-+-000000-+-0--0++000-00+00++-00--++-00-00000 |
| 15 | 0+-00+0-00--++0000---++000+0+-0-+00-+000--0-+-+00-+0-++00+-++0+00000+0-0+++--00+00+000-0000+00--+0++0+0+0-00-0-+-0+0++00000 |
| 16 | ++0000+000+00+--0+-++0-000--00+-0+00++000+++00+0+0-0-+-0-0+00+00+0++----+00++--+0+-0--+000000-0-0000-+0--00+00000+-++000-0-+0+0 |
| 17 | +---000-0-0000+-00000+000000+---+-++0-0+0+00+-00+++0-++0-00+0-+000++0+++0--0+0+-0--00-00+000--++0000+0++-+-00+0+0+-+-00--0-000+00+ |
| 18 | --0+++0000+++----000+++0+-0004+0+00+0++-+-0--0-0-0000+0-+0++-++00+--00+0-0++00-+000000+-0-+0-0+-+00--00-000-000000+00+00+-0+00++ |
| 19 | -0-++00-++000++0-+00+-000000-000----+0+00+-0+000-0--++0-+0--+0+-+++++0000-0+0+-000+00+++-00-0+00+00+0-+0+0+0-00000--00+0000-+-0 |
| 20 | --+00000+0--0000-0000+--0-000-+000+00-++00+0+00++0-00-0++++0-0++-0-+-000++-+00+-00-00-000+0+0+0++0+-00++-+----0+-0+0-000000++0+- |
| 21 | +0+00--00-+++0+0+0-000+-++-+-00-000000-0-+00000-++0-0000+00-+-000--0-00+00-0+-+0++0-++00++0+-00-0-0++++-0++---0000---000+000 |
| 22 | 0-00-++--00-++00+00-000++00--0-+-+000000-+-0+0+000+0---000--++0+--0-+0-0+-+++++0+00++0000-+0+0000+0+0-0+-0-+00-0+0-0++000+0000 |
| 23 | 000++0+0-+-0-00-0+0+0++0+--00+0000-000+00+00-+++0-0+00000+0++-+00++-0+-+++--0--00-0--000+-00+-0-+0+000++---0000++-000-0+00-+000 |
| 24 | +0+-0-000++-+00000+00--0+-0000-0-000000+--0-+0+---++00+----++0+00+00+0-0-+-0-0+0+00+++000++00+0-+00--000-0++-+0--+00+000+0000++0 |

TABLE 3

Length-31 binary preamble codes (optional)
Length-31

| ID | Code |
|---|---|
| 25 | -+-+-+++-++---+++++--++-+--+--- |
| 26 | -++---+--+++++-+++---+-+-++-+--- |
| 27 | -++-+-+-+---+-+++++-++--+++--- |
| 28 | -+--+-++--+++++---++-+++-+-+--- |
| 29 | -+++--++-++++++-+---+-+-+-++--- |
| 30 | -+-++-+-+---+++-+++++--+--++--- |

TABLE 4

Length-63 binary preamble codes (optional)
Length-63

| ID | Code |
|---|---|
| 31 | -++++++-+-+-++--++-+++-++-+-+-+++---+-++++--+-+---++----+---- |
| 32 | -+----++---+-+--++++-+----+++--+--+-++-+++--++---++-+-+-++++++---- |
| 33 | -+++----+-+--++-++--+-++--+++-+++++--++---+-+-+-+++++++---- |
| 34 | -++-+++--++---+++-+--+++++-++-+---+--+-++--+-+-+-+-+---+++----- |
| 35 | -+-++++++-+-+-+---++--++++-+++-+-++-+-++-+-+----+++---- |
| 36 | -++++--+---+-+-+---++-+----+---+-++-++++++-+-+++---++--+++-++---- |

TABLE 5

Length-127 binary preamble codes
Length-127

| ID | Code |
|---|---|
| 37 | -+++++++-+-+-+---++--+++-+++-+---+-++---++-++++-++-+-++-++--+-+--+---+++----+-+++++--+-+-+++--++-+---+--++++---+-+----++-----+----- |
| 38 | -+---+--++-+--++++-+++----++++++++---+++-++----+-+--+-+++++-+-+-+-----+-++-++++--+++--+-+-++--++-----++-++-+-+++-+----++--+--+---- |
| 39 | -++--++-++---+++--++-+-+++----+--++----+-+-+-++--+-+-+--++++--+---++-+-+-----++++++++-+++-++-++++-+---+-++--+++++-+----- |
| 40 | -++-++++-----+-++----+----+++-+----++----+---+++--+-+----++-+--+-+++++-+--+++-+++---+++-++--+-+---+-+-++-++-+++++++-++-+-+----- |
| 41 | -++----+-+--+-++++++-+++++----+++-+-+-+-+-++++-+--++--+++---++-+-++--+----+-+++-++-+----+++-+-++--+-++-+--++-+----- |
| 42 | -++++-++--++---+-+-+--+++-+++++--+----+----+-+-+--++-++-+--+-+----+-++----++-+-+++++++-+-++-+++-++++---+++-+----+-+-+++----- |
| 43 | -+----+---+-+++-+-++-+----++--++-+-+-+-+++--++++-++-+----+-+-+-++++++-+---+-+---++-+++--+++++----+++-++++---+---+-+--++---- |
| 44 | -+-++-----+++-+----+--+++--++-+--+-+-+++-++-+++--++-++-+-++-+-+++++--++++----++--+---+-+--++-++++-+-+-+---++++++++--+----- |
| 45 | -+++-++-++++++-+++++++-+-+-+-+-++-+-+-+-+-++-+++-+++-+-+-++-++--+-++++-+++-+----+---+-+-++--++++-+-+-+----++-+------+----- |
| 46 | -+---+++++++--+-+-+++++---++--+-+---+---++---++++-+++++-+-++-+-++-+-++--+++-++-+++-+--+--+-++---+++-+----+-+++-----++-+---- |
| 47 | -+-----++----+--+----+++++--+-++--+++-+---+----++++++-+----+++---+--+--++-++-+-++-++++-++----++-+-+++-+++-+---+-+-+-++++++----- |
| 48 | -+++-+-+--+--+++--++++-++-+-+-+++++-+----+---++-+-----+-+--+-+-++-++-+-+-+++--+----+-----+-+++++-----+++-+--+-+---++-++-++++---- |
| 49 | -+-+----++--++-+-----++++---++-+-++--+---+---+++-++++--+--++-++-+-++---+++--+-+-++-+---+-+-+++++++--+++++-++-+++----- |
| 50 | -+-+-++-+++++++--++-++--+-+--+-++--+++-+++-+++-+-++++-+---+-++--+--+---+++-+----++----+-+++----+----++-+------+++++-++----- |
| 51 | -++--+-+---+++----++++++---+-++-++---++--+-++---++-++-+++++++-+++--++++-+-----+--+-+++++--+--+--+----+--++-++-+-+-+-+-+++-+-++---- |
| 52 | -+---+++++-+--++-+--+++-++-+++-++++++++---++-+---+--+++--+-+--+-+---++-+-+-+-----++-+----+++-+-+++--+++---++-++--++---- |
| 53 | -++-+-+++-+---+-+-++-+++---+-----+---+---++-++++-+-+-----+-++++---+++-++++++---++---+-++--++-++-+---++++++----+++---+-+--++---- |
| 54 | -+-++-++----+-----+++-++-+--++++----+----+++---+++-+-++-+-++---+++----- ++++-+-+--+-+-+-+++---+++++-+++++++-+-+-+-----++----- |

The binary sequences listed in tables 3, 4 and 5 are configured such that the autocorrelation functions of a repeating pattern of the same sequence are impulse-like, but not perfect in a sense that all out-of-phase components are zero. However, as the resulting error is constant throughout the whole autocorrelation sequence (the sequences are configured such that an autocorrelation sequence thereof has a slight offset in the out-of-phase components), the resulting de-spreading error can easily be corrected.

Figures 7, 8:
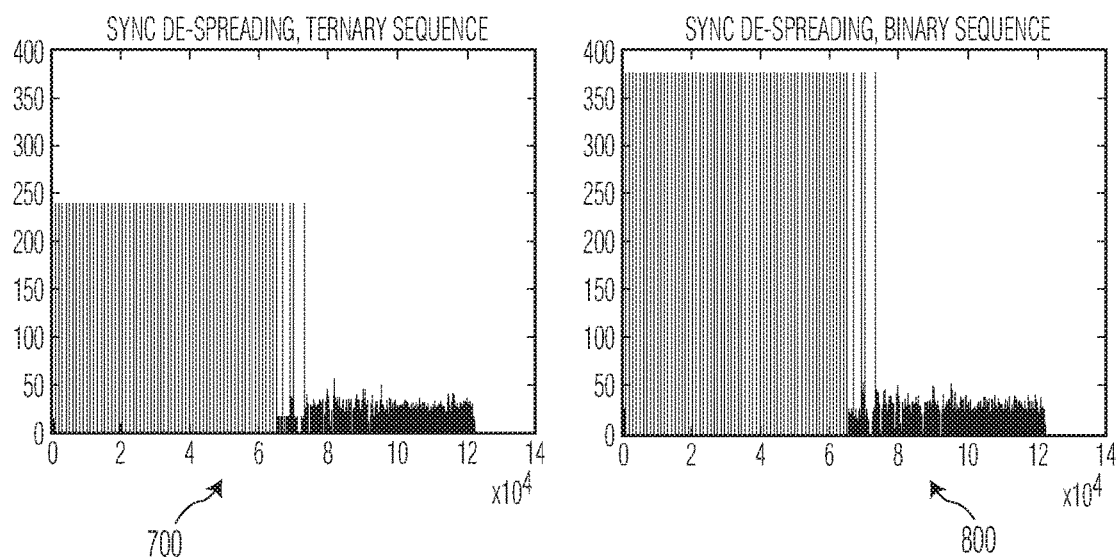
FIG. 7 shows an example representation of a de-spreaded synchronisation field for ternary encoded synchronisation symbols.
FIG. 8 shows an example representation of a de-spreaded synchronisation field for binary encoded synchronisation symbols.

In FIG. 7 and FIG. 8, received samples of UWB-frame 300 after de-spreading with the preamble codes is shown, for both the ternary sequences 700 and the binary sequences 800. The x-axis shows the index of the received samples and the y-axis shows the cross-correlation between the received signal and the respective one of the synchronisation symbols. Every sharp impulse marks a de-spreaded synchronisation symbol. Comparing the height of these impulses for both figures, there is roughly a 3 dB SNR improvement when using the binary sequence. So, the cross-correlation function determined by the processing module of the receiver using the proposed binary synchronisation symbols in the sync field 305 has a greater SNR 305 than using the ternary sequence synchronisation symbols of the IEEE standard, making synchronisation and channel estimation more reliable.

In one or more examples, we provide a processing module for a receiver device configured to provide for processing of a signal comprising at least one frame received by the receiver device from a transmitter device, the processing module configured to:
  perform cross-correlation on at least a part of the received frame comprising a synchronization field of the frame, the synchronization field comprising a plurality of repeating predetermined synchronization symbols, the cross-correlation performed with one of the predetermined synchronization symbols known to the processing module to obtain a cross correlation function thereof;

provide for determination of a corrected cross-correlation function based on application of an error removal function to the cross-correlation function, the error removal function configured to remove the effect of a periodic offset of constant period due to non-zero out-of-phase autocorrelation components of binary code sequences that form the synchronization symbols and up-sampling performed at the transmitter device or the error removal function is configured to remove an offset to the cross-correlation function based on a mean average of said cross-correlation function when up-sampling is not performed at the transmitter device; and based on the corrected cross-correlation function provide for determination of one or more of:
a) an estimate of a carrier frequency offset compared to a carrier frequency used by the transmitter device;
b) an estimate of the channel impulse response;
c) detecting the presence of a valid signal.

In one or more examples, the repeated predetermined synchronization symbols are binary coded. In one or more examples, the repeated predetermined synchronization symbols provide non-zero out-of-phase autocorrelation components.

In one or more examples, the (noise-less) auto-correlation result provides a template for subtracting correlation results for the out-of-phase components. This error removal can be done iteratively, starting with the largest cross-correlation result. The iterative process may work as follows: search for the largest cross-correlation result. Using the auto-correlation function it can be estimated which out-of-phase interference is caused to the other cross-correlation results of the cross-correlation function. This estimate is subtracted from the cross-correlation function. Then the 2nd largest cross-correlation result can be searched for etc.

In one or more examples, the repeated predetermined synchronization symbols comprise one of the symbols recited in tables 3, 4 and 5 above.

Figure 9:
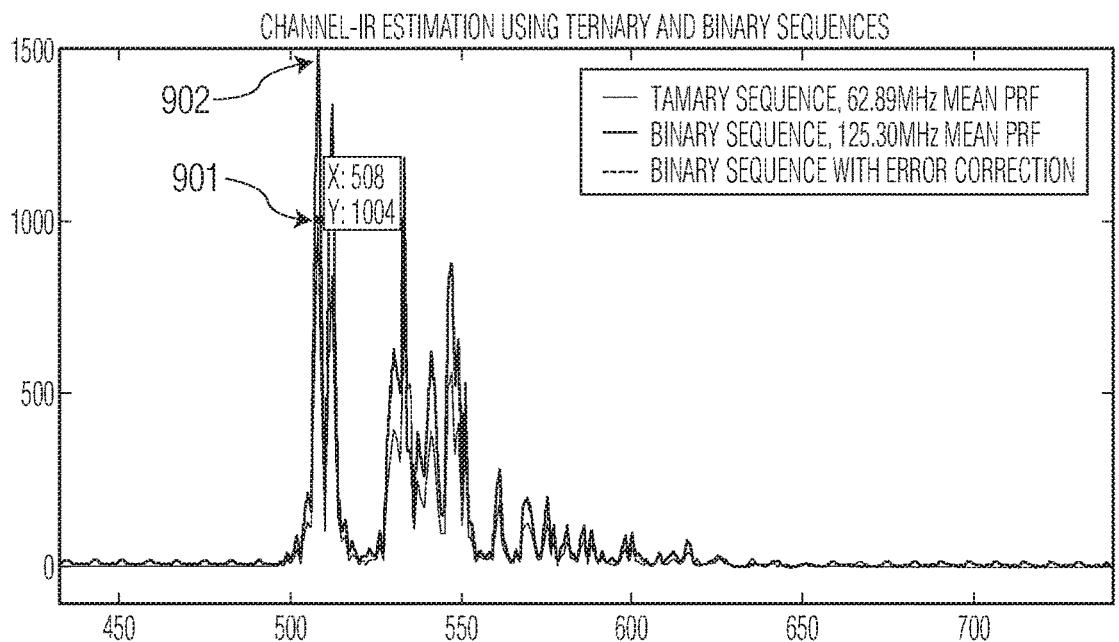
FIG. 9 shows example channel estimate information of an example channel comparing the use of binary and ternary encoded synchronisation symbols.

FIG. 9 shows a realization of a Channel Impulse Response estimate based on correlating with synchronization symbols comprising a ternary sequence and synchronization symbols comprising binary sequences. FIG. 9 shows on the x-axis cross-correlation or time index and on the y-axis an example of a cross-correlation results for a given channel realization. FIG. 9 shows the cross-correlation (de-spreading error) 901 resulting from the use of the IEEE ternary sequences and the cross-correlation (de-spreading error) 902 resulting from the use of the binary sequences defined above with and without the error removal function.

At the transmitter device, an oversampling procedure may be used to generate the frame of the UWB waveform from the synchronization symbol sequences. The oversampling leads to the periodic non-perfect autocorrelation properties of the binary sequences and thereby the occurrence of a periodic error in the autocorrelation function. It is this periodic error that is compensated for by the error removal function.

Thus, in one or more examples, the error removal function is based on a known up-sampling factor applied by the transmitter device, which may be predetermined.

For the error removal function, an estimate of the error caused by the binary codes of the synchronization symbols must be obtained. If no oversampling is performed by the transmitter device, the error caused by the use of binary sequences is visible to the processing module of the receiver device as a constant offset of the cross-correlation function obtained during de-spreading of the synchronization symbols. If oversampling is performed by the transmitter device, the offset visible to the processing module of the receiver device is different for each up-sampling phase, but periodic based on the up-sampling factor.

In one or more examples, where no up-sampling is performed by the transmitter device, the error correction function may be based on an estimation of the mean value of the obtained cross-correlation function, which may be subtracted therefrom. In one or more examples, where up-sampling is performed by the transmitter device, an estimation of the mean value is determined for each up-sampling phase, the number of up-sampling phases may be known to the processing module of the receiver device based on predetermined information, the error correction function based on the mean values for each up-sampling phase which may be applied to the cross-correlation function separately for each up-sampling phase, due to the periodicity of the error.

Figure 10:
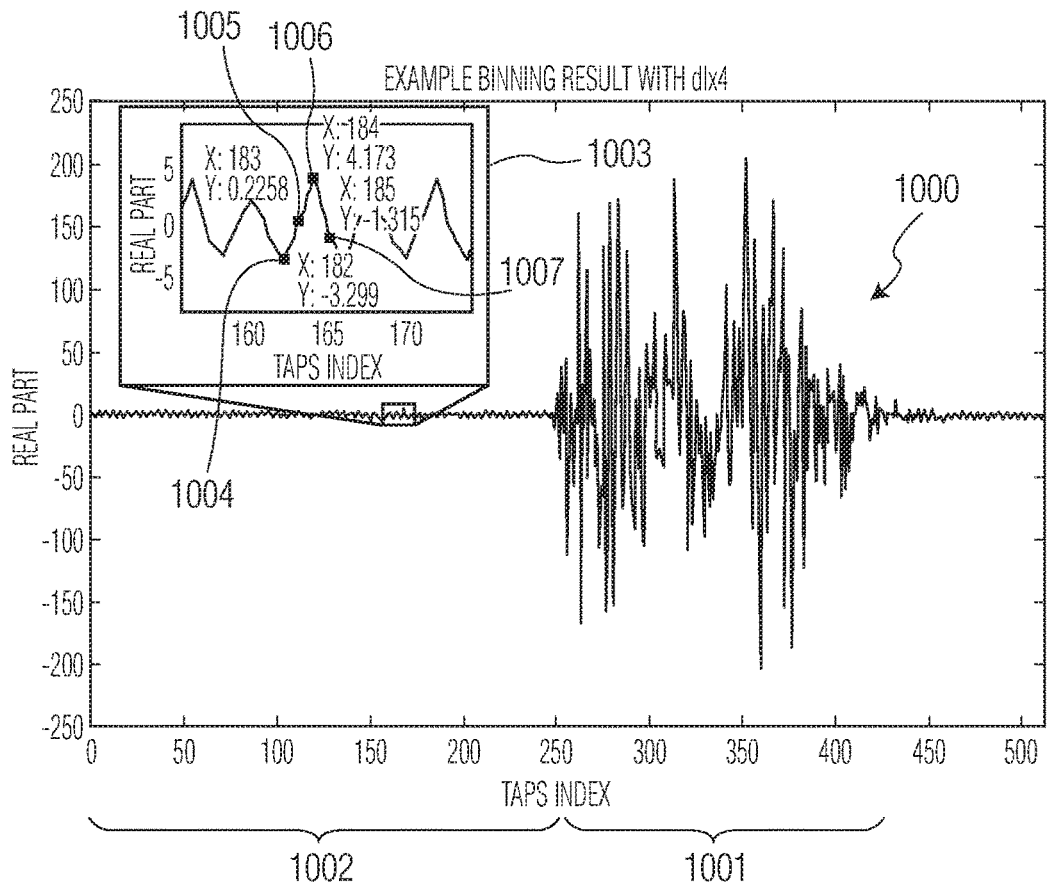
FIG. 10 shows an example autocorrelation function of the signal.

FIG. 10 shows an example cross-correlation function 1000 of the received signal impaired by transmission channel 203 with the binary code sequence synchronization symbols and where the transmitter device has provided for up sampling. The part of the signal that yields the channel estimate is shown as section 1001 and a part of the signal in the time-domain that is absent of wanted signal is shown as section 1002. The section 1002 includes, in the main, only the periodic error that may influence the determination of channel estimate information. Inlay 1003 shows a magnified portion of the graph. In one or more examples, the processing module is configured to determine the part of the cross-correlation function absent the channel estimate information based on a minimum energy measure.

In this example the up-sampling factor applied to the signal transmitted by the transmitter device is four. Accordingly, four repeating offset values 1004, 1005, 1006 and 1007 may be identified. The cross-correlation function is sampled at a rate such that the tap index of consecutive repeating offset values has a separation equal to the up-sampling factor. The sampling rate of the cross-correlation function may be based on information contained in the frame or a previous frame that specifies the up-sampling applied by the transmitter device. The factor delta-L specified in relation to the SHR part of the IEEE standard may fulfill such a purpose.

Accordingly, the first offset value 1004 has a value −3.299 for tap index 162 (and periodic taps 162+/−N·UPS, where UPS=up-sampling factor and N=an indexing value). The second offset value 1005 has a value 0.2258 for tap index 163 (and periodic taps 163+/−N·UPS, where UPS=up-sampling factor and N=an indexing value). The third offset value 1006 has a value 4.173 for tap index 164 (and periodic taps 164+/−N·UPS, where UPS=up-sampling factor and N=an indexing value). The fourth offset value 1007 has a value −1.315 for tap index 165 (and periodic taps 165+/−N·UPS, where UPS=up-sampling factor and N=an indexing value).

The determination of the error correction function may be as follows and accordingly the processing module of the receiver device may be configured to perform the following method:

The cross correlation function may be considered a circular cross-correlation signal $R\_xy[n]$, $n \in (0, N-1)$ between received signal $y[n]$ and the one or more synchronization symbols sequence $x[n]$ is obtained by de-spreading the SYNC field 305.

Considering an oversampling factor K, R_xy[n] is down-sampled multiple times with different down-sampling phases k=0, 1, K−1, obtaining K sequences R_xy_k[m], m∈(0,N/K−1)

For each down-sampled component R_xy_k[m], a novel estimation procedure for the mean value may be applied, which automatically rejects the wanted signal 1001 from being included in the mean value.

The circular convolution EN_k[m] of squared signal R_xy_k$^2$[m] and a moving average filter h[m]=1/L with Length L<N/K is obtained as a measure of the energy in the cross-correlation signal.

In addition, the circular convolution DC_k[m] of signal R_xy_k[m] and same filter h[m] is obtained as a measure of the mean value in the cross-correlation signal.

We search for the index m_s related to the global minimum of EN_k[m] and read out DC_k[m] at this index to obtain an estimate of the error signal err_k of the current phase. This estimate is using mostly samples from noise signal 1002 and is not impaired by the wanted signal 1001

$$m\_s = \mathrm{argmin}\{EN\_k[m]\}$$

$$err\_k = DC\_k[m\_s]$$

This procedure is done for each downsampling phase k∈(0,K−1). The periodic error signal Err[n] is composed of M=N/K repetitions of the vector [err_1, err_2, . . . , err_k]

To complete the error correction, Err[n] is subtracted from R_xy[n].

Start-of-Frame Delimiter (SFD)

In the IEEE standard the one or more symbol sequences of the SFD 306 are ternary coded. The use of ternary coding is convenient for non-coherent transmitter/receiver devices for reasons that will be apparent to those skilled in the art. In one or more examples, for a coherent receiver device, the use of ternary coding may not be necessary and may, in practice, cause a 3 dB loss in energy for the same symbol power. This 3 dB loss is caused by half of the symbols being 0 (e.g. the short, 8 symbol IEEE standard SFD looks like this: [0+0−+00−].)

The process of SFD detection at the processing module 206, 207 of the receiver may be performed only after a signal (e.g. synchronisation symbols of the preamble) is detected and thus its purpose is to distinguish the preceding part of the synchronization (SYNC) 305 against the actual SFD 306. Accordingly, in one or more examples, it may be advantageous for the SFD to have low cross-correlation with the synchronization symbols of the sync field 305.

According to an aspect of the disclosure, we provide a processing module for a receiver device configured to provide for processing of a signal comprising at least one frame received by the receiver device from a transmitter device, the at least one frame comprising a plurality of repeating predetermined synchronization symbols for providing synchronization between the processing module and the transmitter device and, subsequent to the synchronization symbols, one or more start-of-frame symbols defining the end of the synchronization symbols, the processing module configured to:

perform cross correlation to obtain a cross-correlation function on
  i) at least a part of the received frame; with
  ii) a predetermined modulation sequence used to modulate the one or more start-of-frame symbols and not the synchronization symbols; and
determine the location of a start of the one or more start-of-frame symbols based on an increase, above a threshold increase, in the cross-correlation function from a negative cross-correlation with the synchronization symbols to a greater cross-correlation with the part of the received frame containing the start-of-frame symbols.

The provision of start-of-frame symbols that are modulated with a particular modulation sequence that negatively cross-correlates with the synchronization symbols may provide for improved detection of the start of the one or more start-of-frame symbols. The effective identification of parts of a frame, comprising a data transmission unit, may be achieved due to a greater distance in correlation value between a peak identifying a correlation with the start-of-frame symbols and a negative cross-correlation with the synchronization symbols.

In one or more embodiments, the receiver device comprises a IR-UWB (Impulse Radio-Ultra-WideBand) receiver. In one or more embodiments the start-of-frame symbols are binary encoded. In one or more embodiments, the start-of-frame symbols comprise synchronization symbols that are binary modulated.

In one or more examples, the repeated predetermined synchronization symbols comprise one of the symbols recited in tables 3, 4 and 5 above.

In one or more examples, the processing module is configured to identify a peak correlation result 1103 from the cross-correlation and based on a predetermined offset from the peak correlation result, identify the temporal location 1102 of the start and/or end of the one or more start-of-frame symbols in the frame. There are numerous algorithms to identify peaks within a data set which may be known to those skilled in the art.

In one or more examples, the one or more start-of-frame symbols defining the end of the synchronization symbols comprise a plurality of ($N_{sym}$) synchronization symbols that are modulated by Binary Phase-shift keying based on a modulation sequence selected from one or more of the sequences in the following table, where $N_{sym}$ comprises the number of repeated synchronization symbols present in the SFD:

| ID | Pattern | $N_{sym}$ |
|---|---|---|
| 0 | −−+− | 4 |
| 1 | −−−−++−+ | 8 |
| 2 | −−−+−+−−+−+++−+ | 16 |
| 3 | −−−−−+−−−+++−−+−−+−+−+−−+−−++−−− | 32 |
| 4 | −−−−−+−−−+−−+−−−−+−++−−−+−+−+−−−−−−−−++−−−++−+−++−−+−−−−−++++−−+− | 64 |
| 5 | −−−+−−−−−−−+−−+++−−−+−−−−+−−−+++++−−+−+−−−−−++−−−−−+−−++−+−+−−+−+++++−−−−−+−+−−−+−−++−−−+−++−−−+−+++−+−−++−++−+−++ | 128 |

These "modulation sequences" indicates how the individual $N_{sym}$ 4, 8, 16, 32 etc synchronization symbols are modulated using BPSK modulation e.g. ID 0 refers to a sequence of length 4: −1 −1 +1 −1. Hence the SFD 306 consists of 4 synchronization symbols that are multiplied with −1 −1 +1 −1 respectively.

The IEEE standard defines the SFD field up to a length of 64 synchronisation symbols. For low data-rates (e.g. 106 kBit/s) such an SFD modulated with a faster symbol rate (e.g 1 Msym/s) is challenging to detect reliably. Thus, in one or more examples, the SFD field of 128 symbols is provided.

The provision of binary encoded SFDs symbols, the binary modulation sequence having negative cross-correlation with the synchronisation symbols, may be advantageous. In particular, symbols with such a cross-correlation property increases distance (i.e., decreases probability of "false lock") between the symbols of the SFD field 305 and symbols of the SYNC field 305.

Figure 11:
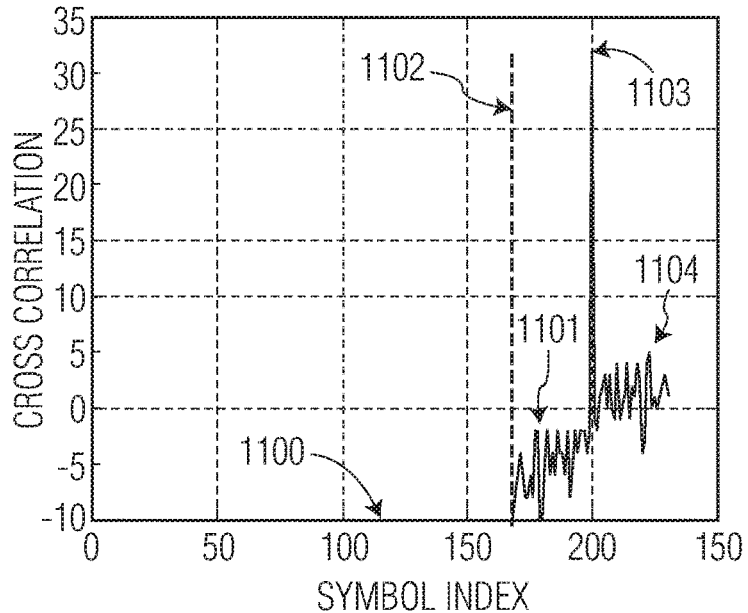
FIG. 11 shows an example cross-correlation between the start of frame delimiter symbols and the synchronisation symbols of the synchronisation field.

An example of the cross-correlation of one of the binary modulated SFD symbol sequences with the synchronisation symbols of tables 3, 4 or 5 followed by the symbols of the SFD field can be seen in FIG. 11. The x-axis shows the sequence symbol index position in the frame and the y-axis shows the magnitude of the cross-correlation. In region 1100 there is the negative cross-correlation with the synchronization symbols. From this it may be determined that the synchronization field is in this region. In region 1101 there is an increased correlation, which may comprise an upward step change in the magnitude of the cross-correlation. Accordingly, the increase at 1102 from the region 1100 to region 1101 may define the end of the repeating synchronization symbols and the start of the start-of-frame symbols. The peak 1103 defines the main peak of the correlation which may designate the detection of the SFD field. This point may be used as a marker, as described below, in a protocol for ranging between lock and key devices. Region 1104 may represent auto-correlation side lobes, as will be appreciated by those skilled in the art.

Figure 12:
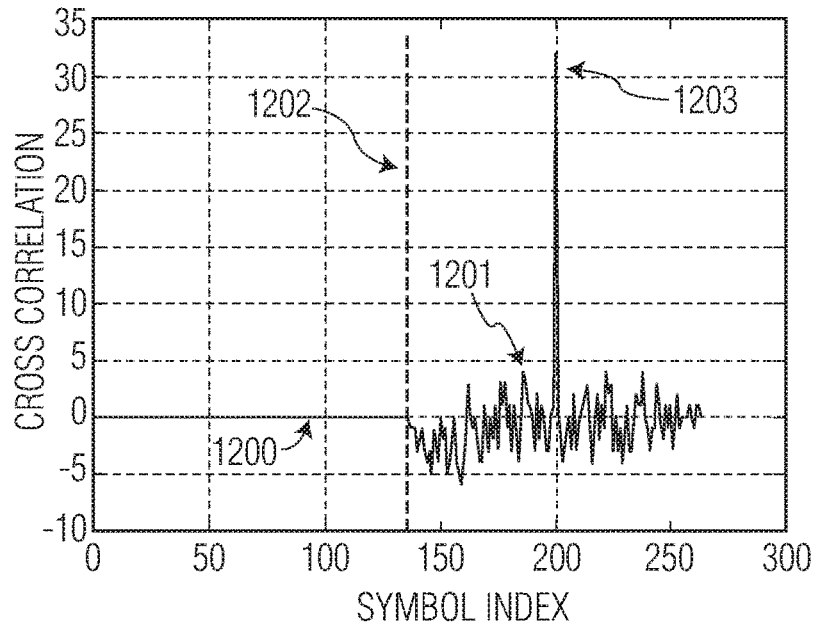
FIG. 12 shows an example cross-correlation, similar to FIG. 11, between the start of frame delimiter symbols and the synchronisation symbols of the synchronisation field, using synchronisation symbols and start of frame delimiter symbols as specified in the IEEE standard.

In FIG. 12 a comparison to an IEEE SFD with twice the number of symbols is given. Corresponding reference numerals with FIG. 11 have been provided for corresponding regions but beginning 12xx. As can be seen the energy in the main auto-correlation tap/peak 1203 is still the same as the shorter binary SFD used in FIG. 11. The cross correlation region 1200 between the SFD and the synchronization symbols is zero when using the SYNC and SFD symbols of the IEEE standard. The cross correlation between the SFD symbol of the frame and SYNC symbols shown in region 1201 varies around zero. In the presence of noise, correlation results in region 1200 and 1201 may be confused with peak 1203 and therefore may point 1202 more difficult to determine. However, in comparison to FIG. 11, the negative correlation in regions 1100 and 1101 may make peak 1103 easier to identify over noise and therefore the position of 1102 may be determined therefrom.

Thus, the binary SFD symbols provided herein gives a greater distance (in terms of the difference in magnitude between the cross correlation value between the SYNC and SFD fields) which may make it possible to differentiate between SYNC 305 and SFD 306 at lower power levels. Noise can decrease the distance between the correlation results at the point between the synchronisation field and the SFD field and therefore, the suggested symbols may improve noise resilience.

Secure Training Sequence (STS)

The STS may consists of one non-repeatable CSPRNG generated sequence (see section Cryptographically Secure Random Number Generator (CSPRNG)). In one or more examples, which may reduce reconfiguration minimum, the STS may comprise an integer multiple of an STS segment length.

As mentioned previously, the STS 308 does not contain repeated symbols and therein, for clarity, we will refer to parts of STS as "segments".

In one or more examples, the secure training sequence comprising a non-repeating pattern of symbols, the pattern of symbols grouped into segments each segment comprising a same predetermined number of symbols, wherein the processing module of the receiver device is configured to identify the start and/or end of the secure training sequence based on detection of a guard interval comprising an absence of signaling having a length equal to a segment.

We disclose three different segment lengths $N_{cps\_sts} \in \{128, 256, 512\}$ are possible, where only 512 is mandatory. $N_{cps\_sts}$ defines the number of chips per segment. The number of pulses per segment $N_{pps\_sts}$ depend on the mean pulse repetition frequency PRF. We disclose the use of two different mean PRFs of 62.4 MHz, $N_{pps\_sts} \in \{16, 32, 64\}$ and 124.8 MHz, $N_{pps\_sts} \in \{32, 64, 128\}$. We disclose that the peak PRF during the transmission of the secure training sequence is the same as during the SHR field 301 (at 124.8 MHz→an up-sampling factor δL=4 is applied at the transmitter device). For each segment $N_{bps\_sts} \in \{32, 64, 128\}$ bits need to be generated by the CSPRNG. For a mean PRF=124.8 MHz each bit defines the polarity of one pulse.

We disclose that the mapping from bit to polarity is done using the function pol(n)=1−2×bit(n). In one or more examples, the processing module of the transmitter device may be configured to generate signalling based on said mapping and a non-repeatable sequence of bits, such as from the CSPRNG of the transmitter device. In one or more examples, the processing module of the receiver device may be configured to process a signal received from the transmitter device based on said mapping and a non-repeatable sequence of bits for the received signal, such as from the CSPRNG of the receiver device.

Figure 13:
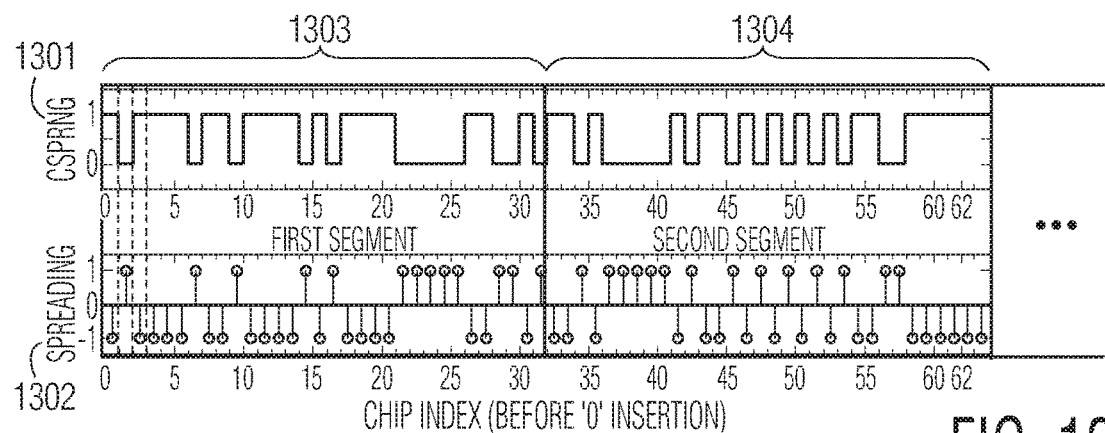
FIG. 13 shows an example non-repeating series of bit, such as output from a CSPRNG, and their mapping to a spreading sequence, which is divided into segments, for a first peak repetition frequency.

FIG. 13 shows an example for mapping for CSPRNG output 1301 to STS segment spreading 1302 for this case. The CSPRNG to STS segment spreading is shown for PRF=124.8 MHz and $N_{pps\_sts}$=32. A first segment 1303 and a second segment 1304 of the non-repeating STS symbols is shown.

Figure 14:
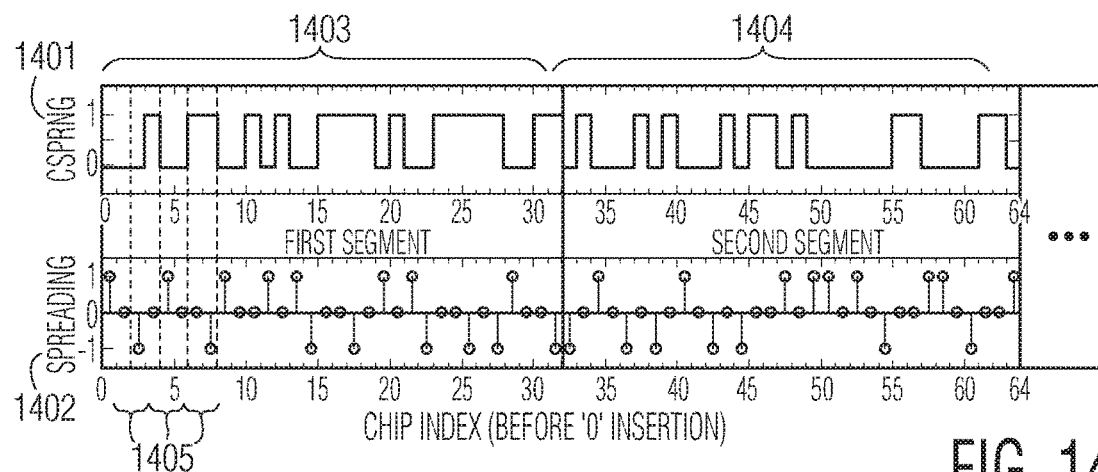
FIG. 14 shows an example non-repeating series of bit, such as output from a CSPRNG, and their mapping to a spreading sequence, which is divided into segments, for a second peak repetition frequency.

We propose that for a mean PRF=62.4 MHz, the CSPRNG output is split into two bit nibbles 1405. Each two bit nibble 1405 corresponds to position (first bit) and polarity (second bit) of one pulse. An example is shown in FIG. 14, which similar to FIG. 13 shows the mapping for CSPRNG output 1401 to STS segment spreading 1402 and a first segment 1403 and a second segment 1404. In FIG. 14, CSPRNG to STS segment spreading is shown for PRF=62.4 MHz and $N_{pps\_sts}$=16.

In addition to the spreading described above, the segments 1304, 1305, 1404, 1405 may be binary phase shift keying (BPSK) modulated.

Figure 15:
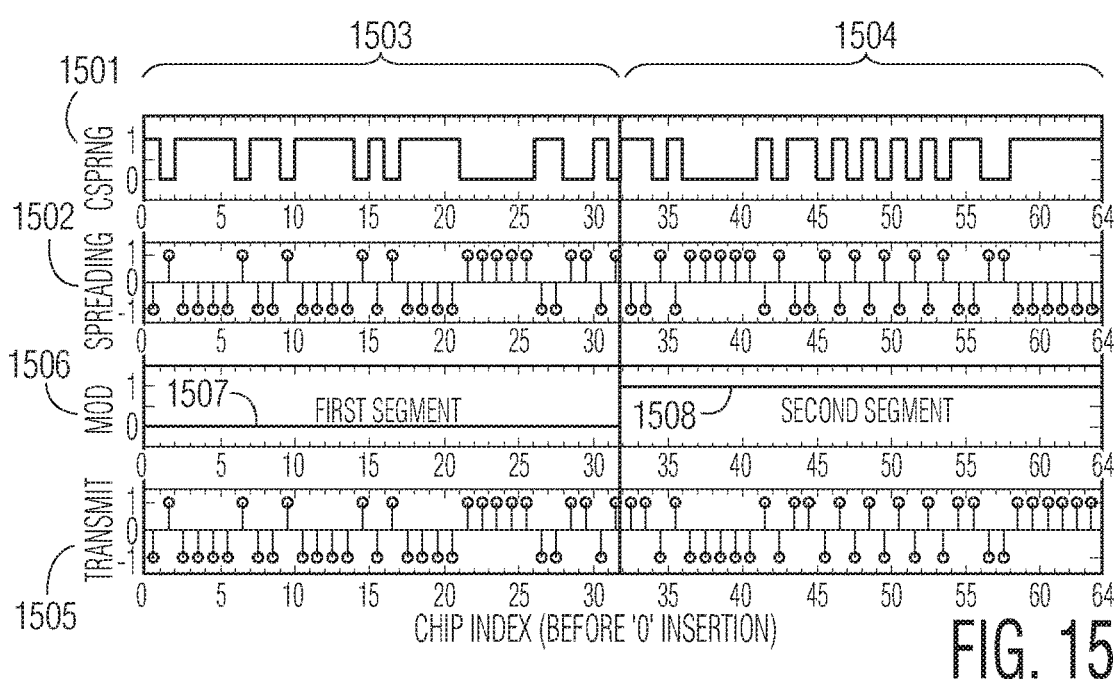
FIG. 15 shows an example modulation of the segments of the spreading sequence.

FIG. 15 shows an example of modulated segments 1503, 1504 of a secure training sequence for transmittal 1505 with PRF=124.8 MHz. Accordingly, the processing module of the transmitter device may be configured to provide spreading of the output of a CSPRNG, comprising a stream of non-repeatable n bits by pol(n)=1−2×bit(n) and, optionally, additionally modulate the spread bits on a per segment basis. The modulation may comprise BPSK such that in first modulation state 1507 (shown over segment 1503) the polarity of the spread bits 1502 are maintained and in a second modulation state 1508 (shown over segment 1504) the polarity of the spread bits 1502 are reversed.

In one or more examples, the processing module for a receiver device configured to provide for processing of a signal comprising at least one frame received by the receiver device from a transmitter device, the processing module configured to:

based on the received frame, provide for demodulation of per segment BPSK modulated secure training sequence followed by dispreading based on a spreading function of pol(n)=1−2×bit(n) to recover the bits n of a secure training sequence, the processing module configured to provide for cross correlation of the recovered secure training sequence with a known secure training sequence of the receiver device.

In one or more examples, we provide no additional encoding on top of the BPSK modulation described above. In the reduced frame format, modulation shall only be used on the STS 310 after the payload 311, to allow the receiver to derive channel estimate information and chip-accurate timing in the STS 308 before the DRS field 314.

The STS 308 modulation may be described by following two formulas:

$PRF = 62.4$ MHz:

$$x^{(k)}(t) = [1 - 2 \cdot m^{(k)}] \cdot \sum_{n=0}^{N_{pps\_sts}-1} [1 - 2 \cdot s(k \cdot N_{bps\_sts} + 2n + 1)] \cdot$$

$$p(t - s(k \cdot N_{bps\_sts} + 2n) \cdot T_c - 2n \cdot \delta L \cdot T_c)$$

$PRF = 124.8$ MHz:

$$x^{(k)}(t) = [1 - 2 \cdot m^{(k)}] \cdot$$

$$\sum_{n=0}^{N_{pps\_sts}-1} [1 - 2 \cdot s(k \cdot N_{pps\_sts} + n)] \cdot p(t - n \cdot \delta L \cdot T_c)$$

Where $m^{(k)}$ is the modulated bit for segment k, and s is the CSPRNG generated bit sequence.

The maximum number of modulated bits is equal to the number of segments $N_{sts}$. If less than $N_{sts}$ are used, then the remaining segments may be modulated with '0'.

Antenna Switched STS for Angle-of-Arrival Estimation

With reference to FIG. 2, an angle-of-arrival estimation may be made based on an estimated carrier wave phase difference between demodulated sections of a secure training sequence that is either;
 a) transmitted from at least two separate and spaced antennas 205, 206 at the transmitter device 202 and received by at least one antenna 204 at the receiver device 201; or
 b) transmitted from a single antenna 204 at the transmitter device 201 and received by at least two separate and spaced antennas 205, 206 at the receiver device 202.

Thus, depending on the example embodiment set out in (a) and (b) above the devices 201, 202 may act as receiver devices or transmitter devices.

Figure 16:
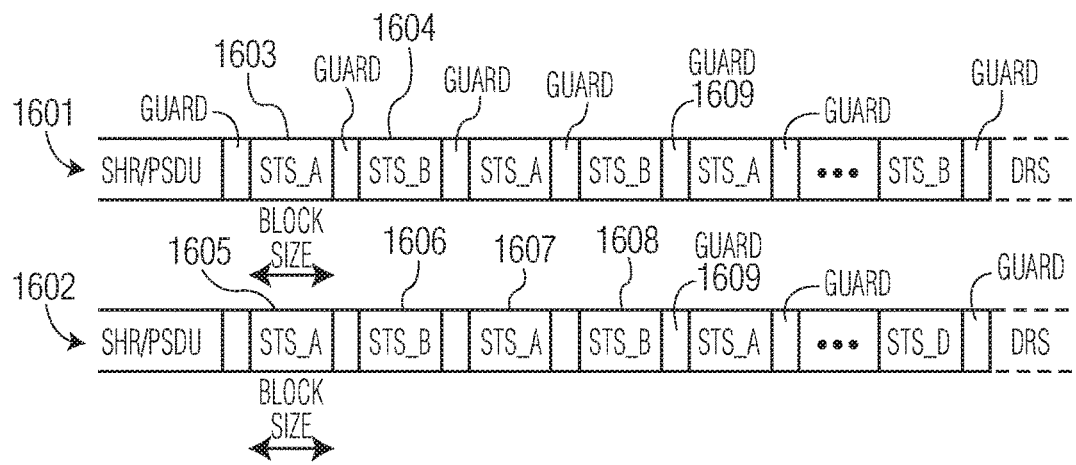
FIG. 16 shows a first and second example frame format for transmitting from two or four antennas or receiving by two or four antennas.

With reference to FIG. 16 two example frames are shown comprising a first frame 1601 and a second frame 1602. The first frame 1601 includes a secure training which is divided into time separated blocks 1603, 1604 and, for the second example frame 1602 is divided into time separated blocks 1605, 1606, 1607 and 1608. The blocks 1603-1608 are separated by guard intervals 1609 comprising an absence of the secure training sequence, which may comprise periods in which no signal is transmitted.

The first frame 1601 may be for use in systems that have two antennas at either the transmitter/receiver devices. The second frame 1602 may be for use in systems that have four antennas at either the transmitter/receiver devices.

In a first example, we consider the transmitter device 202 having two antennas 205, 208 and the receiver device 201 having one antenna 204. Thus, the processing module 207 at the transmitter may provide for generation of the secure training sequence, such as from a CSPRNG. The secure training sequence is then divided into the blocks 1603 1604 and the processing module provides for transmitting of the blocks from alternate antennas 205 206. Thus, blocks of the secure training sequence designated STS_A 1603 provided for transmittal from the first antenna 205 with the second antenna 208 not transmitting and the blocks of the secure training sequence designated STS_B 1604 are provided for transmittal from the first antenna 205 with the first antenna 205 not transmitting.

Accordingly, in one or more examples, the processing module for a transmitter device configured to provide for generation of a signal comprising at least one frame for transmission by the transmitter device to a receiver device, the processing module configured to provide for time-division of a secure training sequence into blocks, each block provided for transmission from only one of a plurality of antennas of the transmitter device, the processing module configured to provide for transmission of consecutive blocks from different antennas of the plurality of antennas, the secure training sequence comprising a non-repeating sequence of symbols based on one or more of an agreed symbol sequence and an agreed reference for generation of such a symbol sequence agreed between the transmitter device and receiver device.

In one or more examples the blocks are time-spaced by a guard interval.

In one or more examples, we provide a processing module for a receiver device configured to provide for processing of a signal received by the receiver device from a transmitter device, the signal comprising a secure training sequence divided into a plurality of time spaced blocks, the secure training sequence comprising a non-repeating pattern of symbols, and wherein one of:
 a) at least a first block is transmitted from a first antenna and a second block is transmitted from a second antenna of the transmitter device;
 b) at least a first block is received by a first antenna and a second block is received by a second antenna of the receiver device;
 wherein the processing module configured to:
 based on a plurality of repeating, predetermined synchronization symbols of the signal, provide for determination of a phase of a carrier wave of the signal received at the first antenna of the receiver device or transmitted from a first antenna of the transmitter device;
 derive a secure training sequence corresponding to the secure training sequence of the signal based on predetermined secure information known to both the transmitter and receiver device, the secure training sequence comprising a non-repeating pattern of symbols;
 perform cross correlation between the first block from the first antenna and a first part of the derived secure training sequence to obtain a first phase marker defining a phase of the signal from the first antenna relative to the determined phase of the carrier wave;
 perform cross correlation between the second block from the second antenna and a second part of the derived secure training sequence to obtain a second phase marker defining a phase of the signal from the second antenna relative to the determined phase of the carrier wave;
 based on the first phase marker and the second phase marker defining a phase difference of the signal between the first and second antennas and a known spacing of the first antenna relative to the second antenna, determine an angle of arrival of the signal relative to the receiver device.

In one or more examples, the first and/or second phase markers are derived based on channel estimate information of the cross correlation that defines a Line-of-Sight multi-path component.

Thus, the synchronisation symbols and/or a secure training sequence may be used to provide synchronisation between a particular antenna pair of the transmitter device and the receiver device. The synchronisation may provide for determination of a carrier frequency offset of the signal relative to a local frequency reference and/or a phase offset of the signal relative to the local frequency reference. The processing module of the receiver device expects that the second block is transmitted by or received by a specific different antenna. As the second antenna has a different physical position to the first antenna and the signalling provided to the antennas is provided by the same processing module of the transmitter and is therefore relative to the same local frequency reference at the transmitter, a phase difference may be determined. The phase difference in the carrier wave between the parts of the secure training sequence from one antenna compared to the parts of secure training sequence from the other antenna, can be used to determine an angle of arrival based on the frequency of the carrier wave and the known positions of the antennas.

For time interleaved AoA measurement the STS can be divided into 2 (STS_A, STS_B) or 4 streams (STS_A, STS_B, STS_C, STS_D) provided to separate 2 or 4 antennas respectively. The antenna separation can be provided on transmitter device or receiver device side. Thus, a single antenna may transmit time spaced STS blocks which are received by two antennas or two antennas may transmit time spaced separate parts of the STS, which is received by a single antenna. For the four streams, there may be two antennas at the transmitter and two antennas at the receiver. The transmitter configured to transmit two of the four blocks from a first antenna and the other two of the four blocks from the other antenna. A block from each transmit antenna is then received at each receiver antenna, and a similar process may be followed.

In one or more examples, for time-interleaving the STS is divided into $2^{d_{sts}}$ blocks, where each block is $2^{k_{sts}+3-d_{sts}}$ segments longs. A segment is defined in the secure training sequence section above. In one or more examples, for 2 antenna streams, the minimum $d_{sts}=1$ and for 4 streams $d_{sts}=2$.

In one or more examples, only these minimum interleaving options are mandatory. All other block-sizes, down to only 1 segment may be optional. In one or more examples, the time spaced blocks are separated by a guard interval of one segment in length where the segment may comprise a predetermined length.

In one or more examples, the secure training sequence may be divided into two, three, four, five, or any plurality of time spaced blocks and each block may be configured to be transmitted by or received by a corresponding number of antennas. Accordingly, the phase difference between different pairs or groups of the antennas may be derived and the phase difference may thus be indicative of the angle of arrival of the signal to those pairs or groups of antennas. Subsets of the plurality of antennas may be arranged along different axes to determine a direction of arrival of the signal.

Figure 32:
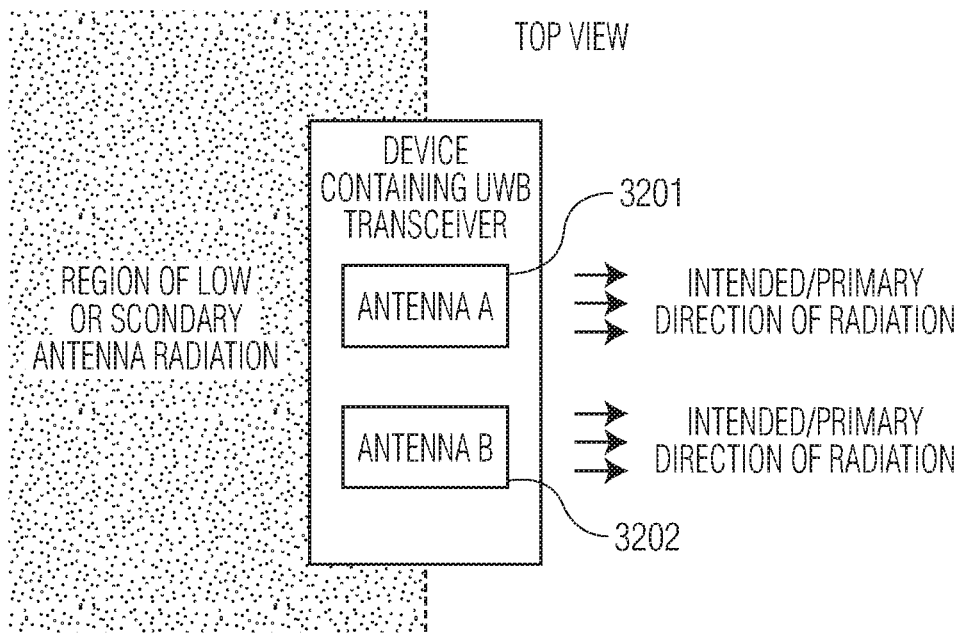
FIG. 32 shows a top view of a device having two antennas.

FIG. 32 defines example relative positions in the horizontal plane of first and second antennas A and B 3201, 3202 associated with corresponding Secure Training Sequences in the radio frame. Positions are defined in reference to the intended (primary) direction of radiation of the device.

Figure 33:
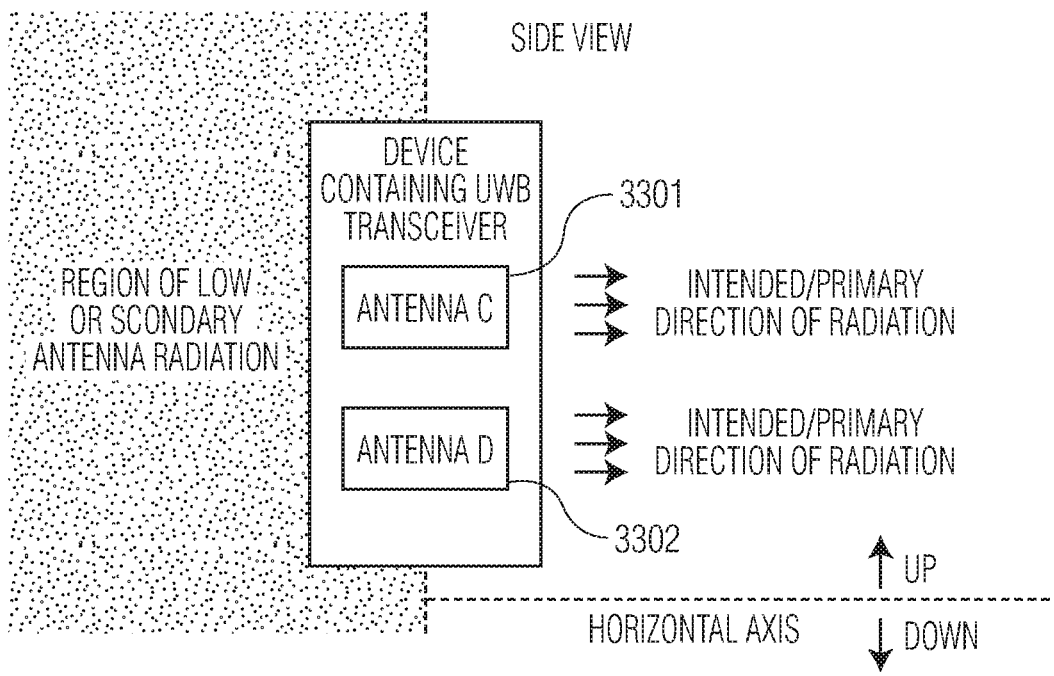
FIG. 33 shows a side view of the device of FIG. 32.

FIG. 33 defines example relative positions along the vertical axis of Antennas C and D 3301, 3302 associated with corresponding Secure Training Sequences in the radio frame. Positions are defined in reference to the intended (primary) direction of radiation of the device.

It will be appreciated that the phase difference between the phase markers of the secure training sequence blocks may be indicative of the extra distance one signal is required to travel from/to the first and second antennas. A determination of the angle of arrival may be determined based on trigonometry, the frequency of the signal and the known physical configuration of the antennas. A person skilled in the art will be familiar with such calculations.

Data-Rate Selection (DRS)

Figure 17:
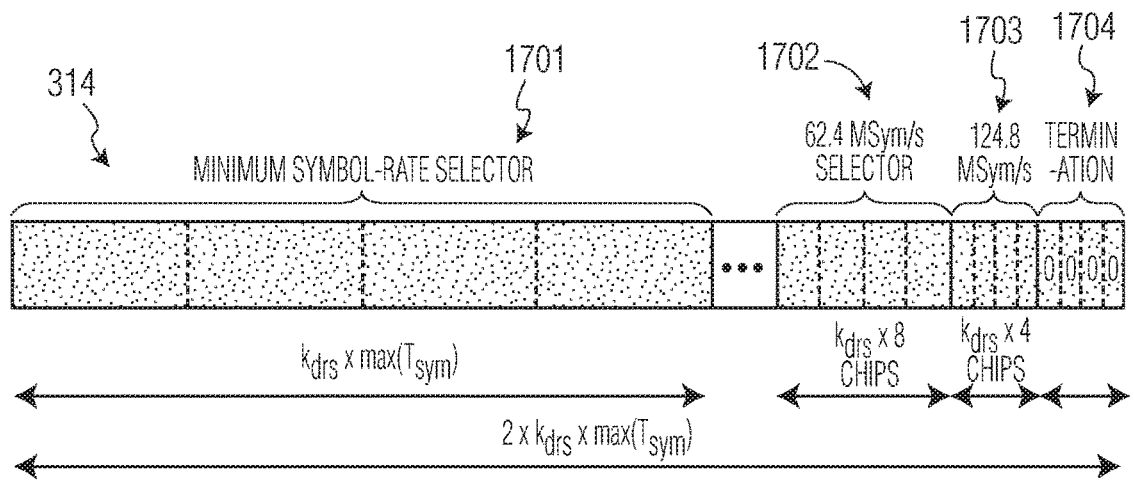
FIG. 17 shows an example data-rate selection field.

Compared to the IEEE standard we disclose a means for more flexible and more robust data-rate selection in the DRS field 314 of the frame 300. An example form of the DRS field 314 is shown in FIG. 17. The data rate selection is based on a k-out-of-N encoding with adaptive symbol lengths. Each symbol is spread in the same manner as the payload 311 and BPSK modulated with decreasing symbol period lengths. If Binary Pulse Position Modulation and Binary Phase Shift Keying (BPPM-BPSK) is used for the payload, the position bit is always set to 0 and only the polarity information is used. The first $k_{drs}$ symbols 1701 of the DRS field 314 correspond to the slowest supported symbol rate (e.g 122 kSym/s or 4096 chips/symbol). The next $k_{drs}$ symbols 1702 are modulated with twice the symbol rate (e.g 244 kSym/s) and so on. This continues until the last $k_{drs}$ symbols 1703 which are modulated with the highest symbol-rate (124.8 MSym/s). The symbol rates may be selected from a predetermined set of symbol rates. Only one $k_{drs}$ symbol data-rate segment must be set to '1'. In FIG. 17 the DRS field 314 is shown. It consists of several symbol-rate selector elements 1701, 1702, 1703. All elements except one are modulated with a symbol "0". To indicate which symbol-rate is used after the DRS field, the corresponding symbol-rate selector element 1701, 1702, 1703 is modulated with a symbol "1". The segment 1701, 1702, 1703 modulated with symbol "1" that appears first in the DRS field, may define what data-rate is used for the payload 311. The DRS field 314 may include a predetermined termination pattern 1704 at its end.

By default, the maximum symbol period may comprise $\max(T_{sym})=4096$ chips and a repetition factor $k_{drs}=4$. In the default case the DRS may occupy 32768 chips or 65 μs. This mode supports dynamic selection of symbol-rates from 122 kSym/s up to 124.8 Msym/s. For less overhead for use-cases with fast symbol-rate, the minimum selectable symbol-period can be defined to be any power of 2 between 4 and 4096 chips.

Furthermore, the repetition factor $k_{drs}$ may be changed to the value 1, 2 or 4. e.g. for $\max(T_{sym})=512$ (975 kSym/s) and $k_{drs}=2$, the DRS field is 2048 chips or 4 μs long.

Packet Header (PHR)

Figure 18:
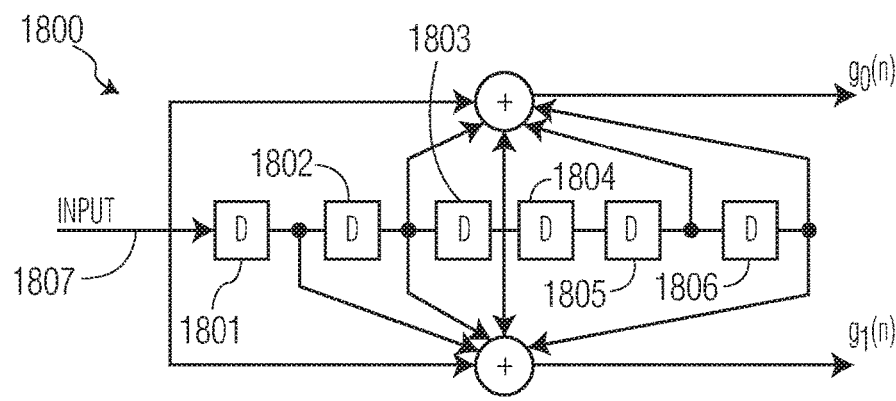
FIG. 18 shows an example convolutional encoder.

The packet header 312, in one or more examples, is encoded via k=7 convolutional code only. Six tailing bits may be added for termination before the PSDU 313 starts again from the all-zero state. Thus, the initial starting data for convolutional encoding of the PSDU 313 will be zero symbols. An example encoder 1800 is shown in FIG. 18, the delay elements 1801-1806 receive the data to be encoded at input 1807 and may initially contain all binary zeros (defining an all zero-state).

In one or more examples the processing module at the receiver device or at the transmitter device may provide for generation of a frame with one of the following 3 different variants for the PHR:
1) No PHR
   Header 312 is not part of the frame 300. The PSDU 313 therefore follows the DRS field 314 directly.
2) Short PHR
   The form of the short PHR is shown in the table below in which;
   a. Frame length: Specifies a number of decoded bytes in the PSDU 313.
   b. $d_{sub}$: Sub symbol division. One symbol is divided into $4^{d_{sub}}$ sub symbols
   c. RS: defines use of reed Solomon encoding where 0—No Reed Solomon is used in PSDU 313; 1—Reed Solomon used in PSDU 313.
   d. $r_{sts}$: Defines the segment length of the secure training sequence.

$N_{cps\_sts} = 128 \cdot 2^{r_{sts}}$ e. $k_{sts}$: The STS length specifier is given in $N_{sts}=16 \times 2^{k_{sts}-1}$ STS segment periods. For $k_{sts}=0$ no STS field is sent after the PSDU. E.g. for $r_{sts}=1$ and $k_{sts}=3$, the STS is 16384 chips long.

| Bit 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 0 | | | Frame Length [Bytes] | | | | | | | $d_{sub}$ | | RS | $r_{sts}$ | | $k_{sts}$ |

3) Extended PHR (optional)
   The form of the optional extended PHR is shown in the table below;
   Contains extended frame length specifier and additional pilot spacing specifier.
   a. $p_r$: The number of consecutive pilot symbols is given with the factor $2^{p_r}$.
   b. $p_s$: The pilot spacing is given with $2^{p_s+p_r-1}$ symbols. $p_s=0$ does not insert pilot tones.

| Bit 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | | | Frame Length [Bytes] | | | | | | | $d_{sub}$ | | RS | $r_{sts}$ | | |
| Bit 16 | 17 | 18 | 19 | 20 | 21 | 22 | 23 | | | | | | | | |
| $k_{sts}$ | | | $p_r$ | | | $p_s$ | | | | | | | | | |

The provision of pilot symbols in the PDSU 311 may be defined in the PHR 312. An example for $p_r=1$, $p_s=2$ is given in the table below, which represents a part of the PDSU in accordance with the pilot symbol insertion parameters $p_r$ and $p_s$.

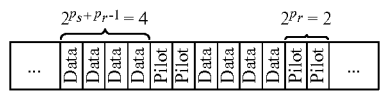

Inner Encoding (Convolutional)
In one or more examples, we provide a processing module for a transmitter device configured to provide for generation of a signal comprising at least one frame for transmission by the transmitter device to a receiver device, the processing module configured to: provide for encoding of one or more of a physical layer header and a PSDU with convolutional encoding, the physical layer header defining one or more frame properties, such as the data-rate of one or more parts of the frame or the length of the PSDU. The PSDU may contain arbitrary information to be exchanged between transmitter and receiver devices.

In contrast to that defined in the IEEE standard, a convolutional code with a constraint length, K, of 7 may be used. In a preferred embodiment, generator polynomials G=(133, 171) are used. This notation is an octal representation of the outputs that are used in the encoder to produce 2 code bits for every input bit.

In FIG. 18, a diagrammatic illustration of the encoder 1800 is shown.

In this example, after encoding the PHR, the encoder 1800 is configured to an all-zero state by appending 6 tailbits to the bits of the PHR 312, equal to the number of delay elements of the convolutional encoder 1800. Thus, in one or more examples, the convolutional encoding of the PHR and the PDSU is separated into two, independent convolutionally encoded sections, one for the PHR and one for the PDSU, by the provision of the tailbits.

The termination of the trellis of the encoder provides for an independent decoding of the PHR 312 and the PSDU 313.

Independent decoding of the PHR 312 and PSDU fields 313 means that because of the trellis termination, the Viterbi decoder at a processing module of the receiver device can be reset after the PHR is decoded and no decoder state from the PHR has to be preserved for proper decoding of the PSDU.

The IEEE standard does not specify an operation in which the encoder is forced to the all-zero state, such that independent decoding of PHR and PSDU can only be done at the expense of a poor decoding performance of the PHR. The larger constraint length of the convolutional code 7 (versus K=3 in the IEEE standard) proposed provides a stronger protection than the protection used in the IEEE standard, where the concatenation of Single Error Correction Double Error Detection (SECDED) block-code of length 19 with a constraint length K=3 convolutional code is prescribed. Such a concatenated scheme can be decoded sequentially or as a joint coding scheme. In the sequential scheme, first the convolutional code is decoded by a Viterbi decoder followed by SECDED decoder. Because of a lack of termination, by way of the tailbits, in the encoder after the PHR, the decoding depth of the Viterbi decoder delays the availability of SECDED coded bits to the SECDED decoder. In a joint coding scheme the properties of the convolutional code and the SECDED code are exploited simultaneously leading to optimal decoding performance at the expense of a decoder with state complexity 256.

In one or more examples, the processing module is configured to use a K=7 convolutional code, which requires a decoder with state complexity 64.

Figure 19:
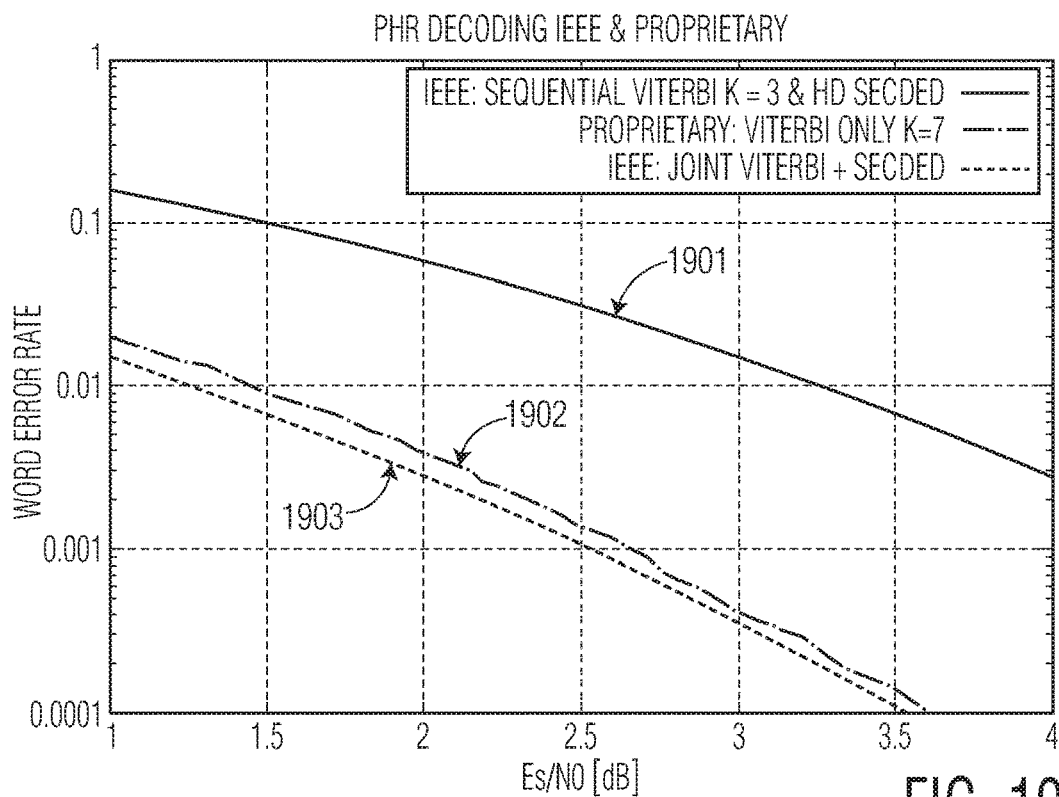
FIG. 19 shows a graph of word error rate versus Es/N0 to compare error correction performance of the convolutional encoding proposed herein and the encoding defined in the IEEE standard.

As an example, the protection of a 13 bits PHR (as used in IEEE standard) using both the IEEE standard schemes and the scheme described above is demonstrated in FIG. 19. FIG. 19 shows word error rate versus Es/N0. Es/N0 is a metric for the SNR. Es represents symbol energy, N0 represents spectral density of the noise and therefore Es/N0 is a measure for the signal-to-noise ratio. Plot 1901 shows the IEEE standard scheme comprising sequential Viterbi with K=3 and HD SECED. Plot 1902 shows the scheme proposed herein comprising Viterbi only with K=7. Plot 1903 shows the IEEE standard scheme of joint Viterbi and SECED. The proprietary PHR protection has a similar protection level as the most advanced standard compliant PHR decoder, while its complexity is only ¼. Moreover, compared to the sequential decoding of the standard scheme an SNR gain of more than 1.5 dB is achieved.

The PSDU is protected with the same K=7 convolutional code. Termination of the encoder with 6 tailbits at the end of the PHR bits takes care that the encoder at the beginning of the PSDU starts in the all-zero state. At the end of the PSDU, the encoder may again be terminated to the all-zero state with 6 tailbits.

Figure 20:
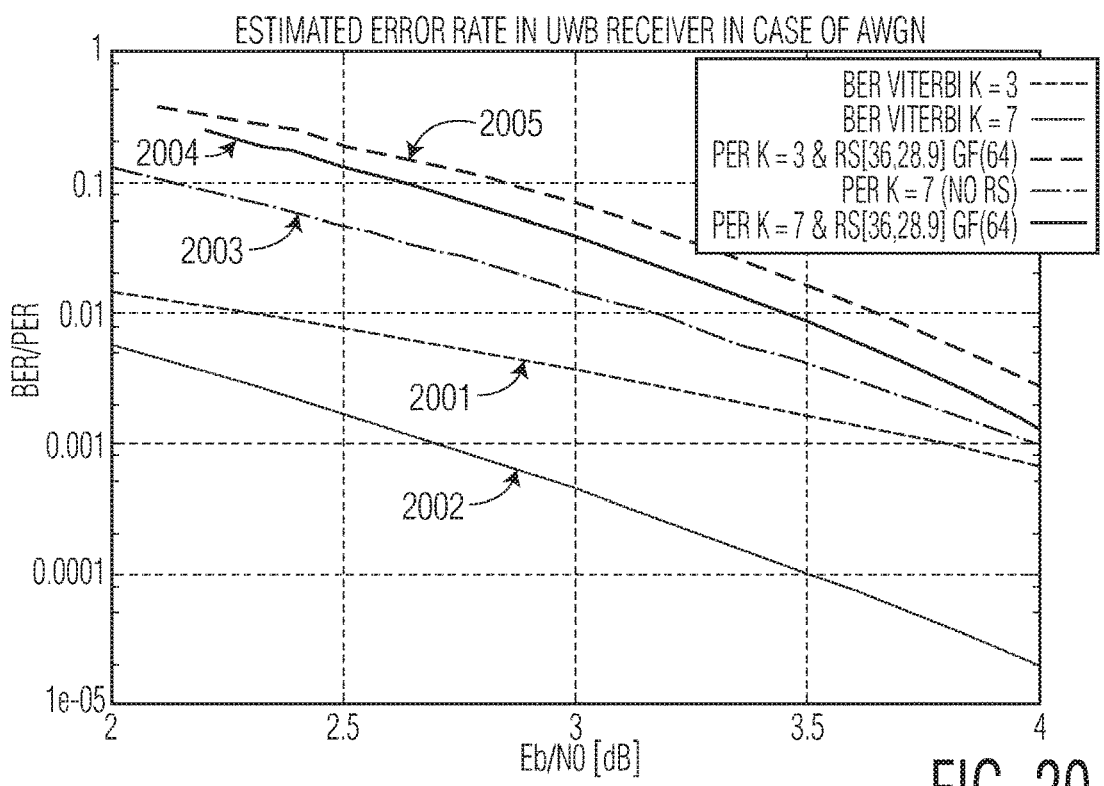
FIG. 20 shows a graph of bit/packet error rate versus Es/N0 to compare error correction performance of the convolutional encoding proposed herein and the encoding defined in the IEEE standard.

In FIG. 20 the performance difference in terms of bit error rate (BER) between the IEEE convolutional code 2001 and the proprietary convolutional code 2002 is shown. Also the performance in terms of packet/frame error rate (PER) is shown in which plot 2003 shows the proposed scheme. Plot 2004 shows the proposed scheme with optional outer encoding (Reed-Solomon) and plot 2005 shows the IEEE standard scheme.

Outer Encoding (Block)

In contrast to the IEEE standard, we propose the use of an optional Reed-Solomon (RS) outer code. For small payloads (e.g. 20 bytes), the K=7 convolutional code described above provides sufficient error correction protection. The use of the optional RS coder may be signalled in the PHR 312. In one or more examples, the RS code used may be as defined in the IEEE standard, i.e. a RS code with parameters [63, 55, 9] over $GF(2^6)$. When the PSDU size exceeds 55 "6-bit" symbols (i.e. 330 bits or 41.25 bytes), several codewords are sent sequentially.

Figure 21:
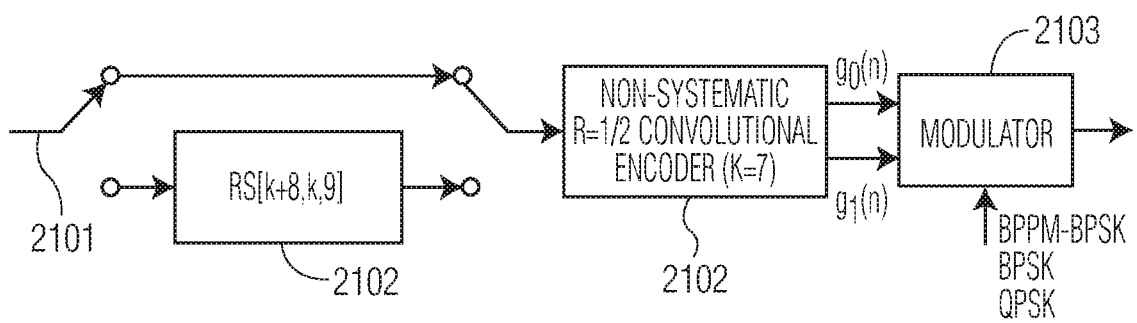
FIG. 21 shows an example diagrammatic depiction of an encoding scheme for bits of a physical layer (PHY) service data unit (PSDU) for containing arbitrary data transferred between the transmitter device and receiver device.

FIG. 21 shows an example of a diagrammatic depiction of the encoding scheme for the PSDU 313. The input bit stream 2101 may be optionally encoded with the Reed-Solomon coding shown at 2102. The parameters of the Reed-Solomon coding may comprise [k+8,k,9]. Thus, K symbols, each consisting of 6 bits are encoded by a Reed-Solomon encoder. The Reed-Solomon encoder adds 8 parity symbols (again each 6 bits). In total the encoder provides a codeword of k+8 symbols. Every different pair of codewords will differ in at least 9 symbol positions, which defines the distance of the code. Accordingly, [k+8,k,9] represents the parameters of a code as [n,k,d]: n being the length of the codewords, k the number of information or payload symbols per codeword and d the minimum distance between 2 different codewords. The stream is then encoded with the convolutional encoder 1800 shown in FIG. 18. The code bits $g_0(n)$ and $g_1(n)$ are modulated with one of BPPM-BPSK, BPSK or QPSK modulation at 2103. The mapping from codebits to modulation symbols is discussed in the subsequent section.

Modulation

After convolutional encoding the processing module for the transmitter may provide for modulation of the coded bits. The processing module may use one of the following three modulation methods:

BPPM-BPSK
BPSK
QPSK

Accordingly, we provide a processing module for a receiver device configured to provide for processing of a signal received by the receiver device from a transmitter device, the processing module configured to:

demodulate the signal, optionally using one of the following modulation methods
BPPM-BPSK
BPSK
QPSK perform convolutional decoding.

The mapping from coded bits at the output of the convolutional encoder 2102 to modulation symbols provided at the output of modulator 2103 may be performed such that Euclidean distance on the channel 203 high, such as above a threshold, or maximized.

The three modulation schemes will now be described in turn.

BPPM-BPSK

With BPPM-BPSK modulation, the convolutional encoding described above provides two code bits $g_0$ and $g_1$ for modulation in to one BPPM-BPSK symbol. In this example, one code bit determines the position of the BPSK symbol and the second code bit determines the phase of the BPSK symbol.

A preferred mapping can be realized by using $(g_0+g_1)$ mod 2, equivalent to $(g_1^{(k)} \oplus g_0^{(k)})$ used in the symbol construction equation, as the position bit and $g_1$ as the polarity bit. With this mapping the Euclidean distance between code sequences may be maximized.

The table below shows the code bits $g_0$ and $g_1$ based on convolutional encoding of each bit of an input bitstream. Based on the code bits the table shows the determination of a position bit and a polarity bit. Based on the position bit and the polarity bit, the table shows the mapping to a BPPM-BPSK symbol comprising a burst of pulses that are modulated using (binary) position and (binary) phase of the magnitude and polarity defined, in which $E_s$ comprises the signal energy of a BPPM-BPSK symbol.

| $g_0$ | $g_1$ | Position bit = $g_0 + g_1$ mod 2 | Polaritybit = $g_1$ | BPPM-BPSK symbol | Euclidean distance |
|---|---|---|---|---|---|
| 0 | 0 | 0 | 0 | $(+\sqrt{E_s}, 0)$ | $2\sqrt{E_s}$ |
| 1 | 1 | 0 | 1 | $(-\sqrt{E_s}, 0)$ | |
| 0 | 1 | 1 | 1 | $(0, -\sqrt{E_s})$ | $2\sqrt{E_s}$ |
| 1 | 0 | 1 | 0 | $(0, \sqrt{E_s})$ | |

In one or more examples, we provide a processing module for a transmitter device configured to provide for generation of a signal comprising at least one frame for transmission by the transmitter device to a receiver device, the processing module configured to provide for modulation of an input bitstream forming at least part of the frame, the processing module configured to;

provide for convolutional encoding of an input bitstream, the convolutional encoding providing for generation of a first code bit $g_0$ and a second code bit $g_1$ for each bit of the input bitstream;

determine a position bit based on the equation $g_0+g_1$ mod 2;
determine a polarity bit based on the second code bit $g_1$;
determine a BPPM-BPSK symbol based on the mapping;

| Position bit | Polarity bit | BPPM-BPSK symbol |
|---|---|---|
| 0 | 0 | $(+\sqrt{E_s}, 0)$ |
| 0 | 1 | $(-\sqrt{E_s}, 0)$ |
| 1 | 1 | $(0, -\sqrt{E_s})$ |
| 1 | 0 | $(0, \sqrt{E_s})$ |

In one or more examples, the convolutional encoding has a constraint length of 7.

In one or more examples, the input bitstream is encoded with a Reed-Solomon code prior to convolutional encoding.

In one or more examples, the input bitstream represents at least part of the frame. In one or more examples, the input bitstream represents arbitrary data to be exchanged between the transmitter device and the receiver device.

In one or more examples, the convolutional encoding is defined as follows;
denoting the input bit stream for encoding with x(n) then first code bit g0(n)=x(n)+x(n−2)+x(n−3)+x(n−5)+x(n−6) mod 2, and second code bit g1(n)=x(n)+x(n−1)+x(n−2)+x(n−3)+x(n−6) mod 2. x(n) being input bit of the input bitstream at time n, having a value 0 or 1.

In one or more examples, we provide a processing module for a receiver device configured to provide for processing of a signal comprising at least one frame received by the receiver device from a transmitter device, the processing module configured to:
provide for identification of BPPM-BPSK symbols in the signal, the BPPM-BPSK symbols selected from $(+\sqrt{E_s}, 0)$, $(-\sqrt{E_s},0)$, $(0, -\sqrt{E_s})$ and $(0, \sqrt{E_s})$;
provide for demodulation of each BPPM-BPSK symbols to obtain two code bits comprising $g_0$ and $g_1$ based on the mapping;

| BPPM-BPSK symbol | g0 | g1 |
|---|---|---|
| $(+\sqrt{E_s}, 0)$ | 0 | 0 |
| $(-\sqrt{E_s}, 0)$ | 0 | 1 |
| $(0, -\sqrt{E_s})$ | 1 | 1 |
| $(0, \sqrt{E_s})$ | 1 | 0 | provide for determination of an output bitstream based on decoding of the code bits based on a convolutional code.

In one or more examples, the convolutional code has a constraint length of 7.

In one or more examples, the processing module is further configured to provide for determination of the output bitstream based on decoding a Reed-Solomon code post decoding the convolutional code.

In one or more examples, the output bitstream represents at least part of the frame. In one or more examples, the output bitstream represents arbitrary data to be exchanged between the transmitter device and the receiver device.

In one or more examples, the code bits g0+g1 may be used to define the position of the burst and the code bits g0 for the polarity.

This mapping may be considered optimum based on a corresponding encoding trellis of the code. It will be appreciated that an encoder trellis is a graphical representation that indicates with arrows which encoder states can be reached as function of the current encoder state and the value of the input bit. Along the arrows one can place labels designating the value of the input bit and the values for the corresponding code bits g0 and g1.

Figure 22:
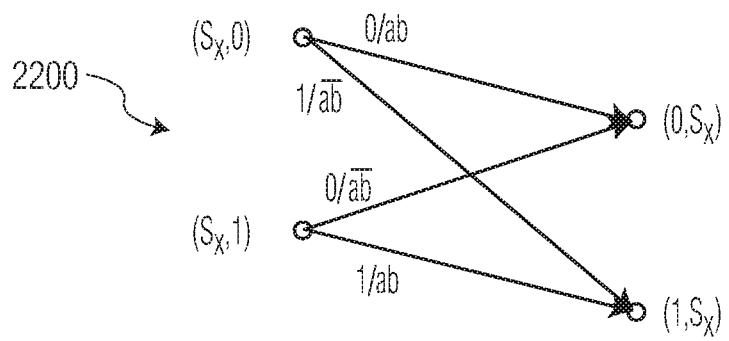
FIG. 22 shows a butterfly section of an encoder/decoder trellis for the proposed encoder.

For the example K=7 encoder, there are 64 states and for each state there are 2 possible information bits: 0 or 1. One trellis section consists of the 64 possible starting states, 2 outgoing edges from each state and 64 next states. A trellis section can be decomposed into 32 butterfly sections. A butterfly section 2200 of the encoder/decoder trellis is shown in FIG. 22. In this drawing $s_x$ represents a 5-tuple of bits and together with 0 or 1 a 6-tuple is formed representing an encoder (based on the six positions labelled "D" to receive the input stream of FIG. 18) or decoder state.

Being in state $(s_x,0)$, the encoder arrives at state $(0,s_x)$ when an input bit with value 0 is provided to the encoder. However, when the encoder is in state $(s_x,1)$ it also ends up in state $(0,s_x)$ when an input bit with value 0 is provided. Hence, in the Viterbi decoder two paths merge in state $(0,s_x)$. Similarly two paths merge in state $(1,s_x)$. Both end states $(0,s_x)$ and $(1,s_x)$ have the same originating states $(s_x,0)$ and $(s_x,1)$. Along the edges in the butterfly, three values are indicated. Before the slash the value of the input bit is shown. After the slash the values of the code bits $g_0$ and $g_1$ are represented by a,b (a,b being 0 or 1). In case the transition from state $(s_x,0)$ to $(0,s_x)$ (input bit should have value 0) leads to code bit with values $g_0$=a and $g_1$=b, the transition from state $(s_x,0)$ to $(1,s_x)$ (input bit should have value 1) should have code bits with values $g_0$=a and $g_1$=b (not a and not b, respectively). Hence the code bits have opposite values compared to the other branch. Similarly, the branches that merge into one state will have opposite code bit values. Since a Viterbi decoder accumulates Euclidean distances and make decisions on base of accumulated distances, it is important to have an as large as possible accumulation of Euclidean distance. With the bit-mapping from code bits to modulation symbols as shown in the table above, the Euclidean distance between two outgoing branches or to merging branches is $2\sqrt{E_s}$. Choosing for the position bit $g_0$, and the polarity bit equal to $g_1$ leads for the same transitions to an Euclidean distance of only $\sqrt{2}\sqrt{E_s}$.

BPSK

In case of BPSK mapping, the code bits $g_0$ and $g_1$ must be distributed over 2 BPSK symbols. In this example, no mapping is required to maximize the Euclidean distance. Code bits $g_0$ can be mapped to the even BSPK symbols and code bits $g_1$ to the odd BPSK symbols.

QPSK

In one or more examples a Gray mapping is used for mapping the code bits $g_0$ and $g_1$ to the QPSK symbols. It should be noted that the constellation points "00" and "11" have maximum Euclidean distance. This also holds for "01" and "10". In that case code bits can be mapped directly on the QPSK symbols.

It may be noted that a non-Gray mapping of QPSK has a similar constellation as a BPPM-BPSK constellation (in-phase corresponds with $1^{st}$ position, quadrature phase corresponds with $2^{nd}$ position).

Figure 23:
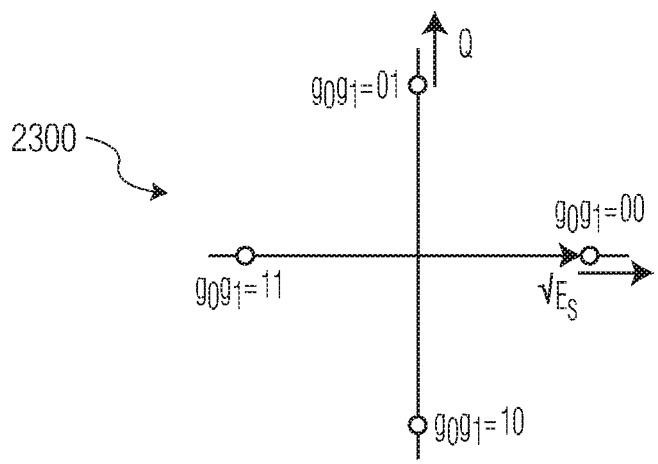
FIG. 23 shows an example QPSK modulation Gray mapping.

FIG. 23 illustrates QPSK modulation Gray mapping 2300, as will be familiar to those skilled in the art, for mapping code bit combinations $g_0g_1$=00, 11, 01 and 10 to I and Q components.

Figure 24:
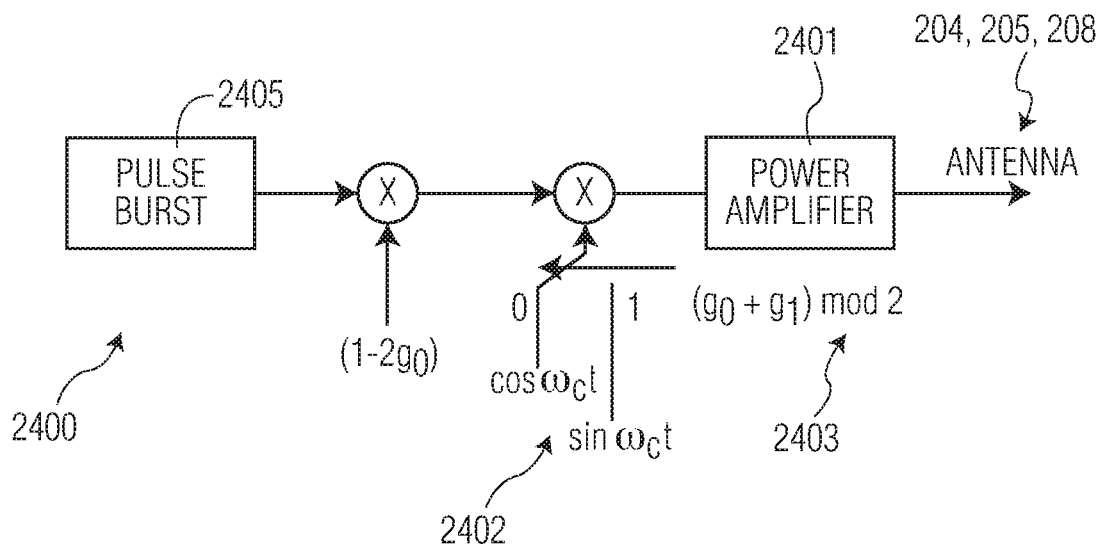
FIG. 24 shows an example semi-full quadrature modulator for QPSK modulation.

Since the modulation is based on bursts of pulses (also termed chips) and that within the burst only BPSK modulation is applied, the QPSK modulation may be realized with a semi-full quadrature modulator 2400, as shown in FIG. 24.

The modulator 2400 receives an input stream 2405 and provides a modulated output to a power amplifier 2401 and on to the antenna 204, 205, 208.

In FIG. 24, the concept of the QPSK modulator is illustrated. The BPSK modulation is realized with a +1/−1 multiplier, where the +/−1 value is derived from the code bit according to the formula (1-2$g_0$). In one or more examples, the selection between the inphase (I, cos $\omega_c$t) carrier and the quadrature carrier (Q, sin $\omega_c$t) is done with a switch 2402 that is controlled by the Boolean $g_0+g_1$ mod 2, labelled 2403. The in phase carrier and the quadrature carrier are different phases of a carrier frequency. In a clock generation unit (not shown) a carrier frequency 4$\omega_c$ is realised and after a frequency divider by 4, 4 phases of the carrier with frequency $\omega_c$ are available. For the QPSK modulator 2400, the 2 phases that have a phase difference of π/2 are selected for modulating the signal to an RF frequency fc ($\omega_c$=2π $f_c$).

Spreading

Dummy Pulse Insertion

A pulse stream comprising a plurality of pulses may be representative of data for transmission as at least part of the at least one frame. Each pulse of the pulse stream may have one of two states comprising a positive polarity and a negative polarity, the polarity of the pulse defining the phase with which a carrier wave is modulated during the pulse for transmission by the transmitter device. The receipt, by the transmitter device, of a pulse stream containing many consecutive pulses of the same polarity may induce a DC offset in the transmitter device.

Accordingly, we disclose a processing module 206, 207 for a transmitter device 201, 202 configured to provide for generation of a signal comprising at least one frame for transmission by the transmitter device to a receiver device, the processing module configured to provide for processing of an input pulse stream 2500, the input pulse stream comprising a stream of pulses e.g. 2501, 2502 representative of data of at least part of the at least one frame, to provide for generation of an output pulse stream for transmitting to the receiver device as part of the signal, each pulse of the pulse streams having one of two states comprising a positive polarity e.g. pulse 2501 and a negative polarity e.g. pulse 2502.

The processing module 206, 207 may be configured to;

divide the input pulse stream into consecutive groups 2503 of pulses, each group of pulses containing the same number of pulses. In this example each group comprises three pulses (those outside the dashed line box).

The processing module 206, 207 may be configured to provide for insertion of a dummy pulse, those pulses in box 2504, for each of the example groups of pulses 2505, 2506, 2507, 2508. In particular, based on determination that the first two or more consecutive pulses of the group have the same polarity (shown in example groups 2505 and 2506) the processing module may be configured to provide for addition of at least one dummy pulse to the group directly after the first two or more consecutive pulses. Accordingly, the dummy pulse is inserted between the 2$^{nd}$ and 3$^{rd}$ pulse of the group of three pulses. Considering the example groups 2505, 2506, the at least one dummy pulse has an opposite polarity to the first two or more consecutive pulses. Thus, in example group 2505 the first two pulses are positive and thus the dummy pulse provided is negative. In example group 2506, the first two pulses are negative and the dummy pulse provided is positive. The output bit stream provided by the processing module therefore includes the consecutive groups of pulses including the added dummy pulses.

For example groups 2507 and 2508, the first two pulses in the group are of an opposite polarity. In case of unequal polarities of the first two pulses, two strategies can be followed.

Strategy 1: To reduce measured peak power as much as possible, the dummy pulse is set to polarity opposite of the pulse preceding it. Thus, the processing module may be configured to provide for addition of at least one dummy pulse to the group directly after the first two or more consecutive pulses, the at least one dummy pulse having a polarity opposite to a final pulse in the first two or more consecutive pulses.

Strategy 2: To reduce DC content in the frame, the dummy pulse can be set opposite of the accumulated DC value (possibly only beyond a certain DC threshold, e.g., 4 pulses offset, following the other strategy otherwise or making the pulse amplitude zero otherwise). Thus, the processing module may be configured to provide for addition of at least one dummy pulse to the group directly after the first two or more consecutive pulses, the at least one dummy pulse having a polarity opposite to an aggregate polarity of all the (three) pulses in the group of pulses, wherein the number of pulses in the group is odd.

While in this example the number of pulses per group is three, the group size could be larger. Accordingly, a different number of consecutive pulses of the same polarity may result in the addition of more than one dummy pulse (consecutively arranged or not).

In one or more examples, all of the groups 2505-2508 have a dummy pulse inserted therein but in some examples, the provision of a dummy pulse may be conditional on the group having two consecutive pulses of the same polarity.

For QPSK modulation, two such bit streams are implemented, each operating across an axis in the complex plane. Thus, the input bit stream may comprise a first input bit stream and a second input bit stream, the first input bit stream representing in-phase components for Quadrature Phase Shift Keying modulation and the second input bit stream representing quadrature-phase components for Quadrature Phase Shift Keying modulation.

Figure 25:
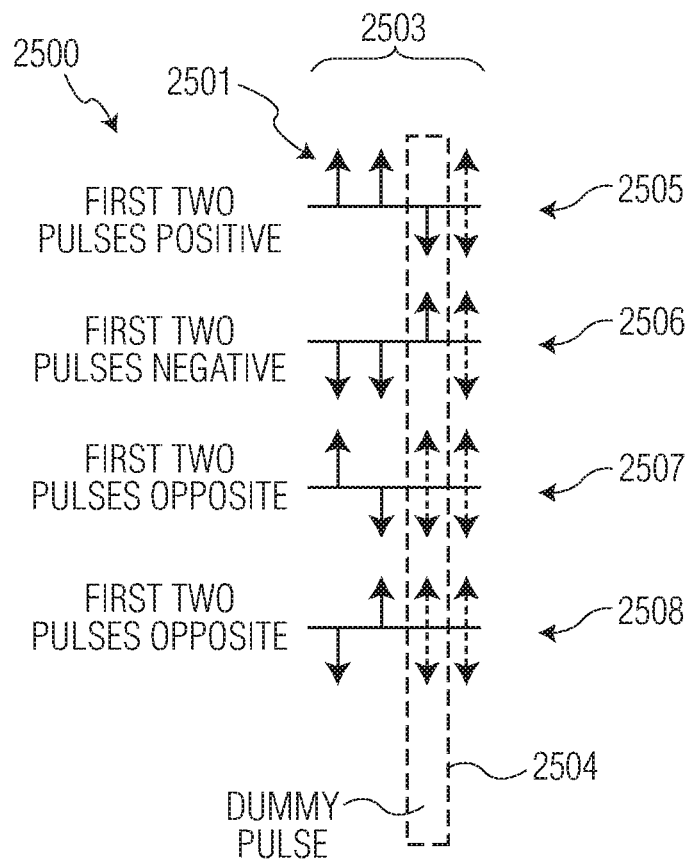
FIG. 25 shows an example of dummy pulse insertion.
Figure 25A:
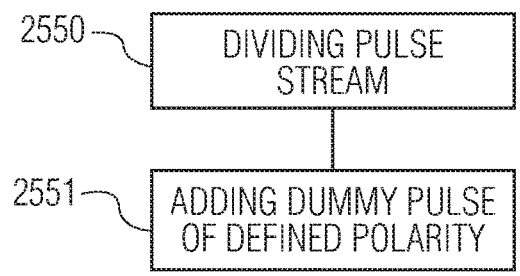
FIG. 25A shows an example of dummy pulse insertion.

With reference to FIG. 25A, we also disclose a method of generation, from an input pulse stream, of an output pulse stream comprising a plurality of pulses for controlling the phase with which a carrier wave is modulated during each pulse for transmission by a transmitter device, the input pulse stream comprising a stream of pulses representative of data of at least part of at least one frame for transmitting as part of a signal by the transmitter device, each pulse of the pulse streams having one of two states comprising a positive polarity and a negative polarity, the polarity of the pulse defining the phase with which the carrier wave is modulated; the method comprising:

a first step 2550 comprising dividing the input pulse stream into consecutive groups of pulses, each group of pulses containing the same number of pulses, where the number of pulses comprises at least three; and a second step 2551, for each group of pulses, based on determination that the first two or more consecutive pulses of the group have the same polarity, providing for addition of at least one dummy pulse to the group directly after the first two or more consecutive pulses, the at least one dummy pulse having an opposite polarity to the first two or more consecutive pulses, the groups of pulses, including the added dummy pulses, comprising the output pulse stream.

The method may be embodied as computer program code for execution by a processing module of the transmitter device. The code may be provided as a firmware or software, such as on a memory of the processing module.

Turning to the receiver device, the dummy pulses may require removal prior to further processing of the bit stream. Accordingly, the processing module at the receiver device may be configured to;

divide the input pulse stream into consecutive groups of pulses, each group of pulses containing the same number of pulses, where the number of pulses comprises at least three and the position of the groups in the input bit stream determined based on predetermined data; and for each group of pulses, based on determination that the first two or more consecutive pulses of the group have the same polarity, provide for discarding of one or more dummy pulses in the group directly after the first two or more consecutive pulses, the at least one dummy pulse having an opposite polarity to the first two or more consecutive pulses, the groups of pulses without the discarded dummy pulse or pulses comprising the output pulse stream.

The positioning of the groups within the bit stream obtained from the signal may be:

i) agreed in advance of the signal being received by the receiver device; or ii) determined from information in a header field of the at least one frame 300.

Polarities of non-dummy pulses may be generated from a non-repeating sequence of pulses, such as generated from a CSPRNG.

For bursts of length 3 using rectangular pulses and peak PRF of 499.2 MHz, the provision of a dummy pulse at position 2 in the group may reduce measured peak power acc. FCC/ETSI by ~5 dB as compared to an IEEE-compliant burst of $N_{cpb}$=2, while adding only ~1.8 dB average power. These numbers vary with burst length and number of dummy pulses per burst, peak PRF, and somewhat with pulse shape.

For longer bursts, multiple peak power "cancellation blocks" of multiple consecutive dummy pulses may be inserted in between the pulses containing the payload.

As the polarities of the dummy pulses only depend on previous data and are not used for distance bounding purposes in the receiver, they cannot be exploited by an attacker to mount an EDLC attack.

Figure 26:
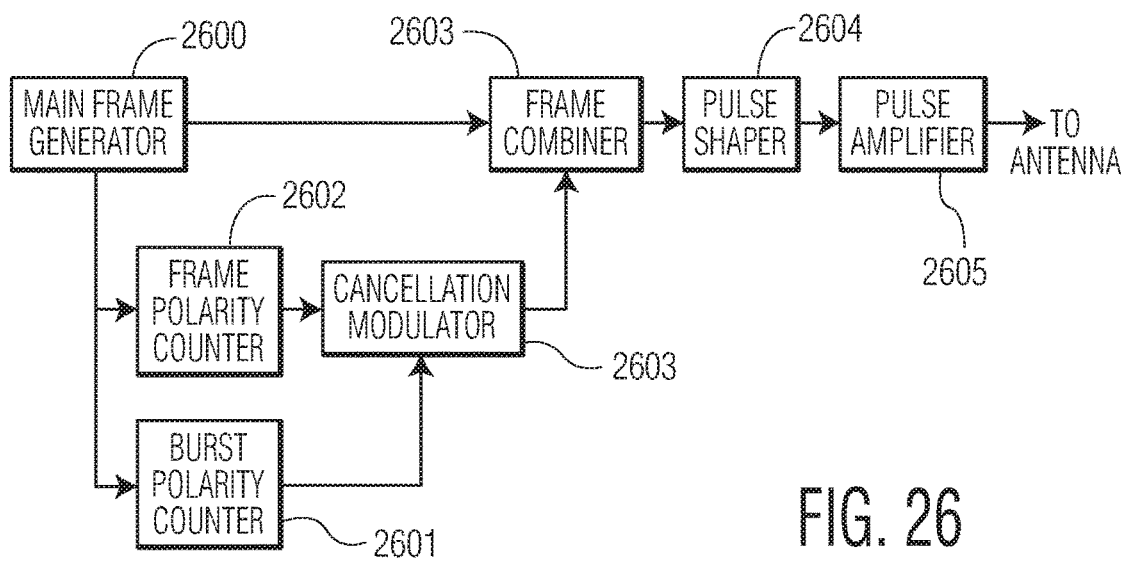
FIG. 26 shows an example block diagram illustrating the process for dummy pulse insertion.

FIG. 26 shows a block diagram of the processing module for insertion of dummy pulses. In particular, the input bitstream may be provided by main frame generator 2600. A burst polarity counter 2601 may be configured to keep a tally of the polarity of consecutive pulses and a frame polarity counter 2602 to keep a tally of the aggregate polarity of a group. It will be appreciated that depending on the strategy applied, only one of the counters 2601, 2602 may be present. Accordingly, a cancellation modulator 2603 may be configured to determine the dummy pulses to be inserted. The output bit stream may be created by the frame combiner 2604 by inserting the dummy pulses into the original groups of the input bitstream. A pulse shaper 2604 may then determine the shape of the pulses based on the output bitstream which may then be provided to a power amplifier 2605 for transmitting.

Symbol Construction

In one or more examples, the following techniques for symbol construction are provided.

The data symbol duration $T_{dsym}$ ranges from 4 to 4096 chips (i.e., $T_{dsym}=T_c*2^{(N+2)}$, where N=0, 1, . . . , 10 and $T_c$ comprises the chip duration time. Tc=1/499.2 MHz):

4 chips/symbol=symbol rate 124.8 MHz
  data rate BPPM-BPSK, BPSK-with-FEC, & QPSK ~110 Mbit/s
  data rate BPSK-without-FEC 124.8 Mbit/s
4096 chips/symbol=symbol rate 121.875 kHz
  data rate BPPM-BPSK, BPSK-with-FEC, & QPSK ~110 kbit/s
  data rate BPSK-without-FEC 121.875 kbit/s A random number generator, such as a CSRNG, produces a stream of bits $s_n \in \{0,1\}$, n=0, 1, . . . , $N_{bits}$-1 related to number of transmitted data octets, data rate, modulation scheme, and PRF. $N_{bits}$ is equal to $N_{octets}*8*(N_{cpb}+\log_2(N_{hop}))*4^{d_{sub}}$. In case more bits are produced by the AES encoder, the unused bits at the end of the stream are discarded and not made available for any purpose whatsoever.

The stream of bits $s_n$ is then modulated according to the data stream from a Forward Error Correction (FEC) encoder $g_{\{0,1\}}^{(k)} \in \{0,1\}$, k=0, 1, . . . , $8*N_{octets}$-1 into a stream of output chips which is described in the time domain as follows.

In case of BPSK-only modulation, only one bit can be encoded per symbol, so the default mode of operation is uncoded, directly using the incoming data bits, possibly in combination with error-tolerant crypto on the receiver side. FEC may be supported in BPSK-only mode with use of subsymbols.

Figure 27:
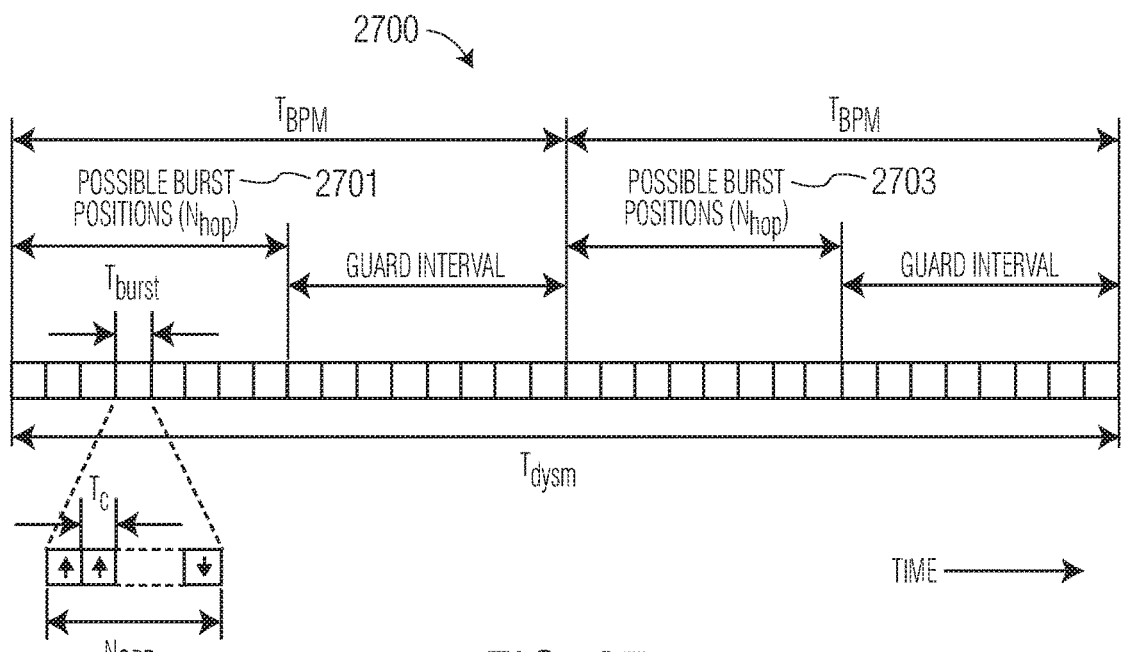
FIG. 27 shows the format of a BPPM-BPSK symbol according to the IEEE standard.

FIG. 27 shows the format of a BPPM-BPSK symbol 2700 according to the IEEE standard. A burst of pulses is either present in the first 2701 or the third part 2703 of the symbol (this modulates the first bit), on top of that the burst is BPSK modulated (second bit). In order to facilitate spectrum shaping, hopping of the burst is applied in the first and third parts 2701, 2703 of the symbol 2700 (depending on whether the burst is in the first or third part). In which of the $N_{hop}$ positions 2701, 2703 the burst is placed is determined by a predetermined "PRN" sequence.

BPPM-BPSK

For BPPM-BPSK (62.4 MHz nominal mean PRF and δL=1) the symbols, in one or more examples, are modulated by default as follows:

$$x^{(k)}(t) = [1 - 2 \cdot g_1^{(k)}] \cdot \sum_{n=0}^{N_{cpb}-1} [1 - 2 \cdot m^{(k)}(n)] \cdot p(t - (g_1^{(k)} \oplus g_0^{(k)}) \cdot T_{BPM} - h^{(k)} \cdot T_{burst} - n \cdot \delta L \cdot T_c).$$

In this mode, the number of hopping positions $N_{hop}$ is defined as $T_{dsym}/(4*T_{burst})$. The symbol, in terms of available chip positions and time, is shown in FIG. 27. A pulse burst can be placed in one of the $N_{hop}$ possible burst positions 2701, 2703. Hopping is already part of the IEEE standard and its purpose is to reduce the presence of spurs in the frequency domain representation of the signal. It will be appreciated that hopping the burst is a provision for taking care that the transmitted signal has proper spectral properties to avoid spectral spurs.

BPSK

For BPSK without FEC (124.8 MHz nominal mean PRF and δL={1,2}) the symbols, in one or more examples, are modulated by default as follows:

$$x^{(k)}(t) = [1 - 2 \cdot d^{(k)}] \cdot \sum_{n=0}^{N_{cpb}-1} [1 - 2 \cdot m^{(k)}(n)] \cdot p(t - h^{(k)} \cdot T_{burst} - n \cdot \delta L \cdot T_c).$$

Figure 28:
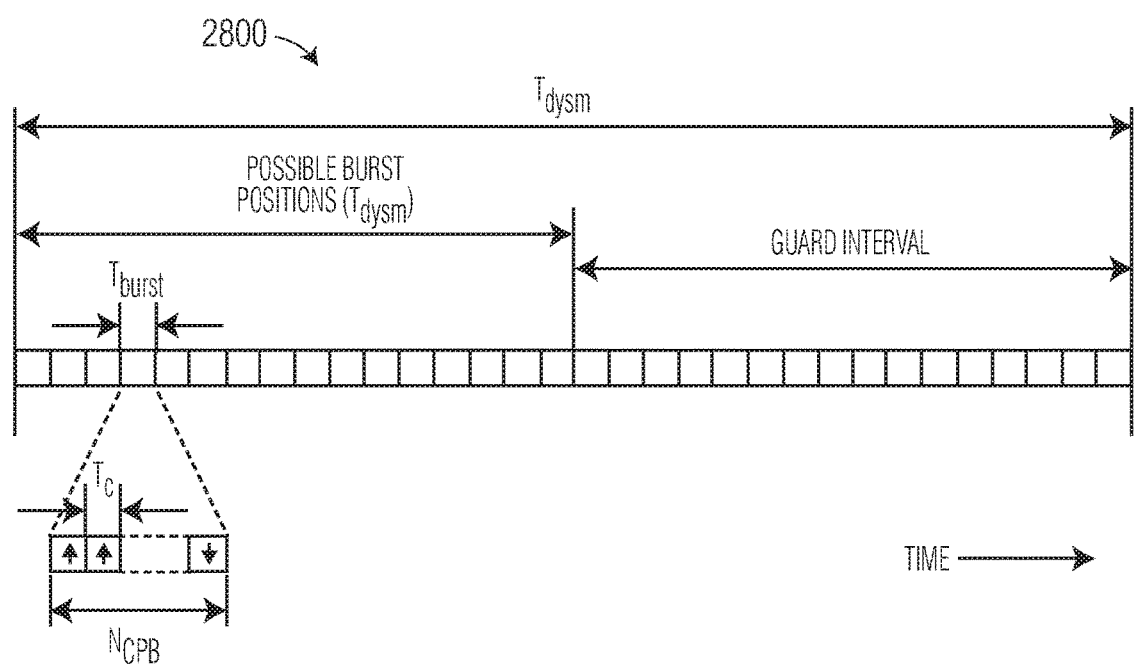
FIG. 28 shows an example format of a BPSK symbol in which no position modulation is applied, only BPSK modulation.

In this mode, the number of hopping positions $N_{hop}$ is defined as $T_{dsym}/(2*T_{burst})$. Note that $T_{burst}$ is proportional to $\delta L$ and therefore larger $\delta L$ directly reduces the number of available hopping positions. Note that the data stream $d^{(k)}$ is modulated directly onto the symbols without FEC. The symbol 2800, in terms of available chip positions and time, is shown in FIG. 28.

For BPSK with FEC (124.8 MHz nominal mean PRF and $\delta L=\{1,2\}$) the symbols are modulated by default into two subsymbols as follows:

$$x^{(k)}(t) = \begin{cases} [1 - 2 \cdot g_0^{(\lfloor k/2 \rfloor)}] \cdot \sum_{n=0}^{N_{cpb}-1} [1 - 2 \cdot m^{(k)}(n)] \cdot p(t - h^{(k)} \cdot T_{burst} - n \cdot \delta L \cdot T_c) \text{ for } k \text{ is even,} \\ [1 - 2 \cdot g_1^{(\lfloor k/2 \rfloor)}] \cdot \sum_{n=0}^{N_{cpb}-1} [1 - 2 \cdot m^{(k)}(n)] \cdot p(t - h^{(k)} \cdot T_{burst} - n \cdot \delta L \cdot T_c) \text{ for } k \text{ is odd.} \end{cases}$$

In this mode, the number of hopping positions $N_{hop}$ is defined as $T_{dsubsym}/(2*T_{burst})$. Note that $T_{burst}$ is proportional to $\delta L$ and therefore larger $\delta L$ directly reduces the number of available hopping positions. The subsymbol definition is otherwise similar to the subsymbol definitions below.

QPSK

For QPSK (62.4 MHz nominal mean PRF and $\delta L=2$) the symbols, in one or more examples, are modulated by default as follows:

$$x^{(k)}(t) = [1 - 2 \cdot g_1^{(k)}] \cdot j^{(g_1^{(k)} \oplus g_0^{(k)})} \cdot \sum_{n=0}^{N_{cpb}-1} [1 - 2 \cdot m^{(k)}(n)] \cdot p(t - h^{(k)} \cdot T_{burst} - n \cdot \delta L \cdot T_c).$$

The intended constellation is precisely along the I and Q axes of the modulator, resulting in the constellation diagram of FIG. 23.

In this mode, the number of hopping positions $N_{hop}$ is defined as $T_{dsym}/(2*T_{burst})$. The symbol timing diagram is the same as for BPSK.

Cryptographically Secure Random Number Generator (CSPRNG)

In one or more examples, the transmitter device and the receiver device 206, 207 may include a Cryptographically Secure Random Number Generator. The CSPRNG may be used for spreading of the STS 308, PHR 312 and PSDU 313. In one or more examples a NIST SP 800-90A based CSPRNG is used.

The core of the CSPRNG is an AES128 encryption unit which creates 128 bit blocks of pseudo-random numbers. Before ranging starts, all communicating devices (transmitter device and receiver device 201, 202) need to agree on a common 256 bit seed comprising an example of secure information that may be used to generate a secure training sequence (key and data of the AES core). This agreement is handled by a higher level protocol and is not part of the operation of the CSPRNG block itself.

General Definitions

Note that the three equations above describe the time-continuous pulse shape p(t) placed in the correct chip positions and phase modulated for each chip position of length $T_c$. For BPPM-BPSK and BPSK the pulse shape is multiplied with $\{-1,0,1\}$ for each chip position, while for QPSK (requiring a complex modulator) the pulse shape is multiplied with $\{-1,-j,0,j,1\}$ for each chip position.

For $N_{hop}=1$, $h^{(k)}$ is an empty set, but for $N_{hop}>1$, the hopping sequence $h^{(i)} \in \{0,1, \ldots, N_{hop}-1\}$ is a subset of $s_n$ defined as:

$$h^{(k)} = \sum_{n=0}^{\log_2(N_{hop})-1} 2^n \cdot s_{n+k \cdot (N_{cpb}+\log_2(N_{hop}))}.$$

The equation shows that a group of bits is selected from $s_n$ to encode, in LSB-first binary way, the hopping positions used for each transmitted symbol k.

In all cases, the scrambling sequence $m^{(k)}(n) \in \{0,1\}$, $k=0, 1, \ldots, 8*N_{octets}-1$, $n=0, 1, \ldots, N_{cpb}-1$ is a subset of $s_n$ defined as:

$$m^{(k)}(n) = s_{n+\log_2(N_{hop})+k \cdot (N_{cpb}+\log_2(N_{hop}))}.$$

The equation shows that bits are reserved to encode both the scrambling sequence and the hopping position used for each transmitted symbol k, and also grouped per symbol k. It should be noted that the scrambling sequence is encoded in $s_n$ after the hopping position.

$T_{burst}$ is defined as:

$$T_{burst} = N_{cpb} \cdot \delta L \cdot T_c.$$

Note that according to this definition, the empty ($\delta L-1$) chips following the last active pulse in a burst are considered to be part of the burst.

Dummy Pulses

For dummy pulse generation, no additional random bits, such as generated by a CSRNG, are needed, as pulse polarities may be purely determined by the polarities of preceding pulses.

An example is given for QPSK modulation with parameters $N_{cps}=4$, symbol rate=31.2 MHz, $T_{d,sym}=32$ ns. In this example, the number of pulses per burst before addition of dummy pulses is equal to 2, with spacing $\delta L$ equal to 2 (i.e., there is always 1 gap chip in between the two pulses within a burst). The symbol construction without dummy pulses then looks as follows, where we have already filled in numerical values fo $N_{cpb}$ and $\delta L$:

$$x^{(k)}(t) = [1-2 \cdot g_1^{(k)}] \cdot j^{(g_1^{(k)} \oplus g_0^{(k)})} \cdot \sum_{n=0}^{1} [1-2 \cdot m^{(k)}(n)] \cdot p(t-h^{(k)} \cdot T_{burst} - n \cdot 2 \cdot T_c).$$

To this symbol pattern we add the following dummy pulse pattern $x_d^{(k)}(t)$:

$$x_d^{(k)}(t) = [1-2 \cdot g_1^{(k)}] \cdot j^{(g_1^{(k)} \oplus g_0^{(k)})} \cdot [2 \cdot m^{(k)}(0)-1] \cdot p(t-h^{(k)} \cdot T_{burst} - 1 \cdot T_c).$$

This pattern is essentially a copy of the pulse pattern at n=0, but reversed in sign and moved ahead in time by $1 \cdot T_c$, which puts it precisely inside the gaps between the n=0 and n=1 pulses. When the overall frame, assuming $T_c$ equal to 1/(499.2 MHz), is then evaluated using a 50 MHz RBW peak power measurement filter according to ETSI or FCC, the ratio of measured peak power to pulse amplitude will have decreased as a result. For short frames, this fact may increase the available useful link budget, without introducing an EDLC vulnerability (provided the receiver ignores the dummy pulses).

This general idea can be extended to different burst designs and optional inclusion of DC cancellation.

Subsymbols

An example definition of subsymbols is provided. Symbol are divided into $4^{d_{sub}}$ subsymbols, where $d_{sub}$ is a 2 bits LSB-first encoded number of the set $\{0,1,2,3\}$, where the default value 0 indicates that the subsymbol is equal to the symbol (i.e., no further subdivision). Combinations of modulation parameters and division into subsymbols, that would result in $N_{hop} < 1$ per subsymbol, are forbidden. Symbol timing diagrams show basically a concatenation of subsymbols into one overall symbol, as shown in the example for BPSK (without FEC) and QPSK below.

Figure 31:
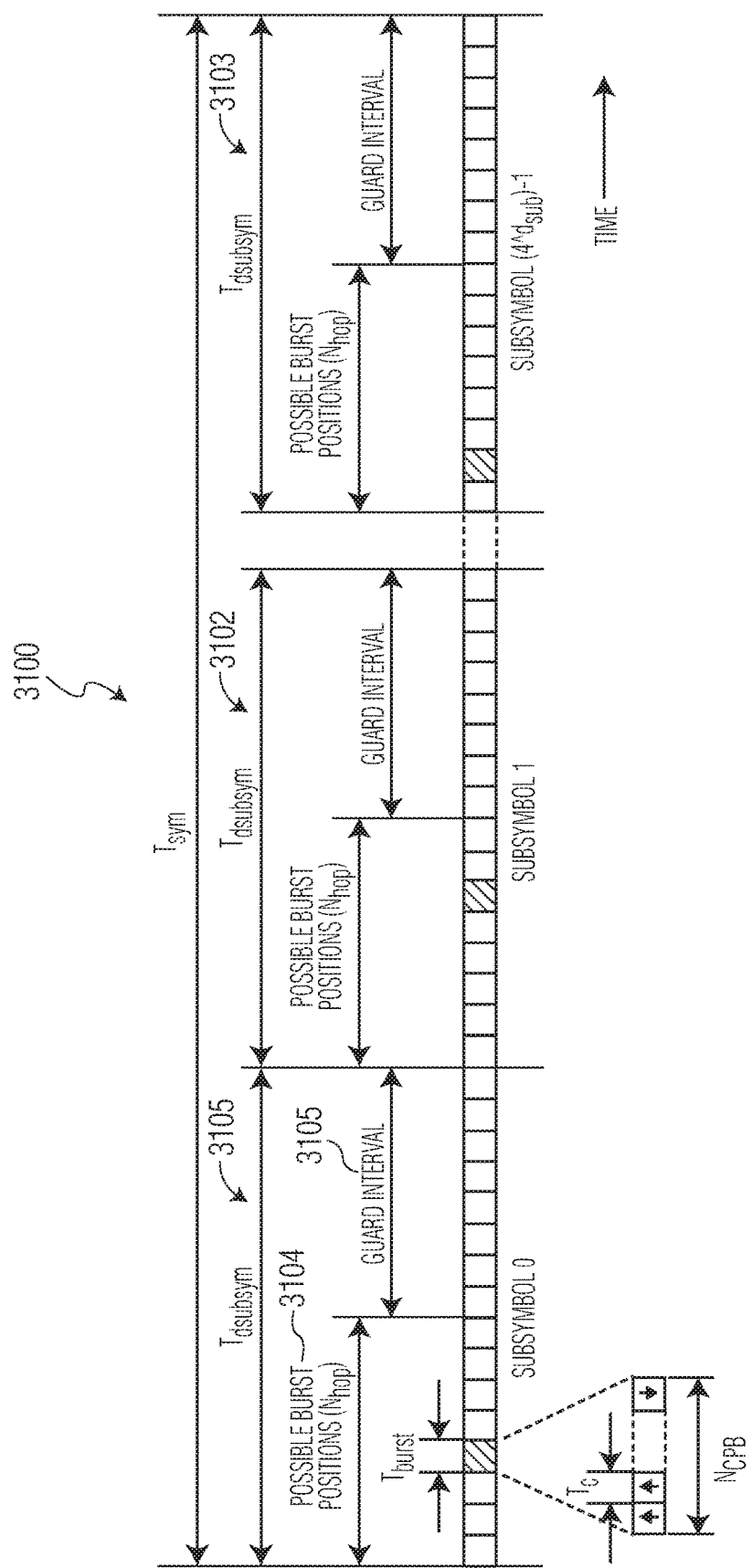
FIG. 31 shows an example configuration of symbols divided into subsymbols.

FIG. 31 shows a symbol 3100 divided into a plurality of subsymbols 3101, 3102, 3103. Each subsymbol 3101, 3102, 3103 comprises a possible burst position 3104 and a guard interval 3105.

BPPM-BPSK Sub-Symbols

For BPPM-BPSK (62.4 MHz nominal mean PRF and $\delta L=1$) the subsymbols are modulated as follows:

$$x^{(k)}(t) = \left[1 - 2 \cdot g_1^{(\lfloor k/4^{\wedge}d_{sub} \rfloor)}\right] \cdot \sum_{n=0}^{N_{cpb}-1} [1 - 2 \cdot m^{(k)}(n)] \cdot$$

$$p\left(t - \left(g_1^{(\lfloor k/4^{\wedge}d_{sub} \rfloor)} \oplus g_0^{(\lfloor k/4^{\wedge}d_{sub} \rfloor)}\right) \cdot T_{BPM} - h^{(k)} \cdot T_{burst} - n \cdot \delta L \cdot T_c\right).$$

BPSK Sub-Symbols

For BPSK without FEC (124.8 MHz nominal mean PRF and $\delta L=\{1,2\}$) the subsymbols are modulated as follows:

$$x^{(k)}(t) = \left[1 - 2 \cdot d^{(\lfloor k/4^{\wedge}d_{sub} \rfloor)}\right] \cdot$$

$$\sum_{n=0}^{N_{cpb}-1} [1 - 2 \cdot m^{(k)}(n)] \cdot p(t - h^{(k)} \cdot T_{burst} - n \cdot \delta L \cdot T_c).$$

In this mode, the number of hopping positions $N_{hop}$ is defined as $T_{dsubsym}/(2 \cdot T_{burst})$. Note that $T_{burst}$ is proportional to $\delta L$ and therefore larger $\delta L$ directly reduces the number of available hopping positions. Note that the data stream $d^{(k)}$ is modulated directly onto the symbols without FEC.

For BPSK with FEC (124.8 MHz nominal mean PRF and $\delta L=\{1,2\}$) the symbols are modulated by default into $2 \cdot 4^{d_{sub}}$ subsymbols as follows:

$$x^{(k)}(t) =$$

$$\begin{cases} \left[1 - 2 \cdot g_0^{(\lfloor k/2 \cdot 4d_{sub} \rfloor)}\right] \cdot \sum_{n=0}^{N_{cpb}-1} [1 - 2 \cdot m^{(k)}(n)] \cdot p(t - h^{(k)} \cdot T_{burst} - n \cdot \delta L \cdot T_c) \\ \qquad \text{for } \lfloor k/4^{d_{sub}} \rfloor \text{ is even,} \\ \left[1 - 2 \cdot g_1^{(\lfloor k/2 \cdot 4d_{sub} \rfloor)}\right] \cdot \sum_{n=0}^{N_{cpb}-1} [1 - 2 \cdot m^{(k)}(n)] \cdot p(t - h^{(k)} \cdot T_{burst} - n \cdot \delta L \cdot T_c) \\ \qquad \text{for } \lfloor k/4^{d_{sub}} \rfloor \text{ is odd.} \end{cases}$$

In this mode, the number of hopping positions $N_{hop}$ is defined as $T_{dsubsym}/(2 \cdot T_{burst})$. Note that $T_{burst}$ is proportional to $\delta L$ and therefore larger $\delta L$ directly reduces the number of available hopping positions.

QPSK Sub-Symbols

For QPSK (62.4 MHz nominal mean PRF and $\delta L=2$) the subsymbols are modulated as follows:

$$x^{(k)}(t) = \left[1 - 2 \cdot g_0^{(\lfloor k/4^{\wedge}d_{sub} \rfloor)}\right] \cdot j^{\left(g_1^{(\lfloor k/4^{\wedge}d_{sub} \rfloor)} \oplus g_0^{(\lfloor k/4^{\wedge}d_{sub} \rfloor)}\right)} \cdot$$

$$\sum_{n=0}^{N_{cpb}-1} [1 - 2 \cdot m^{(k)}(n)] \cdot p(t - h^{(k)} \cdot T_{burst} - n \cdot \delta L \cdot T_c).$$

Default values for $d_{sub}$ are given in the tables below, with timings related to a nominal chip rate of 499.2 MHz (the chip rate here chosen equal to the one in the IEEE standard). $T_{guard}$ denotes the length of the guard interval, as labelled in the symbol timing diagrams.

| | | BPPM-BPSK ($\delta L$ = 1) | | | | |
|---|---|---|---|---|---|---|
| $N_{cps}$ | sym_rate [Hz] | $T_{d, sym}$ [s] | $d_{sub}$ | $T_{d, subsym}$ [s] | $T_{guard}$ [s] | Mean PRF [Hz] |
| 4 | 124.80E+6 | 8.01E−9 | 0 | 8.01E−9 | 2.00E−9 | 124.80E+6 |
| 8 | 62.40E+6 | 16.03E−9 | 0 | 16.03E−9 | 4.01E−9 | 62.40E+6 |
| 16 | 31.20E+6 | 32.05E−9 | 0 | 32.05E−9 | 8.01E−9 | 62.40E+6 |
| 32 | 15.60E+6 | 64.10E−9 | 0 | 64.10E−9 | 16.03E−9 | 62.40E+6 |
| 64 | 7.80E+6 | 128.21E−9 | 0 | 128.21E−9 | 32.05E−9 | 62.40E+6 |
| 128 | 3.90E+6 | 256.41E−9 | 0 | 256.41E−9 | 64.10E−9 | 62.40E+6 |
| 256 | 1.95E+6 | 512.82E−9 | 0 | 512.82E−9 | 128.21E−9 | 62.40E+6 |
| 512 | 975.00E+3 | 1.03E−6 | 0 | 1.03E−6 | 256.41E−9 | 62.40E+6 |
| 1024 | 487.50E+3 | 2.05E−6 | 1 | 512.82E−9 | 128.21E−9 | 62.40E+6 |
| 2048 | 243.75E+3 | 4.10E−6 | 1 | 1.03E−6 | 256.41E−9 | 62.40E+6 |
| 4096 | 121.88E+3 | 8.21E−6 | 2 | 512.82E−9 | 128.21E−9 | 62.40E+6 |

| | | | BPSK ($\delta L = \{1, 2\}$) | | | |
|---|---|---|---|---|---|---|
| $N_{cps}$ | sym_rate [Hz] | $T_{d, sym}$ [s] | $d_{sub}$ | $T_{d, subsym}$ [s] | $T_{guard}$ [s] | Mean PRF [Hz] |
| 4 | 124.80E+6 | 8.01E−9 | 0 | 4.01E−9 | 2.00E−9 | 249.60E+6 |
| 8 | 62.40E+6 | 16.03E−9 | 0 | 8.01E−9 | 4.01E−9 | 124.80E+6 |
| 16 | 31.20E+6 | 32.05E−9 | 0 | 16.03E−9 | 8.01E−9 | 124.80E+6 |
| 32 | 15.60E+6 | 64.10E−9 | 0 | 32.05E−9 | 16.03E−9 | 124.80E+6 |
| 64 | 7.80E+6 | 128.21E−9 | 0 | 64.10E−9 | 32.05E−9 | 124.80E+6 |
| 128 | 3.90E+6 | 256.41E−9 | 0 | 128.21E−9 | 64.10E−9 | 124.80E+6 |
| 256 | 1.95E+6 | 512.82E−9 | 0 | 256.41E−9 | 128.21E−9 | 124.80E+6 |
| 512 | 975.00E+3 | 1.03E−6 | 0 | 512.82E−9 | 256.41E−9 | 124.80E+6 |
| 1024 | 487.50E+3 | 2.05E−6 | 1 | 256.41E−9 | 128.21E−9 | 124.80E+6 |
| 2048 | 243.75E+3 | 4.10E−6 | 1 | 512.82E−9 | 256.41E−9 | 124.80E+6 |
| 4096 | 121.88E+3 | 8.21E−6 | 2 | 256.41E−9 | 128.21E−9 | 124.80E+6 |

| | | | QPSK ($\delta L = 2$) | | | |
|---|---|---|---|---|---|---|
| $N_{cps}$ | sym_rate [Hz] | $T_{d, sym}$ [s] | $d_{sub}$ | $T_{d, subsym}$ [s] | $T_{guard}$ [s] | Mean PRF [Hz] |
| 4 | 124.80E+6 | 8.01E−9 | 0 | 8.01E−9 | 4.01E−9 | 124.80E+6 |
| 8 | 62.40E+6 | 16.03E−9 | 0 | 16.03E−9 | 8.01E−9 | 62.40E+6 |
| 16 | 31.20E+6 | 32.05E−9 | 0 | 32.05E−9 | 16.03E−9 | 62.40E+6 |
| 32 | 15.60E+6 | 64.10E−9 | 0 | 64.10E−9 | 32.05E−9 | 62.40E+6 |
| 64 | 7.80E+6 | 128.21E−9 | 0 | 128.21E−9 | 64.10E−9 | 62.40E+6 |
| 128 | 3.90E+6 | 256.41E−9 | 0 | 256.41E−9 | 128.21E−9 | 62.40E+6 |
| 256 | 1.95E+6 | 512.82E−9 | 0 | 512.82E−9 | 256.41E−9 | 62.40E+6 |
| 512 | 975.00E+3 | 1.03E−6 | 1 | 256.41E−9 | 128.21E−9 | 62.40E+6 |
| 1024 | 487.50E+3 | 2.05E−6 | 1 | 512.82E−9 | 256.41E−9 | 62.40E+6 |
| 2048 | 243.75E+3 | 4.10E−6 | 2 | 256.41E−9 | 128.21E−9 | 62.40E+6 |
| 4096 | 121.88E+3 | 8.21E−6 | 2 | 512.82E−9 | 256.41E−9 | 62.40E+6 |

The advantage of the use of subsymbols becomes clear in a direct comparison with the IEEE standard for BPPM-BPSK, as shown in the table below. Here we see that for the range of symbol rates supported in the IEEE standard at Mean PRF=62.4 MHz, the proposed format offers finer symbol rate granularity as well as avoiding that the number of pulses per burst ($N_{ppb}$) exceeds 64.

| $N_{cps}$ | sym_rate [Hz] | Mean PRF [Hz] | $d_{sub}$ | $N_{ppb}$ proposed | $N_{ppb}$ in IEEE |
|---|---|---|---|---|---|
| 16 | 31.20E+6 | 62.40E+6 | 0 | 2 | 2 |
| 32 | 15.60E+6 | 62.40E+6 | 0 | 4 | N/A |
| 64 | 7.80E+6 | 62.40E+6 | 0 | 8 | 8 |
| 128 | 3.90E+6 | 62.40E+6 | 0 | 16 | N/A |
| 256 | 1.95E+6 | 62.40E+6 | 0 | 32 | N/A |
| 512 | 975.00E+3 | 62.40E+6 | 0 | 64 | 64 |
| 1024 | 487.50E+3 | 62.40E+6 | 1 | 32 | N/A |
| 2048 | 243.75E+3 | 62.40E+6 | 1 | 64 | N/A |
| 4096 | 121.88E+3 | 62.40E+6 | 2 | 32 | 512 |

Novel Protocol to Exchange the Secure Preamble Seed with Minimal Overhead

For a secure ranging measurement, based on a secure training sequence it is a prerequisite, that only the genuine sender as well as the intended recipient know the secure information (i.e. seed) to generate corresponding secure training sequence. In one or more examples, a different secure training sequence needs to be used for every frame. This implies a significant protocol overhead.

In one or more examples, an AES based cryptographically secure random number generator (CSRNG) is utilised for generation of the secure training sequence. The CSRNG seed, comprising the secure information from which a secure training sequence may be generated comprises, in one or more examples, a key plus a counter value. A challenge response scheme may be utilised to exchange the key plus the initial counter value at the beginning of a ranging protocol. For all subsequent ranging frames the CSRNG sequence is extended over multiple frames. In one or more other examples, the processing modules of transmitter and receiver may be configured to reuse the same key for each secure training sequence required and for every new frame to increment only the counter value by a fixed, agreed, amount.

Figure 29:
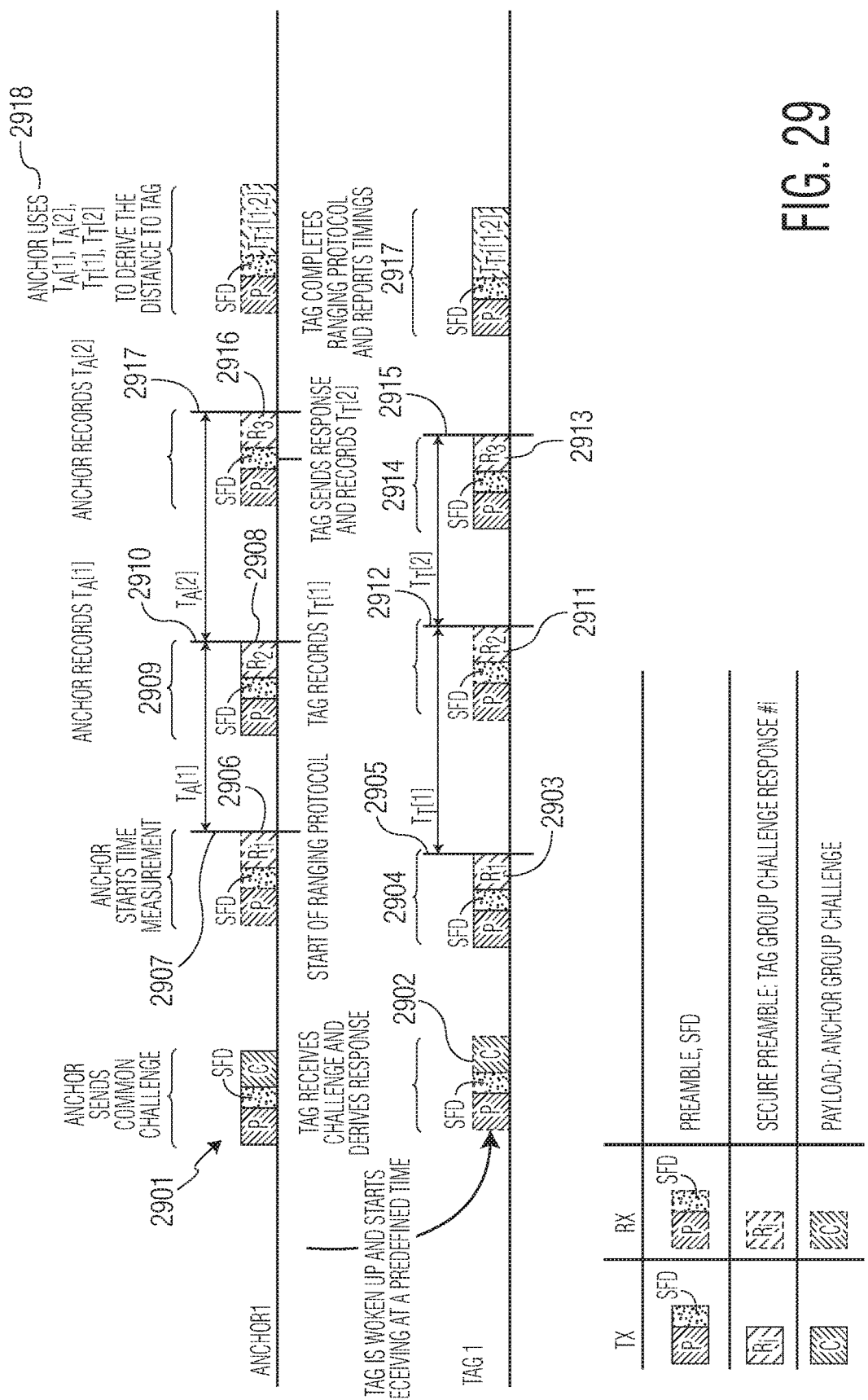
FIG. 29 shows an example illustration for ranging between a first device comprising a tag and a second device comprising an anchor.

FIG. 29 shows an exemplary protocol exchange, for a so called double sided ranging sequence. In the example, one of the transmitter/receiver devices 201, 202 is termed an anchor (labelled anchor1 in FIG. 29) or "lock device" as it is typically mounted with a secured element (such as a vehicle or building) that is unlocked by completion of the protocol. The other of the transmitter/receiver devices 201, 202 is termed a tag (labelled tag1 in FIG. 29) or "key device" as it is typically a mobile device used to unlock the secured element. The term "secure preamble" where used refers to the secure training sequence described above.

The following procedure is executed:
1. The anchor
   a. derives a cryptographic challenge using a random number and his cryptographic key
   b. sends an UWB frame 2901 with the cryptographic challenge in the payload
2. The tag
   a. receives the challenge at 2902 and uses his cryptographic key to derive a cryptographic response using a cryptographic algorithm (AES 128 for example) (i.e. the tag effectively uses the cryptographic challenge combined with his cryptographic key as seed for the secure training sequence)

b. uses the cryptographic response as secure training sequence 2903
c. sends this frame 2904 as the beginning of a ranging frame (e.g. a frame from which timing information is determined for use in distance determination between tag and anchor)
d. starts the time measurement when the secure training sequence has been transmitted at 2905
3. The anchor
   a. has prior knowledge of the cryptographic key in the tag and computes the expected cryptographic response using the same cryptographic algorithm as the tag
   b. correlates the received secure training sequence 2906 against the expected response
   c. demodulates the received secure training sequence 2906 to authenticate the sender
   d. starts the time measurement when the expected secure training sequence is detected at 2907. By basing the time measurement on the detection of an expected secure training sequence, comprising a non-repeating sequence, that is known or derivable only by the anchor and the tag, a secure marker for time measurement may be provided. The secure marker may be placed at the start of the expected secure training sequence or at the end or other defined point relative to the detected, expected, secure training sequence.
   e. a continuation of the secure training sequence is used to generate the next secure training sequence 2908 for the next ranging frame 2909
   f. sends this frame as the next ranging frame
   g. records the time when the when the secure training sequence has been transmitted at 2910
4. The tag
   a. correlates the received secure training sequence 2911 against the expected response
   b. demodulates the received secure training sequence 2911 to authenticate the sender
   c. records the time when the secure training sequence is detected. The detection of the expected secure training sequence may there define a secure marker 2912 for timing purposes.
   d. a continuation of the secure training sequence is used to generate the next secure training sequence 2913
   e. sends this frame as the next ranging frame 2914
   f. records the time when the secure training sequence has been transmitted at 2915
5. The anchor
   a. correlates the received secure training sequence 2916 against the expected response
   b. demodulates the received secure training sequence 2916 to authenticate the sender
   c. records the time when the expected secure training sequence is detected at marker 2917. As the marker 2917 is based on the receipt of the expect secure training sequence, it may be considered a secure marker.
6. The tag
   a. encrypts the time measurements and sends them as payload in a separate frame 2917
7. The anchor
   a. decrypts the received time measurements 2918 and calculates the distance to the tag based on the anchor's own time measurements and those received from the tag The distance, d, between the tag and the anchor, may be determined from the following equation:

$$d = ToF \cdot c \approx \frac{T_T[1] \cdot T_A[2] - T_A[1] \cdot T_T[2]}{T_T[1] + T_A[2] + T_A[1] + T_T[2]} \cdot c.$$

where c comprises the speed of light, $T_A[1]$ and $T_A[2]$ comprise the time between marker 2907 to marker 2910 and marker 2910 to marker 2917 respectively, $T_T[1]$ and $T_T[2]$ comprise the time between marker 2905 to marker 2912 and marker 2912 to marker 2915 respectively.

Novel Protocol to Measure the Shortest Distance Between a Group of Anchors and a Group of Tags with Minimal Overhead In the automotive PKE context several anchors may be mounted on different locations in and around a lockable element, such as automobile. Possible locations are the roof, the bumper, the mirrors and the driver cabin. A significant number of key fobs (also known as a tag or key device) may also be registered with one car. The challenge is to identify which fobs, if any, are in the proximity of the car, and to establish a tight upper bound for the distance of each fob (key device) to the car (the lock devices of the lockable element).

Figure 30A:
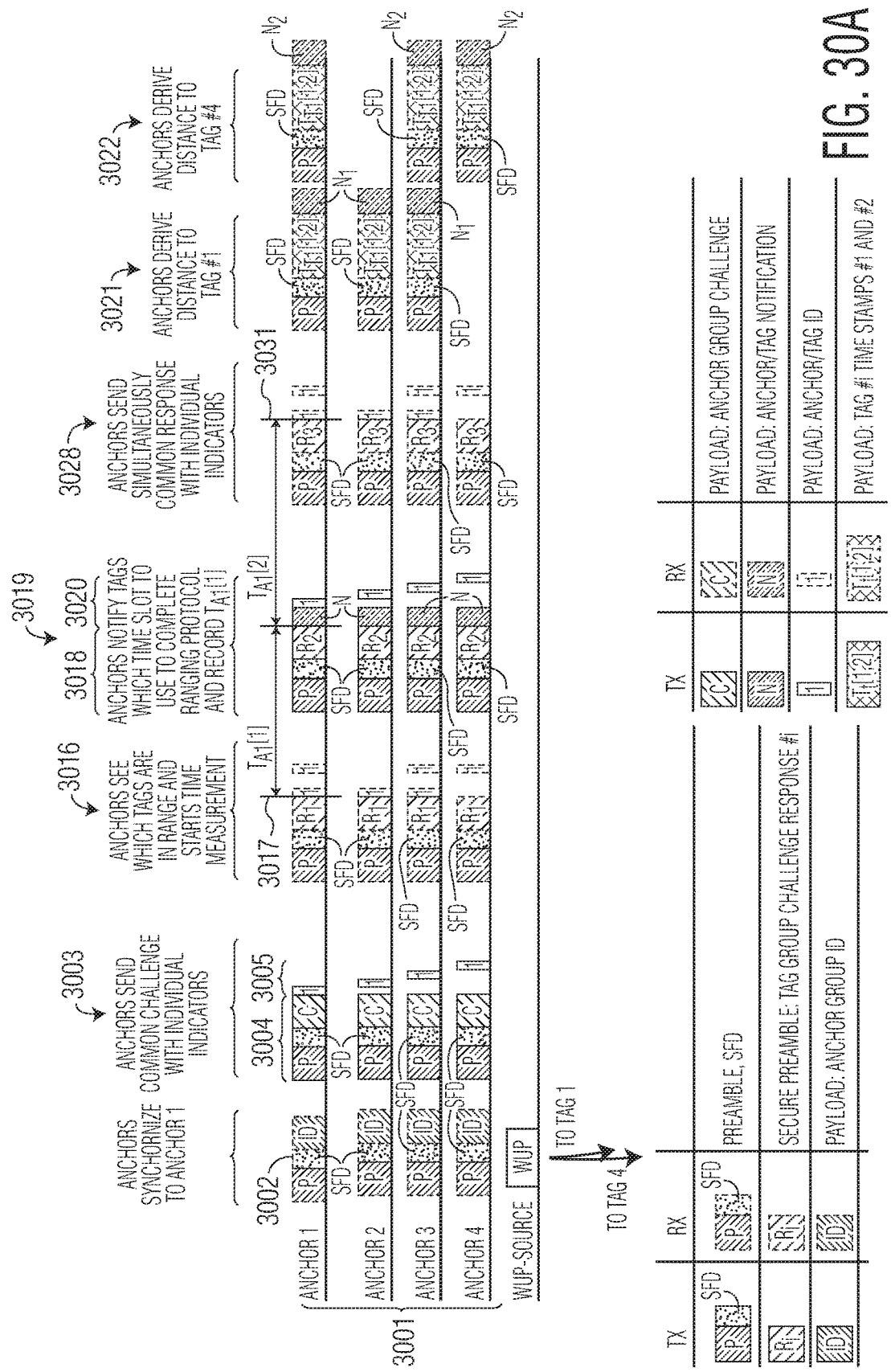

FIGS. 30A and 30B show an exemplary protocol exchange, for a so called double sided ranging sequence with multiple anchors and multiple fobs. The terms anchor and lock device are used interchangeably. The terms tag, fob and key device are used interchangeably. The underlying ranging sequence is the same as described in the previous section. There are however none, one or more of the following enhancements:

1. There is at least one anchor that is visible to all other anchors. It starts the protocol, by synchronising all other anchors.
2. The synchronised anchors transmit the same challenge simultaneously.
   a. For the fob this looks like the transmission from one antenna, spread over a long, diverse multipath.
3. Position modulation is used by the anchors and the fobs to identify themselves.
   a. Each anchor and fob has a specific period where only it is allowed to transmit.
   b. All other anchors and fobs are quiet during this time.
4. The anchors notify each fob when it is allowed to transmit the final message with the timing information.
5. Each anchor derives its distance to each fob.
6. A controller or "BCM" in the car retrieves all distance measurements and uses the shortest distance as criteria for opening the car. A BCM comprises a Body Control Module comprising an electronic control unit responsible for monitoring and controlling various electronic accessories in a vehicle's body.

The advantages of this approach may comprise one or more of:

1. Receive time is minimised, because all anchors and fobs transmit at the same time.
2. Each fob knows which anchors can receive its messages.
3. Each anchor knows which fobs can receive its messages. With the following procedure it can work out which one is the closest.
   a. It estimates the distance based on the timing measurements received from each fob.

b. The fob whose timing measurement results in the shortest distance is the closest one.

However, the estimated distance may not necessarily be correct, because the fob may start its timing based on the earliest message it receives. The earliest message may however have been transmitted from another anchor which is even closer.

A central or distributed controller, or one of the anchors in communication with each of the anchors may work out which fob and which anchor are the closest to each other and what their actual distance is using the following procedure:

a. The controller reads back from each anchor who the closest fob was and which distance it estimated.
b. The anchor that reports the shortest distance is the closest one to any of the fobs. Its distance estimate to the closest fob is the actual distance.

With reference to FIG. 30, anchor 1 comprises the lock device that is visible to the others. Accordingly, anchor 1 may be physically positioned relative to anchors 2, 3 and 4 such that signaling sent by anchor 1 is received by all the other anchors of the group of anchors 3001. Accordingly, the anchor 1 may send a synchronization message 3002 to the other anchors with timing information that allows for time synchronization of the group of anchors 3001. A wake-up signal (labelled WUP in FIG. 30), based on the sending of the synchronization message 3002, may be sent to the tags to prepare them for the forthcoming exchange of messages.

Based on said time synchronization between the anchor 1 and the other anchors of the group 3001, a challenge message 3003 is sent. The challenge message is to a key group comprising a plurality of key devices, labelled Tag 1 and Tag 4 in FIG. 30. It will be appreciated that there may be more key devices although only Tag 1 and Tag 4 happen to be nearby. The challenge message 3003 is transmitted in time synchronization by all of the lock devices labelled anchors 1 to 4. The challenge message comprises a first common part 3004 comprising the same data transmitted by all of the lock devices at the same time. The challenge message further includes an identifier part 3005, the identifier part including a unique identifier among the lock devices (anchors 1 to 4). The identifier part is provided for transmission by each anchor in a discrete predetermined time slot assigned to said anchor relative to the common part 3004. Thus, the other anchors may be silent while each anchor transmits its identifier part of the challenge message in it its dedicated time slot.

The key devices tag 1 and tag 4 receive the challenge message from only those lock devices/anchors that are in range. Accordingly, tag 1 is shown in receipt of the challenge message at 3006 with only the identifiers of anchor 1 and anchor 3. Accordingly, tag 4 is shown in receipt of the challenge message at 3007 with only the identifiers of anchor 2, anchor 3 and anchor 4.

Each key device on receipt of the challenge message at 3006 and 3007, is configured to provide for transmission of a key response message 3010, 3011 at a predefined moment after reception of the challenge message. The key response message 3010, 3011 comprising a common part 3012 comprising the same data transmitted by the other key devices at the same time. The common part 3012 may comprise a secure training sequence, as described above, to confirm the identity of the key devices/tags to the lock devices/anchors. The secure training sequence may comprise a non-repeating sequence of symbols based on one or more of an agreed symbol sequence and an agreed reference for generation of such a symbol sequence agreed between the key devices and receiver devices. The key response message 3010, 3011 comprises an identifier part 3013, the identifier part including a unique identifier 3014 among the key devices to identify the tags, the identifier part provided for transmission in a discrete predetermined time slot assigned to each of said key devices relative to the common part 3012 and different to corresponding time slots assigned to the other key devices of the key group.

Further, based on the transmission of the key response message 3010, 3011, the key devices may be configured to begin a timer based on a temporal position of a marker 3015 present in the response message. The marker 3015 may be considered a secure marker if its temporal position is based on the temporal position of the secure training sequence, as the secure training sequence comprises data that can be trusted and is verifiable by the lock devices and key devices.

It will be appreciated that not all key devices may have received the challenge message from all of the lock devices. Accordingly, based on the received key response message at 3016 from at least some of the key devices of the key group (e.g. tag 1 and tag 4), each anchor begins its own timer for timing future message exchanges between it and the key devices from which it received the key response message 3016. The beginning of the timer is based on a secure marker 3017 present in the received key response message 3016 from that particular key device. The timer may start on the basis of the marker in the shortest multipath component or individual timers may be provided for each key device. The individual timers may be started based on the shortest multipath component of that particular key device based on the identifier. The marker is a secure marker by virtue of the marker being temporally related to the secure training sequence, which may be checked as valid by the lock device based on generation of a corresponding secure training sequence by the lock device.

At this point each lock device knows with which key devices it can communicate by virtue of the identifiers sent as part of the response message, received at 3016.

It may be possible for an attacker, say Tag X, to insert a key response message consisting part of a preamble, labelled "P" in the figure, the SFD, and an identifier tag ID (e.g. for tags that happen not to be present, such as. tag2 or tag3). However, tag X cannot produce the secure training sequence (labelled $R_1$). Thus, in one or more examples, each lock device may be configured to determine channel estimate information for each lock device from which it receives a message based on a valid secure training sequence being detected and using cross-correlation with at least part of secure training sequence of the received key response message and a corresponding secure training sequence generated by the lock device. The channel estimate information may comprise a secure channel estimate information profile for each genuine tag. The secure channel estimate information profile may include characteristic reflections or multi-path components of the channel that may be used for validation of messages from genuine key devices. The lock device may be configured to determine channel estimate information for each subsequent message it receives and based on a comparison with the one or more secure channel estimate information profiles, accept messages from genuine key devices and reject messages from non-genuine key devices.

The lock devices then provide for transmission of a lock response message 3019 to the key group in time synchronization with the other lock devices. The lock response message 3019 comprising a second common part 3018 comprising the same data transmitted by all of the lock devices at the same time and the identifier part 3020 provided for transmission in the discrete predetermined time slot assigned to said first lock device relative to the common part. The second common part 3018 may comprise a continuation of the secure training sequence, generated by the lock device. The lock response message 3019 may provide information defining a designated reporting time slot 3021, 3022 different for the each of the key devices of the key group to provide timing information measured by the key device, the designated reporting time slot subsequent to the sending of the at least one further key response message 3023.

The lock response message 3019 is received by the key devices at 3024. The key devices may record a time elapsed from starting the timer to a marker 3025 present in the received lock response message 3024. The marker 3025 may be a secure marker by virtue of the marker being temporally related to the time of receipt of the secure training sequence in the received lock response message at 3024, which may be checked as valid by the key device based on generation of a corresponding secure training sequence by the key device.

The key devices then provide for the transmission of the further key response message 3023 to the lock group. The further key response message 3023 may be provided for transmission a predefined time after the lock response message 3023 by the key devices of the key group that received the lock response message 3024. The further key response message 3023 comprising a response to said lock response message 3019 and comprising a common part 3026 comprising the same data transmitted by the other key devices at the same time. The common part may include a further continuation of the secure training sequence for authentication of the further key response message 3023 to the lock devices. The further key response message 3023 further includes an identifier part 3027, the identifier part including a unique identifier among the key devices, the identifier part provided for transmission in a discrete predetermined time slot assigned to each of said key devices relative to the common part 3026 and different to corresponding time slots assigned to the other key devices of the key group.

The key devices may each stop their respective timers on sending of the further key response message 3023 based on a marker 3030 in the further response message. The marker 3030 may be a secure marker by virtue of the marker being temporally related to the time of transmitting of the secure training sequence in the common part 3026 of the further key response message 3023. Accordingly, each key devices has recorded a first time $T_{tag\_identifier}[1]$ between transmitting the key response message and receiving the lock response message 3024 and a second time $T_{tag\_identifier}[2]$ between receipt of the lock response message 3024 and the sending of the further key response message 3023. The timings are made relative to the secure markers in the respective messages. In this embodiment the secure marker comprises the point of the message (which comprises a frame) immediately after the start of frame delimiter field, labelled SFD in FIG. 30, although in other embodiments a different temporal secure marker may be used.

The further key response message 3023 is received at the lock devices at 3028. Based on the received further key response message from at least a subset of the key devices of the key group, each lock device may stop its timer that is associated with each key device. The stopping of the timer, in this example, is based on a marker 3031 present in the further key response message from the associated particular key device. The marker 3031 may be a secure marker by virtue of the marker being temporally related to the time of receipt of the secure training sequence in the received further key response message 3028, which may be checked as valid by the lock device based on generation of a corresponding secure training sequence by the lock device.

It will be appreciated that the recording of reception times based on the markers 3025, 3031 is based on the cross-correlation of the secure training sequence in the received message 3024, 3028 and a secure training sequence determined by the key/lock device and the reception of the key/lock device's identifier. The time of arrival for a specific lock/key device may be based on the earliest multipath component that is present both in the secure training sequence part of the message and the identifier part of the message. The earliest multipath component may be determined from channel estimate information as will be understood from those skilled in the art. From this time of arrival, the corresponding marker 3025, 3031 for a key/lock device can be determined.

Accordingly, each lock devices, for each key device with which it has exchanged messages, has recorded a first time $T_{anchor\_identifier}[1]$ between receipt of the key response message 3016 and sending the lock response message 3019 and a second time $T_{anchor\_identifier}[2]$ between transmitting of the lock response message 3019 and the receipt of the further key response message 3028. The timings are made relative to a secure marker in the respective messages. In this embodiment the secure marker comprises the point of the frame immediately after the start of frame delimiter field, although in other embodiments a different temporal secure marker may be used.

Each key device (tag1, tag4) may then send its timings to the lock group in the designated reporting time slot 3021, 3022.

The distance between the lock devices and each of the key devices which could receive its messages is based on the round trip time of the messages minus the processing time at the lock device (provided by its timings) and the processing time at the respective key device (provided by its timings). Such a distance calculation will be familiar to those skilled in the art.

For double-sided ranging, the intention is to find the distance via the Time of Flight:

$$d = \frac{RTToF \cdot c}{2} = ToF \cdot c.$$

Where RTToF is the return time of flight and ToF is the time of flight between the transmitter device and receiver device.

It will be appreciated that double-sided ranging offers the feature of reduction of the impact of reference clock imperfections, when compared to single-sided ranging. Double-sided ranging is disclosed in the publication "A new Double Two-Way Ranging algorithm for ranging system", IEEE CNIDC 2010, by Myungkyun Kwak and Jongwha Chong.

For FIG. 30, similar equations as recited above for FIG. 29 hold, where $T_T\{1,2\}$ and $T_A\{1,2\}$ (time differences between subsequent messages as measured by the tag and anchor, respectively) are to be replaced according to the numbers of the anchor and tag between which the distance is being evaluated.

The example method described allows two methods of distance bounding:

1) Finding the shortest distance between any one of the anchors and any one of the tags 2) A distance measurement for every anchor-tag pair that are in communication range.

For method 1), each key or lock device may start its timer based of the position of a secure marker related to the earliest multipath component seen in the key response message/lock response message. It will be appreciated that the earliest multipath component may be determined based on channel estimate information.

For method 2), each key or lock device must find the earliest multipath component that corresponds to each lock or key device respectively. This may be done as follows: the received response message, labelled R1 or R2, may be used for carrying out a channel estimation and will result in an estimated set of multipath components (delay, amplitude and phase). This set of multipath components may be used to configure the receiver (e.g. with a RAKE receiver or a channel matched filter) for reception of the identifiers for each device that sent a message. The set of multipath components consists of both channel reflections and direct paths between the receiving key/lock device and all transmitting key/lock devices that are in range. The configuration of the receiving device in this way blocks any attacker that wants to insert its message with a multipath component set that is non-overlapping with the (secret) superset of multipath components. In a most advantageous (for the attacker) attack, the attacker may have a multipath component set that has some overlap with the earliest multipath components in the superset and can therefore not fake a shorter distance than the distance of a genuine key/lock device. The shortest distance between a responding device and the receiving device may be determined by looking to the earliest multipath component out of the superset that is active during the reception of the ID indicator.

Subnet Separation

A group of first and second devices may form together a subnet. The subnet may use a specific Pulse Repetition Frequency (PRF). In order to be separated from other subnets, each subnet can use a slightly different Pulse Repetition Frequency such that during acquisition in which correlation and averaging is needed to lift the wanted signal above the noise threshold only signals belonging to the desired subnet will be recognized or acknowledged. A difference in PRF between transmitter devices and receiver devices results in less effective accumulation of energy and therefore serves as a rejection mechanism during acquisition of transmissions belonging to a different subnet.

In order to separate subnets without need for additional provisions in the header field, the nominal chip rate of 499.2 MHz can be changed. In this way, transceivers with different chip rate settings will be less likely to synchronize to each other and thereby avoid message collisions on level of the PHY layer [12].

In order to support this feature up to the desired level of subnet decoupling, we define a grid of nominal chip rates being $r_{chip}*499.2$ MHz, where $r_{chip}=1+200e-6*(100-N_{subnet})$, and where $N_{subnet} \in \{0, 1, \ldots, 200\}$. Overall, therefore, 201 different subnets are defined.

The invention claimed is:

1. A processing module for a transmitter device configured to provide for generation of a signal comprising at least one frame for transmission by the transmitter device to a receiver device, the processing module configured to provide for processing of an input pulse stream, the input pulse stream comprising a stream of pulses representative of data of at least part of the at least one frame, to provide for generation of an output pulse stream for transmitting to the receiver device as part of the signal, each pulse of the pulse streams having one of two states comprising a positive polarity and a negative polarity, the polarity of the pulse defining the phase with which a carrier wave is modulated during the pulse for transmission by the transmitter device; the processing module configured to;
   divide the input pulse stream into consecutive groups of pulses, each group of pulses containing the same number of pulses, where the number of pulses comprises at least three; and
   for each group of pulses, based on determination that the first two or more consecutive pulses of the group have the same polarity, provide for addition of at least one dummy pulse to the group directly after the first two or more consecutive pulses, the at least one dummy pulse having an opposite polarity to the first two or more consecutive pulses, the output pulse stream comprising the groups of pulses including the added dummy pulses.

2. The processing module according to claim 1, wherein the processing module is configured to;
   for said each group of pulses, based on the determination that the first two or more consecutive pulses of the group have different polarities, provide for addition of said at least one dummy pulse to the group directly after the first two or more consecutive pulses, the at least one dummy pulse having a polarity opposite to a final pulse in the first two or more consecutive pulses.

3. The processing module according to claim 1, wherein the processing module is configured to;
   for said each group of pulses, based on the determination that the first two or more consecutive pulses of the group have different polarities, provide for addition of at least one dummy pulse to the group directly after the first two or more consecutive pulses, the at least one dummy pulse having a polarity opposite to an aggregate polarity of all the pulses in the group of pulses, wherein the number of pulses in the group is odd.

4. The processing module according to claim 1, wherein the number of pulses in a group comprises three and the determination that the first two or more consecutive pulses of the group have the same polarity comprises the determination that the first two consecutive pulses of the group have the same polarity and likewise the determination that the first two or more consecutive pulses of the group have different polarities comprises the determination that the first two consecutive pulses of the group have different polarities.

5. The processing module according to claim 1, wherein the processing module is configured to provide for addition of a single dummy pulse per group of pulses of the input pulse stream.

6. The processing module according to claim 1, wherein the input bit stream comprises a first input bit stream and a second input bit stream, the first input bit stream representing in-phase components for Quadrature Phase Shift Keying modulation and the second input bit stream representing quadrature-phase components for Quadrature Phase Shift Keying modulation.

7. The processing module according to claim 1, wherein the at least one frame comprises an ultra-wide band frame.

8. A system comprising at least one transmitter device controlled by the processing module according to claim 1.

9. The system of claim 8, wherein the system comprises at least one of:
   an access control system for a building;
   a passive keyless entry and/or start system for an automobile;
   a contactless payment terminal; and
   an automatic teller machine.

10. A method of generation, from an input pulse stream, of an output pulse stream comprising a plurality of pulses for controlling the phase with which a carrier wave is modulated during each pulse for transmission by a transmitter device, the input pulse stream comprising a stream of pulses representative of data of at least part of at least one frame for transmitting as part of a signal by the transmitter device, each pulse of the pulse streams having one of two states comprising a positive polarity and a negative polarity, the polarity of the pulse defining the phase with which the carrier wave is modulated; the method comprising:

dividing the input pulse stream into consecutive groups of pulses, each group of pulses containing the same number of pulses, where the number of pulses comprises at least three; and for each group of pulses, based on determination that the first two or more consecutive pulses of the group have the same polarity, providing for addition of at least one dummy pulse to the group directly after the first two or more consecutive pulses, the at least one dummy pulse having an opposite polarity to the first two or more consecutive pulses, the groups of pulses, including the added dummy pulses, comprising the output pulse stream.

11. A computer program product comprising computer program code which, when executed by a processor, performs the method of claim 10.

12. The processing module for a receiver device configured to provide for processing of a signal comprising at least one frame received by the receiver device from a transmitter device, the processing module configured to provide for processing of an input pulse stream, the input pulse stream comprising a stream of pulses representative of at least a phase modulated part of the at least one frame having been demodulated, to provide for generation of an output pulse stream for subsequent processing by the receiver device, each pulse of the pulse streams having one of two states comprising a positive polarity and a negative polarity, the processing module configured to;

divide the input pulse stream into consecutive groups of pulses, each group of pulses containing the same number of pulses, where the number of pulses comprises at least three and the position of the groups in the input bit stream determined based on predetermined data; and for each group of pulses, based on determination that the first two or more consecutive pulses of the group have the same polarity, provide for discarding of one or more dummy pulses in the group directly after the first two or more consecutive pulses, the at least one dummy pulse having an opposite polarity to the first two or more consecutive pulses, the groups of pulses without the discarded dummy pulse or pulses comprising the output pulse stream.

13. The processing module for a receiver device according to claim 12 wherein predetermined data is one or more of:

i) agreed in advance of the signal being received by the receiver device; and ii) determined from information in a header field of the at least one frame.

14. A method of processing at least part of a signal comprising at least one frame received by the receiver device from a transmitter device, the method providing for processing of an input pulse stream, the input pulse stream comprising a stream of pulses representative of at least a phase modulated part of the at least one frame having been demodulated, to provide for generation of an output pulse stream for subsequent processing by the receiver device, each pulse of the pulse streams having one of two states comprising a positive polarity and a negative polarity, the method comprising;

dividing the input pulse stream into consecutive groups of pulses, each group of pulses containing the same number of pulses, where the number of pulses comprises at least three and the position of the groups in the input bit stream determined based on predetermined data; and for each group of pulses, based on determination that the first two or more consecutive pulses of the group have the same polarity, providing for discarding of one or more dummy pulses in the group directly after the first two or more consecutive pulses, the at least one dummy pulse having an opposite polarity to the first two or more consecutive pulses, the groups of pulses without the discarded dummy pulse or pulses comprising the output pulse stream.

15. A computer program product comprising computer program code which, when executed by a processor, performs the method of claim 14.

* * * * *